United States Patent [19]

Bogacki

[11] 4,204,194

[45] May 20, 1980

[54] METER TERMINAL UNIT FOR USE IN AUTOMATIC REMOTE METER READING AND CONTROL SYSTEM

[75] Inventor: Anthony P. Bogacki, Chester, N.H.

[73] Assignee: General Electric Company, Somersworth, N.H.

[21] Appl. No.: 899,873

[22] Filed: Apr. 24, 1978

Related U.S. Application Data

[62] Division of Ser. No. 799,550, May 23, 1977, Pat. No. 4,161,720.

[51] Int. Cl.² .......................................... H04M 11/04
[52] U.S. Cl. ............................... 340/147 SY; 340/151; 340/310 A
[58] Field of Search ............. 340/147 SY, 183, 310 A, 340/310 CP, 151; 178/69.1; 179/15 BA

[56] References Cited

U.S. PATENT DOCUMENTS

| | | | |
|---|---|---|---|
| 3,786,423 | 1/1974 | Martell | 340/183 |
| 4,012,734 | 3/1977 | Jagoda et al. | 340/310 A |
| 4,114,141 | 9/1978 | Travis | 340/310 A |
| 4,119,948 | 10/1978 | Ward et al. | 340/310 A |
| 4,131,882 | 12/1978 | Hollabaugh et al. | 340/310 CP |

*Primary Examiner*—Donald J. Yusko
*Attorney, Agent, or Firm*—Robert E. Brunson

[57] ABSTRACT

A meter terminal unit for use in automatic meter reading systems of the type including a control center for transmitting commands to and receiving measurement data from the terminal unit via a distribution unit serving several terminal units. The terminal unit is selectively responsive to commands generated by the control center to carry out load control operations, encoder meter reading and store operations, or transfer previously stored meter data from the terminal unit to the control center in accordance with functions specified by the various commands.

4 Claims, 52 Drawing Figures

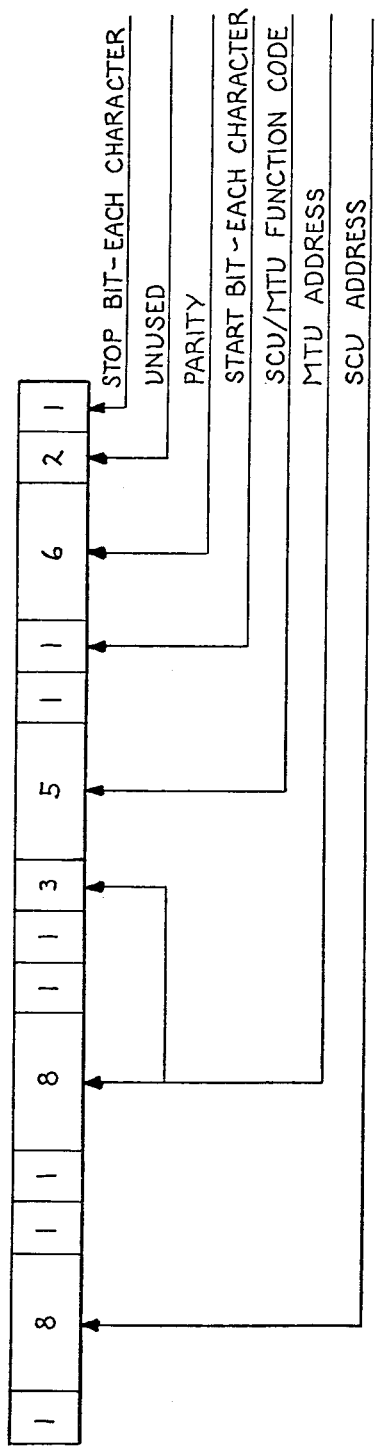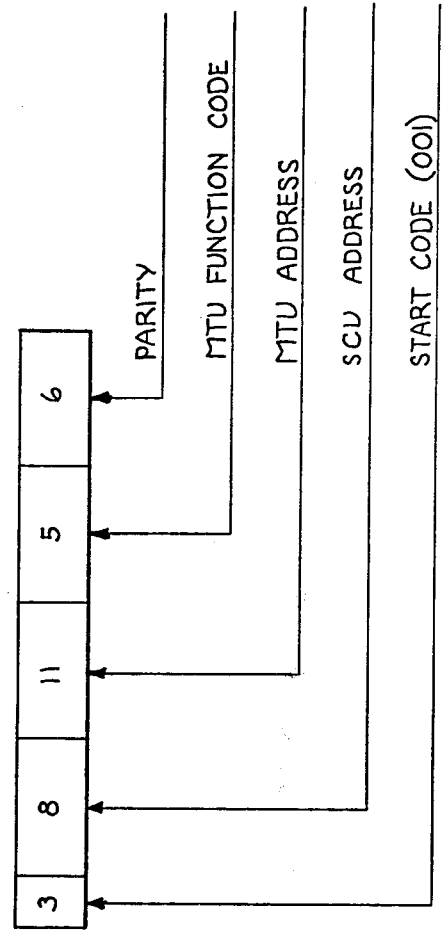

| FIG.9A |
|---|
| FIG.9B |

FIG. 9

| FIG.10A | FIG.10B |
|---|---|
| FIG.10C | FIG.10D |

FIG.10

| FIG.11A | FIG.11B |
|---|---|
| FIG.11C | FIG.11D |
| FIG.11E | FIG.11F |
| FIG.11G | FIG.11H |

FIG.11

| FIG.13A | FIG.13B |
|---|---|
| FIG.13C | FIG.13D |
| FIG.13E | FIG.13F |

FIG.13

| FIG.14A | FIG.14B |
|---|---|
| FIG.14C | FIG.14D |

FIG.14

| FIG.15A | FIG.15B |
|---|---|
| FIG.15C | FIG.15D |

FIG.15

| FIG.19A | FIG.19B |
|---|---|
| FIG.19C | FIG.19D |

FIG.19

| FIG.21A | FIG.21B |
|---|---|

FIG.21

| FIG.22A | FIG.22B |
|---|---|
| FIG.22C | FIG.22D |

FIG.22

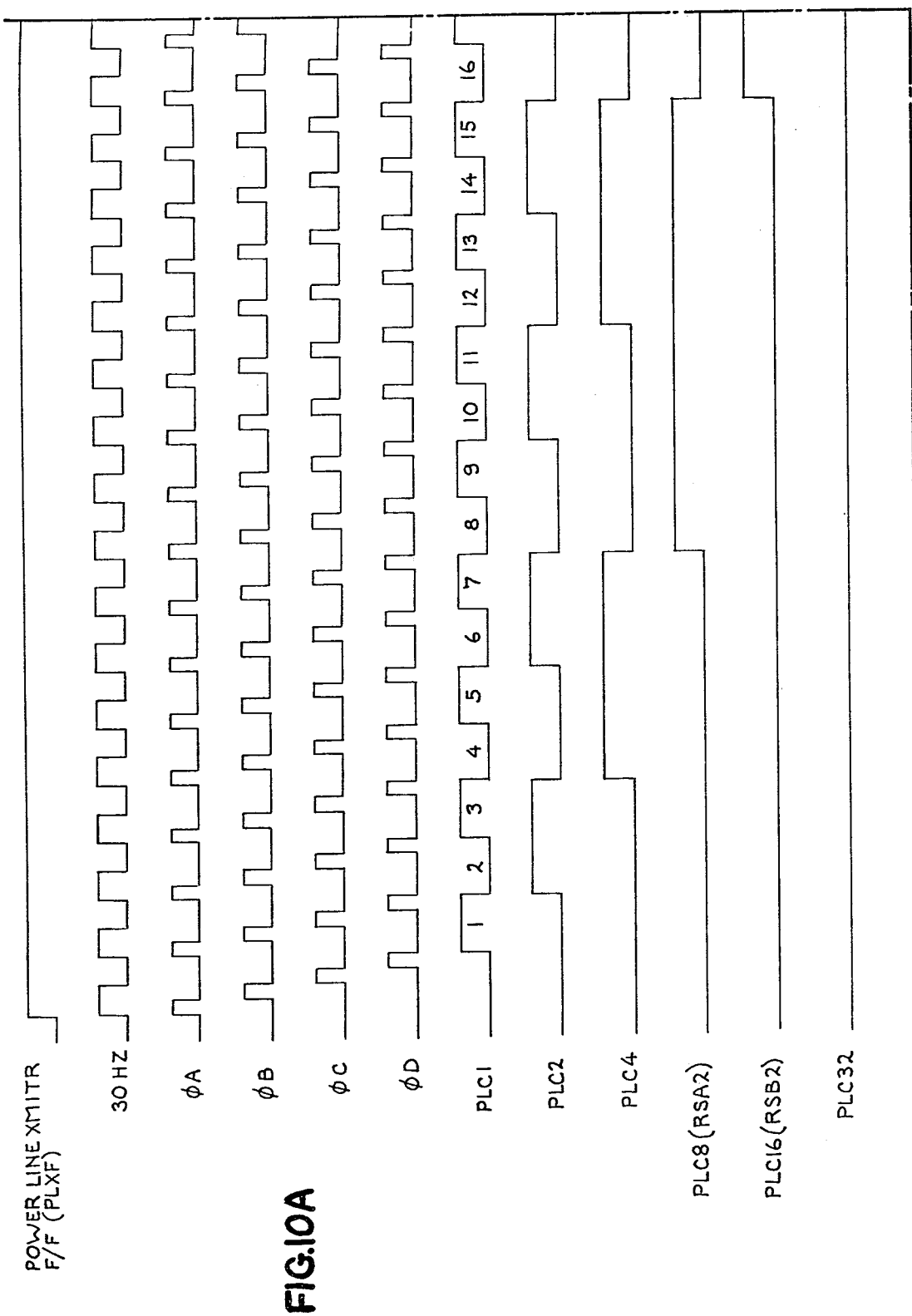

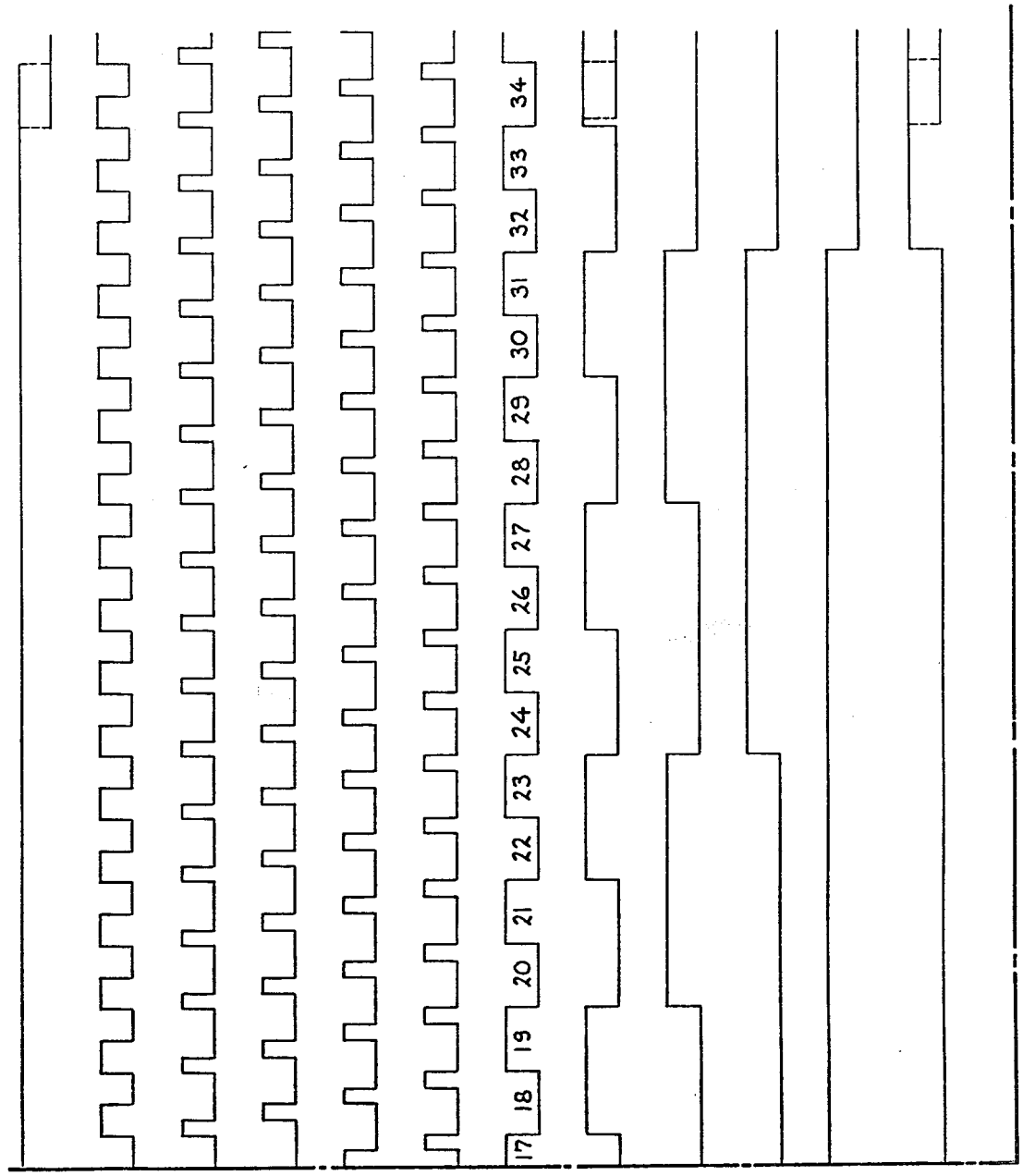

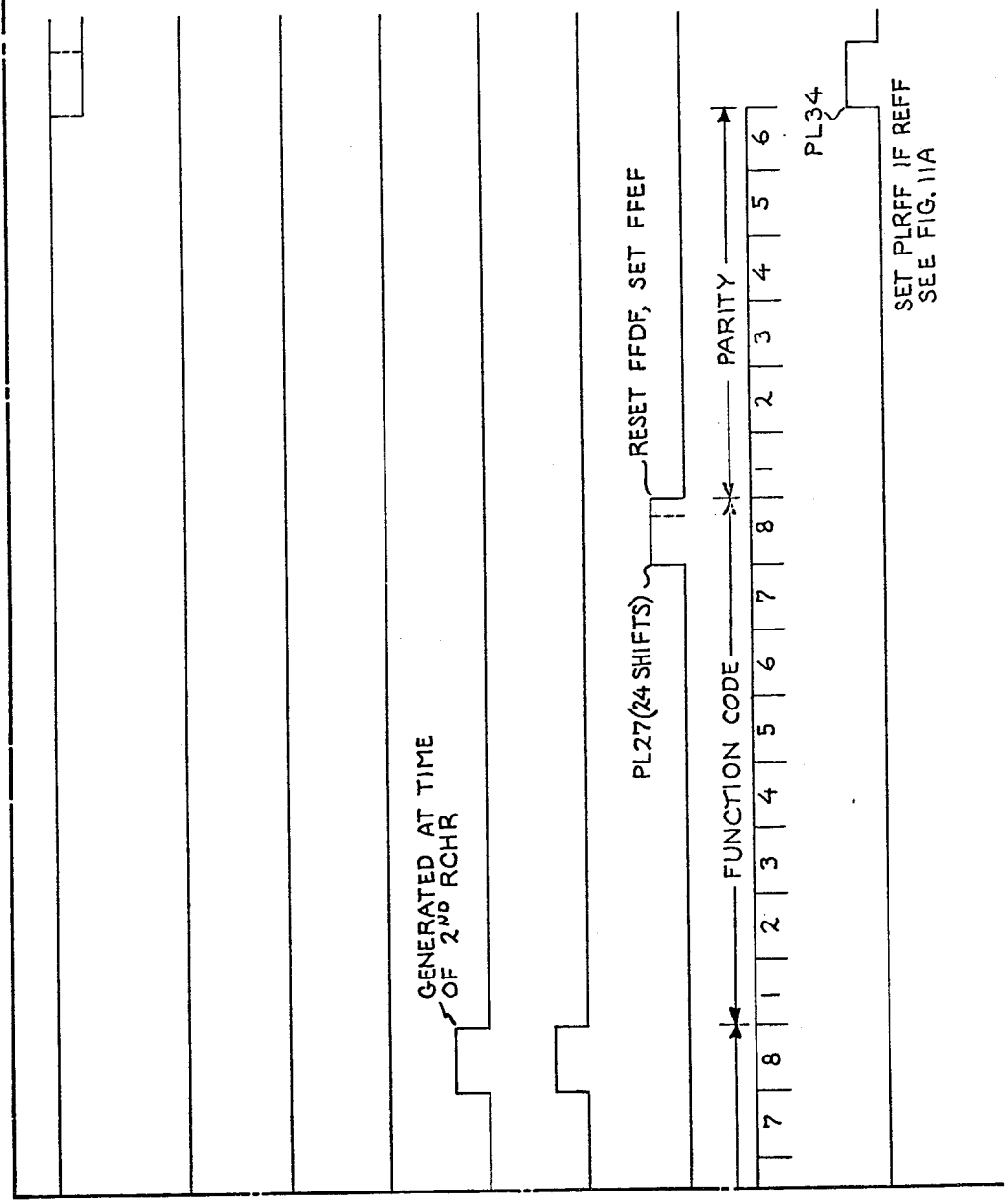

CLOCK TIMING

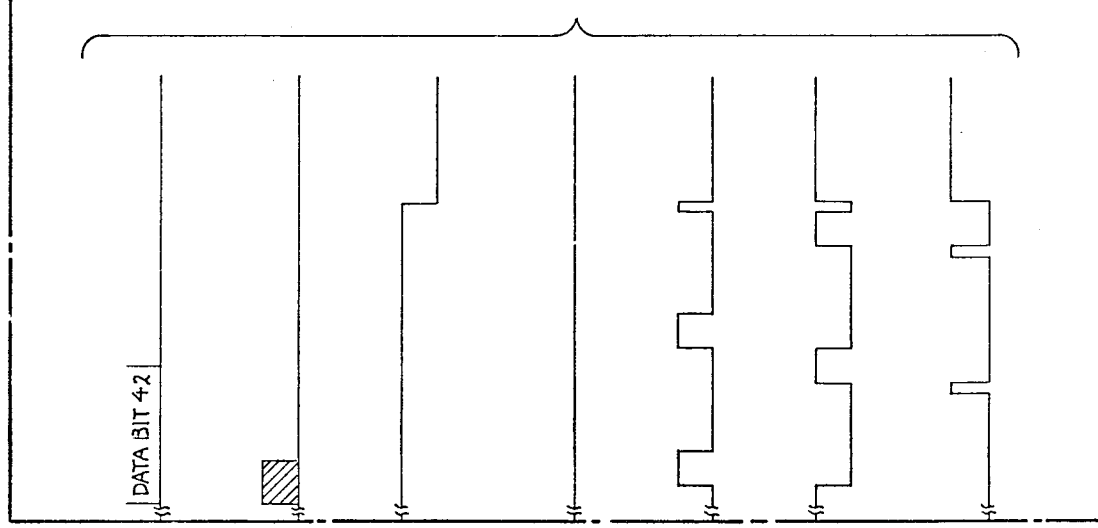

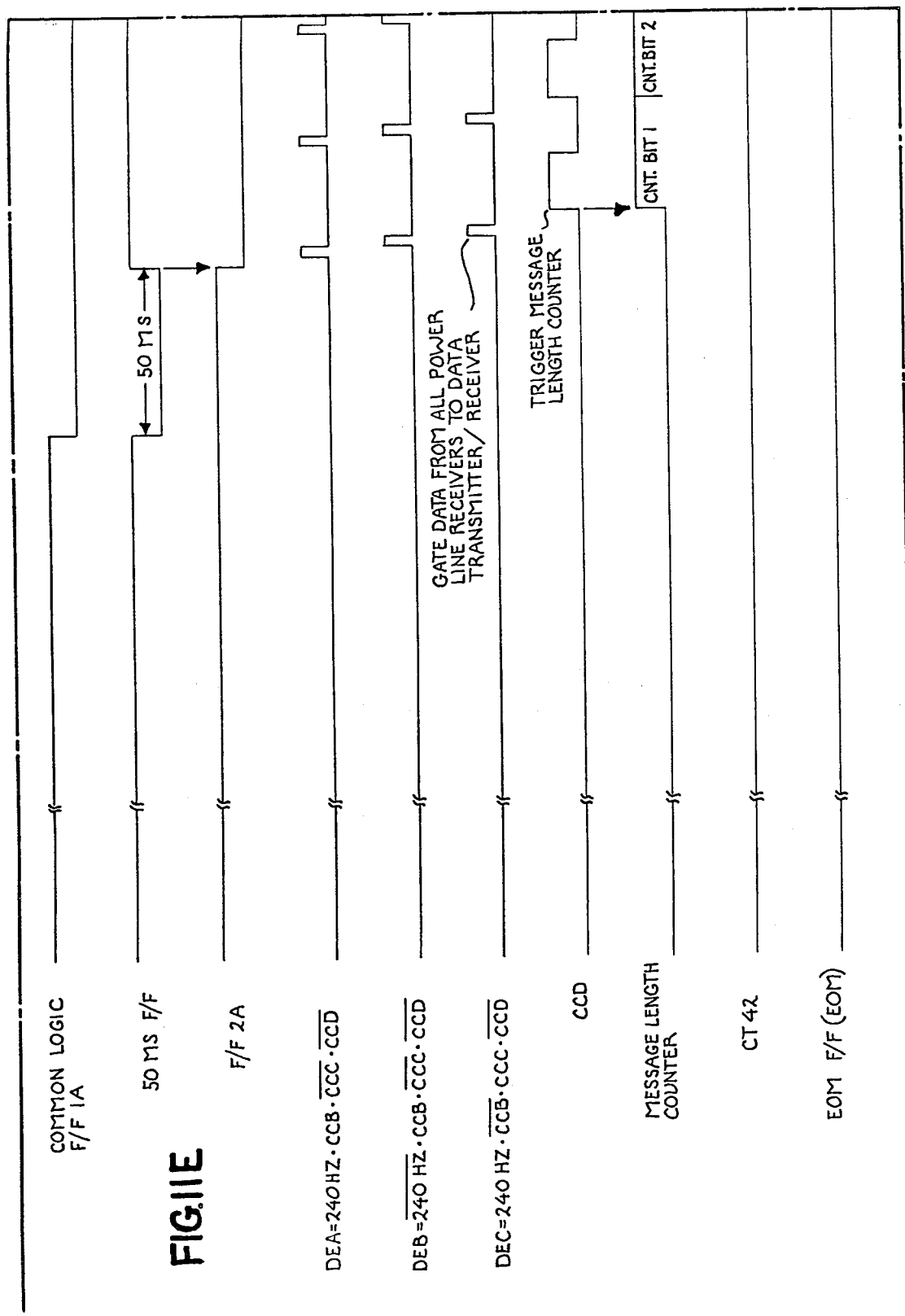

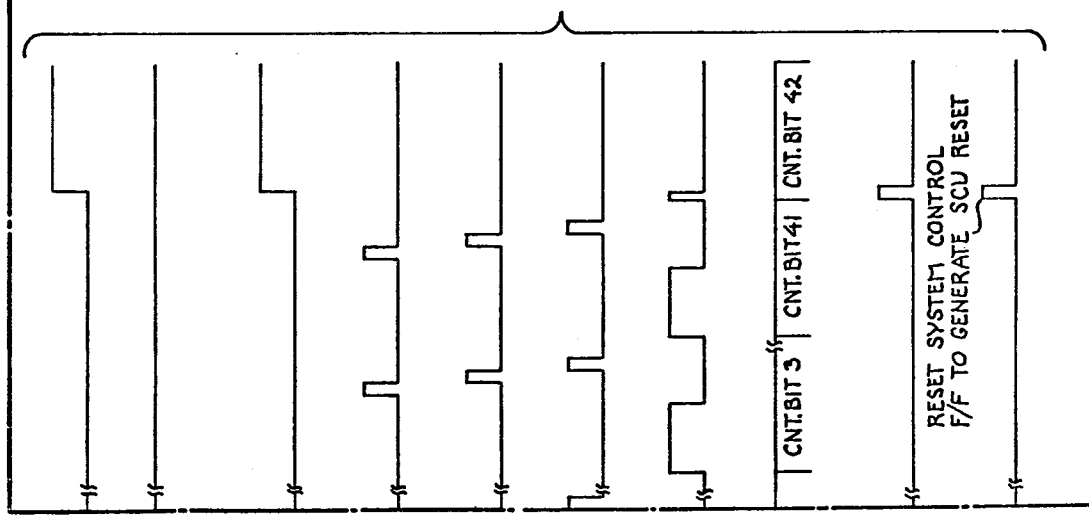

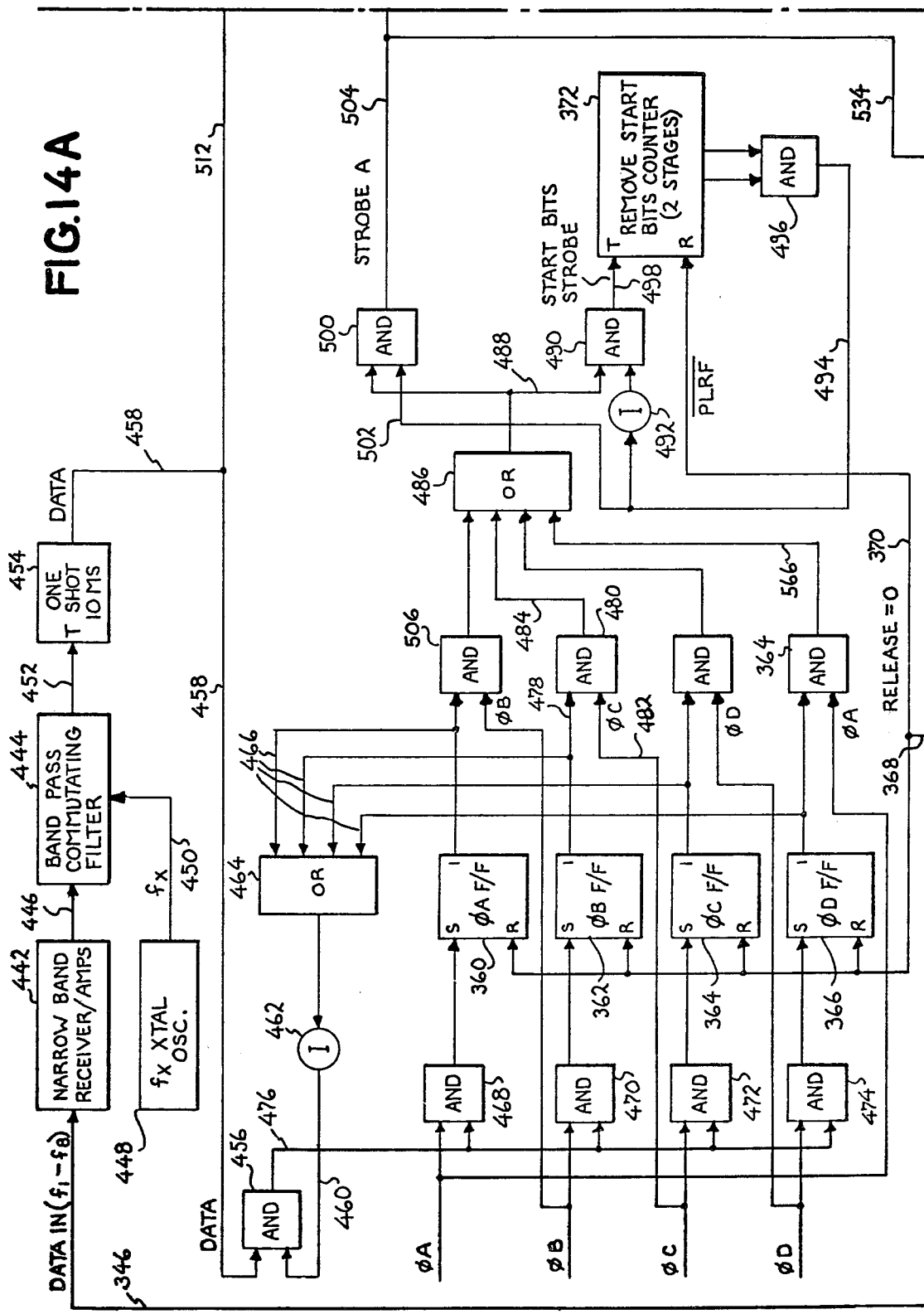

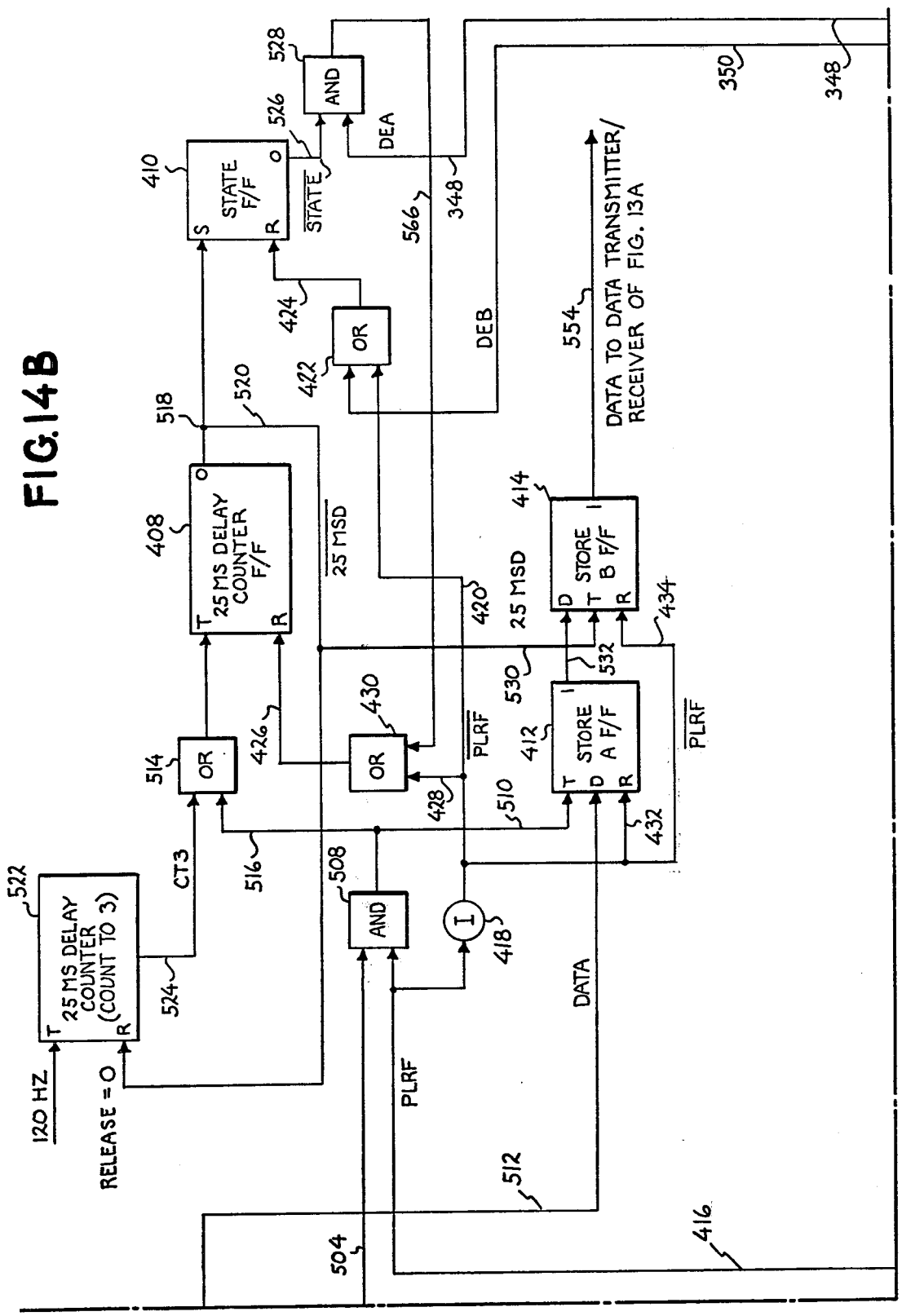

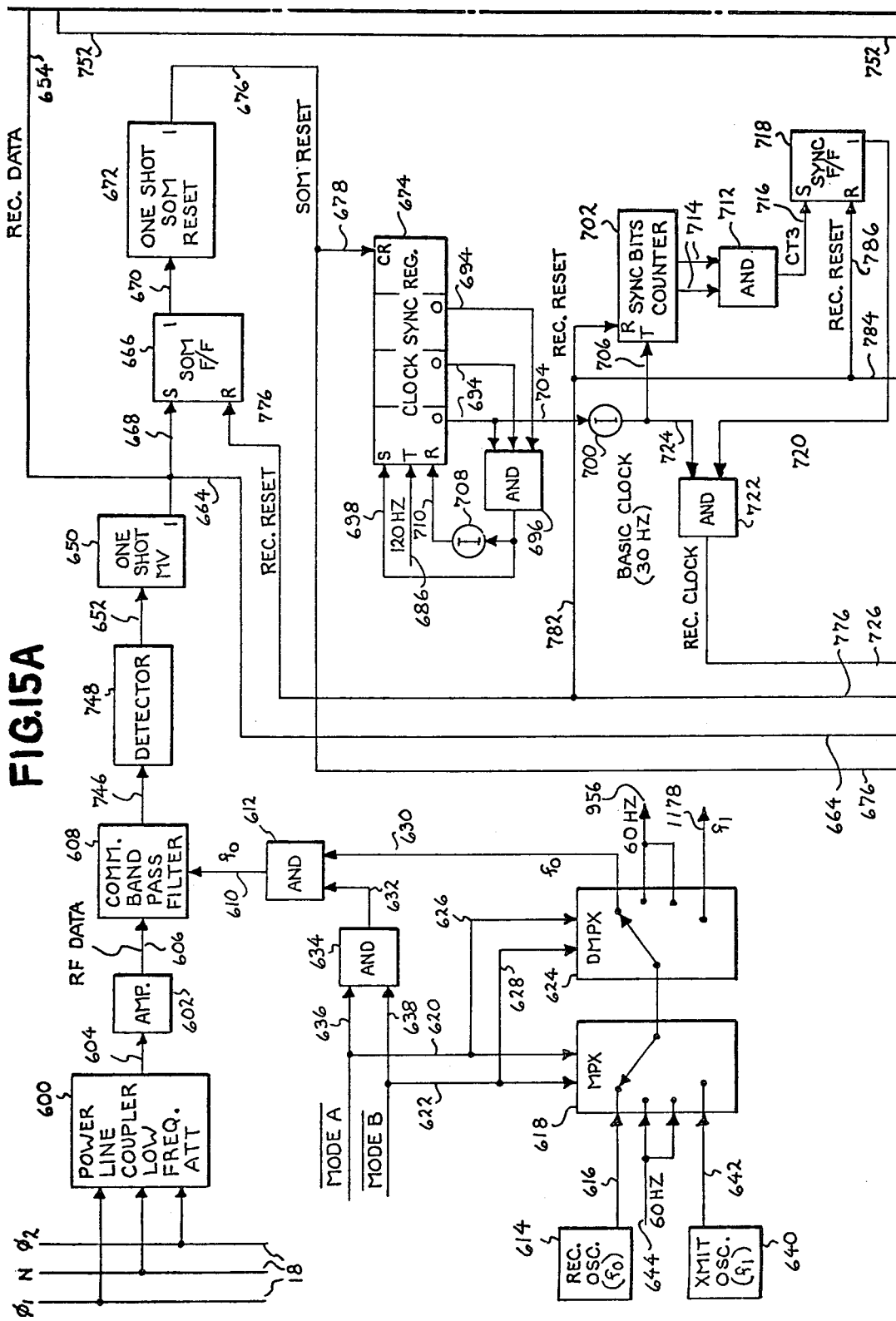

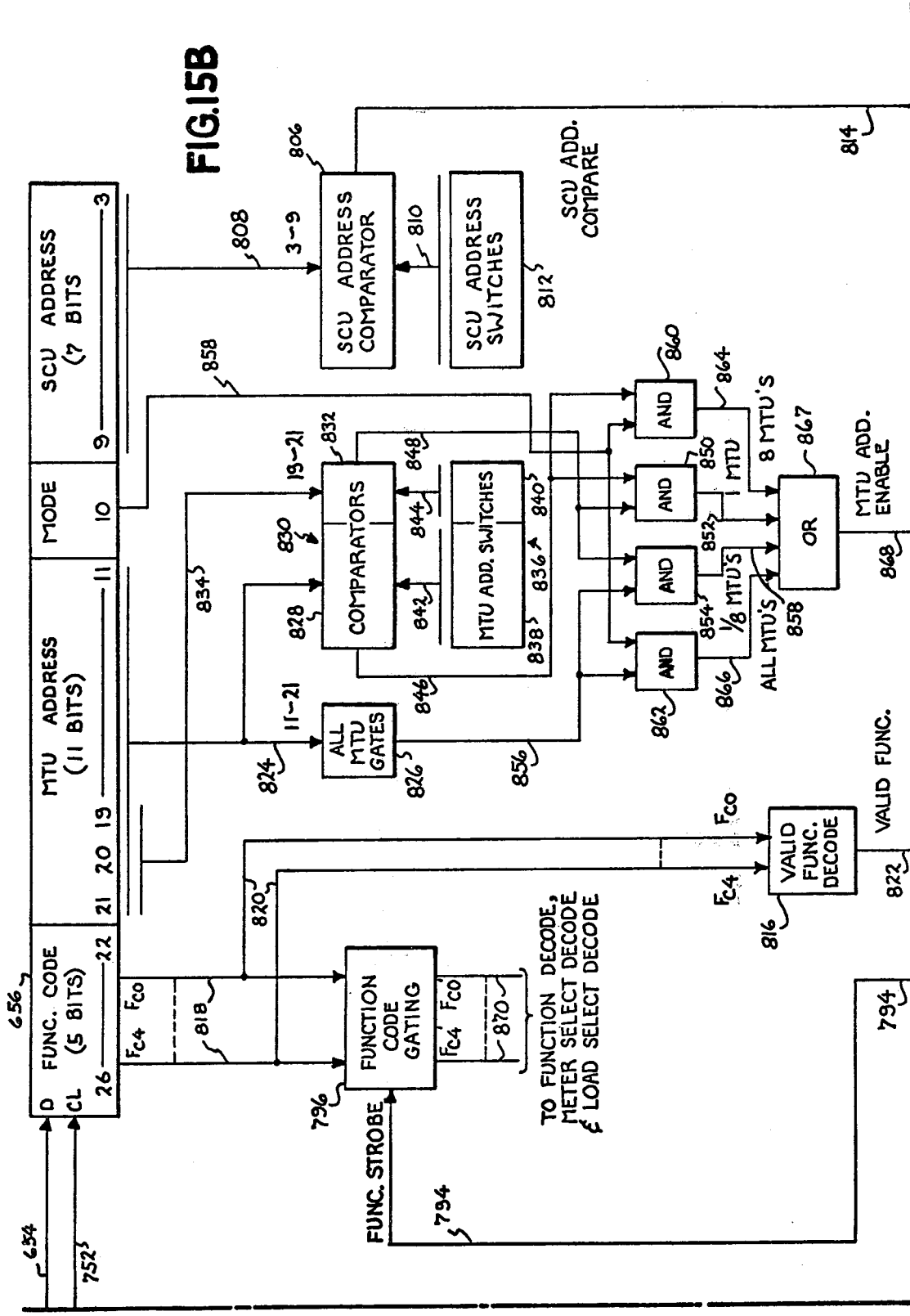

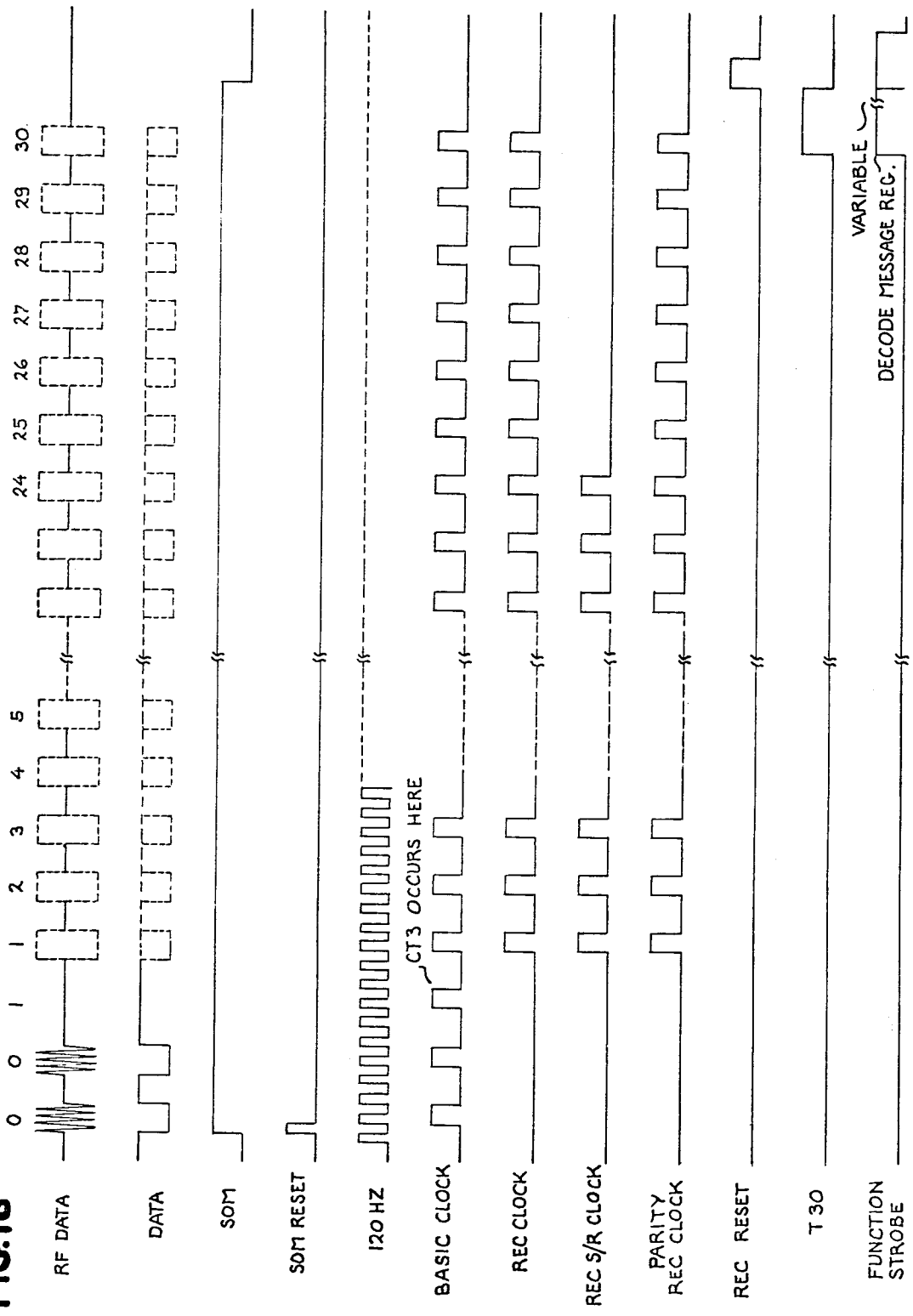

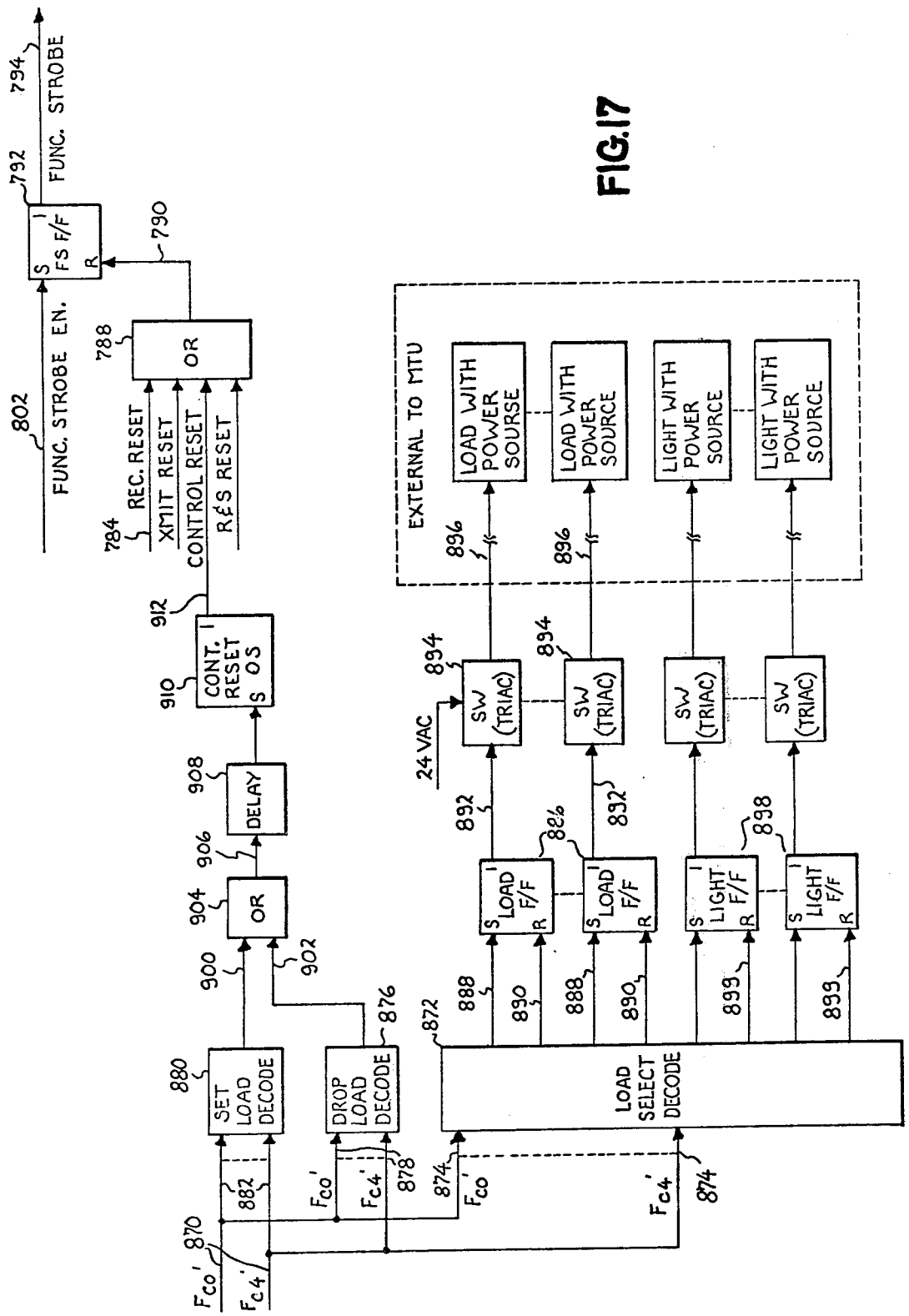

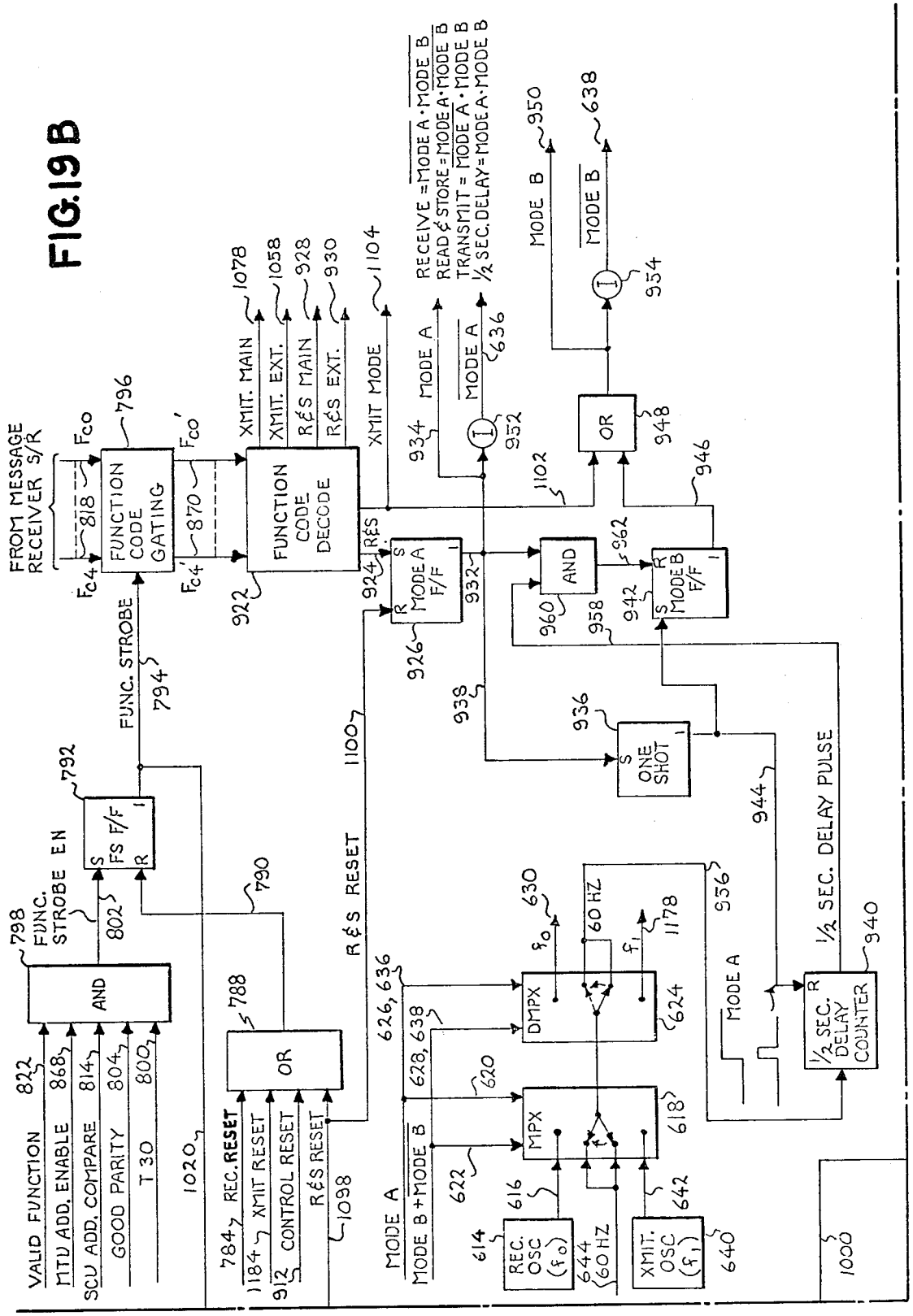

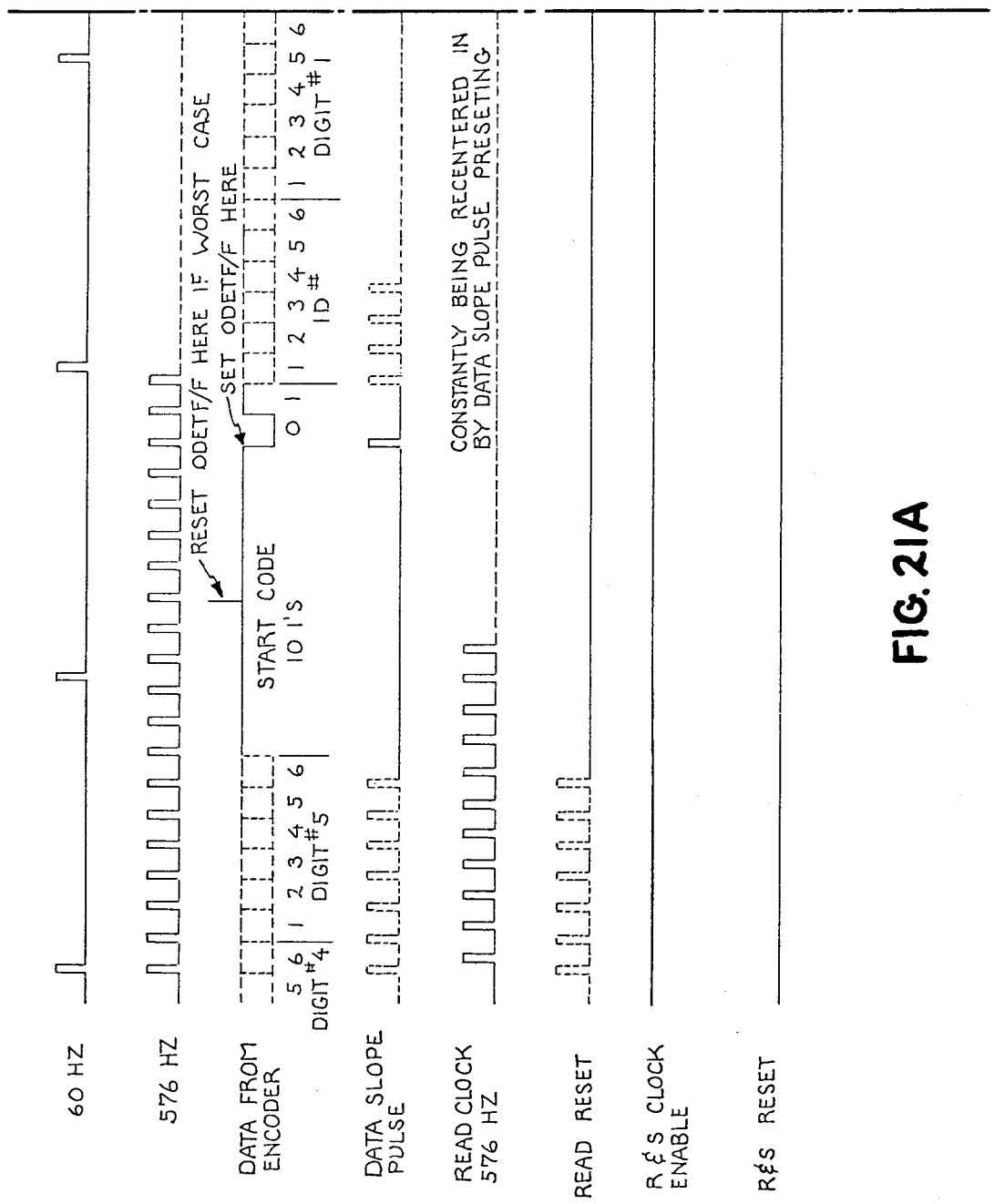

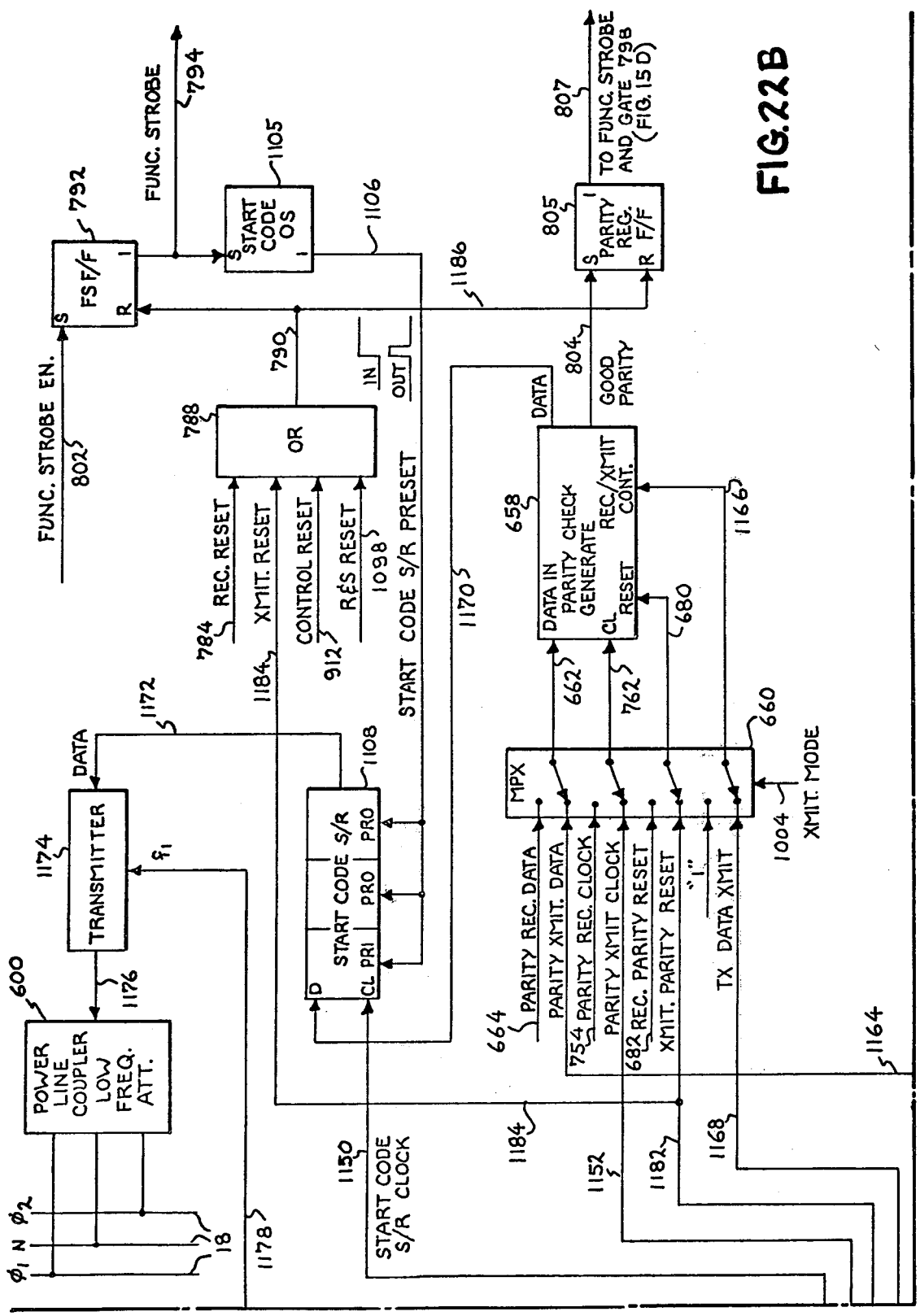

METER TERMINAL UNIT FOR USE IN AUTOMATIC REMOTE METER READING AND CONTROL SYSTEM

This is a division of application Ser. No. 799,550, filed May 23, 1977 and now U.S. Pat. No. 4,161,720.

BACKGROUND OF THE INVENTION

1. Field of the Invention

This invention relates generally to remote automatic meter reading and control systems and more particularly to a meter terminal unit or transponder for use in such systems to effect the carrying out of meter reading and load control operations at terminal points along a communication line such as a utility power transmission network.

2. Description of the Prior Art

Utility companies have long used meter reading personnel for reading the consumed commodity information provided by utility meters (i.e. gas, water, electricity, and the like). However, in recent years significant strides have been made in he development of fully automatic meter reading systems.

Most remote meter reading systems have similarities in their designs. Generally, they comprise some type of encoder device attached to a meter to give an indication of the meter reading, means for storing the meter reading indicated and a transponder for transmitting meter data over a communication link to a central station or control center when interrogated by a signal from the central station. One known system utilizes a mobile van which travels over a specified route in a community and, while traveling, transmits interrogate signals to meter equipment transponders at the houses located along the traveled route. The transponder at each house, in response to the interrogating signals, transmits a message to the van which includes a meter identification number and the present reading of the meter. Receiver equipment in the van effects the storage of the meter data for subsequent use in billing the customer.

Various other types of systems have been developed which utilize the telephone lines of the subscriber as the communication link to the central station. Also, there are arrangements in which the power lines of the subscriber and the utility company are used as the link between the customer's meter and the central station.

While many communication systems have been developed for utility companies, all of which utilize one or more of the various links and equipment aforementioned, no known economical feasible meter terminal unit or transponder has yet been designed for use in such systems which affords the capabilities of mass meter data accumulation and load control at a consumer residence and which meets the universal needs of utility companies.

An electric power network, involving as it does a vast number of meter locations, logically dictates that the most economical communication system will be that system which affords a minimum expenditure for the transponder equipment at each meter location, while allowing a greater expenditure for more sophisticated equipment for the processing of large amounts of meter data and the rapid distribution of command information to the transponder meter locations. This logical consideration has generally made the approach of providing radio receiver transmitter units at each meter location unfeasible. In effect this approach involves the use of as many communication systems as there are meter terminal locations. The desired approach, by contrast, would utilize an existing communication network which links all meter terminal locations together and would minimize the expense of the control equipment at each terminal location. Further, overall system control would be effected by a control station and section or group equipment which being required in smaller numbers can be of greater sophistication.

Additionally, the desired system would allow utility companies to read all meters in a city at desired intervals, such as during daily peak power periods. This has the advantage of allowing the utility companies to improve the system load factor by encouraging the customer to improve his residential load factor. This improvement of load factor can be accomplished in a number of ways by effecting a shifting of loads on the system from on-peak periods to off-peak periods. Three modes, but not necessarily all inclusive, of accomplishing this load-shift have been suggested as follows:

1. Alerting the customer by the automatic activation of an indicator at his residence via a meter terminal unit when he is using energy during peak periods so that he can reduce his load during those periods.

2. Metering and billing the customer at a premium rate for his on-peak usage as determined from stored meter data collected from the customer's meter terminal unit.

3. Controlling or limiting the customer's on-peak usage of energy by automatically turning off various loads in his residence (e.g. hot water heaters, clothes dryer, etc.) via a meter terminal unit during those periods.

Thus, it can be seen that a need exists for an improved water terminal unit for use in an automatic meter reading and control system which affords the preceding advantages and which has a built-in flexibility to accomodate future changes in utility company operating philosophy.

The system disclosed herewin, which makes use of the present invention, is also disclosed and claimed in U.S. patent application, Ser. No. 653,859 filed Jan. 30, 1976 now U.S. Pat. No. 4,135,181 entitled "Automatic Remote Meter Reading and Control System" and is assigned to the same assignee as the present invention.

SUMMARY OF THE INVENTION

The aforementioned advantages are provided by the present invention by the provision of a new and improved transponder or meter terminal unit for use in a remote automatic utility meter reading and control system which responds to commands from a control center to read and store meter data representative of a measured commodity reading and to transfer commodity readings to the control center via communication lines such as a network of power lines. Additionally, the meter terminal unit responds to commands from the control center to selectively energize or de-energize a plurality of loads connected to the terminal unit. Typically, these loads are indicator lights which are turned on at specific times by the power company to notify the customer that he is using power during on peak periods, or relays which can be activated and de-activated to control the power applied to various appliances such as refrigerators, air conditioners, hot water heaters, dryers and the like.

The commands received by the terminal unit of the present invention are of various types with each type having at least an address portion and a function code portion for identifying the terminal unit and directing its modes of operation respectively.

A meter terminal unit may have one, or a plurality of meters with each meter including an encoder capable of generating data signals representative of a commodity reading measured by the meter.

A command is received and stored by the terminal unit. The address and function code portions of the command are decoded to effect various modes of operation to be carried out by the meter terminal unit. The meter terminal unit will re-act to a command only when the meter terminal unit recognizes its address as specified by the contents of the address portion of a command. The function code portion of the command directs the meter terminal unit to carry out its specified operations.

In response to a read and store meter data operation, the function code directs the meter terminal unit to effect the reading of data signals representative of a commodity reading from any one of the various meters into selected ones of a plurality of storage means in the meter terminal unit. In one read and store meter reading operation, a particular meter can be selected to cause that meter's encoder to transfer meter data into any one of a plurality of storage means in the meter terminal unit for subsequent transfer to the control center via the communication lines.

In response to a different read and store meter data operation, any one of several meters can be individually selected, as specified by the function code, to store their meter data into a single storage means in the meter terminal unit for subsequent transfer to the control center.

Meter data previously stored in the various storage means in the meter terminal unit can be selectively transferred from those storage means in response to commands received and stored by the meter terminal unit. When the meter terminal unit recognizes its address and the function code contents specify that information is to be transmitted from the meter terminal unit to the control center, the function code will effect selection of one of the storage means in the meter terminal unit for the transfer of that storage means data to the control center.

From the preceding discussion, it can be seen that the meter terminal unit of the present invention provides the capability of reading and storing meter data from a plurality of meters, whereby the meter data can be stored for an indefinite period of time until it is desired to use that data. When it is desired to use the stored meter data, the control center merely commands the meter terminal unit to transmit its previously stored meter data from the selected storage means to the control center for subsequent use by the utility company, such as for billing the customer or meter survey purposes, etc.

Additionally, one or more consumer loads such as indicator lights or relays may be controlled by the meter terminal unit in response to a specified type of control command sent to the meter terminal unit from the control center. In this particular type of command, when the meter terminal unit recognizes its address, one or more of the several loads is either energized or de-energized in accordance with the contents of the function code portion of the command. The controlling of loads of this type at a consumer residence may be of benefit to the customer as well as to the utility company by allowing the utility company to turn on indicator lights to indicate to the customer that he is using power during a peak power period during which period his billing will be higher. If the customer sees an indicator light on at a specific time and realizes the meaning of that indicator, he can thus plan to use less power during that period to conserve on his electric bill.

Additionally, by being able to control various relays in a customer residence, the utility company can turn on and off air conditioning units during specific periods of the day as well as control other appliances such as hot water heaters and electric clothes dryers. In this manner, it is possible for the utility company to effectively control the various loads on their power system network to conserve energy.

In the system contemplated, in which the invention finds its use, section control units may also be utilized to channel information between the control center and the various meter terminal units which are connected to the section control units. In this type of system, several meter terminal units communicate with one section control unit. In this type of system, it is desirable that the meter terminal unit respond only to the commands received from its associated section control unit. In this instance, all commands received by the meter terminal unit include a further address portion which identifies the section control unit which is transferring commands to that meter terminal unit. When a command is received by a meter terminal unit, it recognizes its own address as well as the address of its associated section control unit in order to perform the functions specified by the commands.

The invention also contemplates apparatus or means for synchronizing a serial stream of data signals, such as from a serialized meter encoder, with a clock signal derived from a source of alternating current to provide the data signals as synchronizing by the clock signal.

In the exemplary embodiment, the encoder and a clock signal generating means are responsive to the alternating current. The encoder provides data signals to the clock signal generating means which includes synchronization means for synchronizing the clock signal with the data signals.

Means are also provided for combining the clock signal with the data signals.

Means are also provided for combining the clock signal and the data signals to enable the provision of the data signals, as synchronized by the clock signal, to a storage means, such as a register.

It is therefore an object of the present invention to provide a meter terminal unit or transponder for use in a remote automatic meter reading and control system having enhanced operating capabilities.

It is another object to provide a meter terminal unit for use in an automatic utility meter reading system responsive to commands from a control center capable of selectively reading, storing and transferring a measured consumed commodity reading over a communication network to the reading control center.

A still further object is to provide a meter terminal unit for use in a computerized data communication system of the type capable of reading meter data from a plurality of residence meter terminal units under command control of a computer.

It is another object to provide a meter terminal unit for use in an automatic meter reading system which provides the selective capability of simultaneously reading and storing meter data from a plurality of meters and a simultaneously transmitting the stored meter data to a computer under command control of the computer.

It is a further object to provide a meter terminal unit for use in an automatic meter reading and control system capable of receiving commands from a control center over a communication line via a control unit to effect the selective carrying out of meter read and store and information transfer operations as well as load control operations in response to commands received by the meter terminal unit.

Still another object is to provide apparatus for synchronizing a serial stream of data signals with a clock signal to provide the data signals as synchronized by the clock signal.

Yet another object is to provide apparatus for synchronizing a serial stream of data signals with a clock signal and combining the data and clock signals to provide the data signals to a storage means as synchronized by the clock signal.

BRIEF DESCRIPTION OF THE DRAWING

The present invention may be more readily understood by reference to the accompanying drawing in which:

FIGS. 2–6 illustrate the various formats of messages and data transferred between units of the system.

FIGS. 9, 10, 11, 13, 14, 15, 19, 21 and 22 are legendary drawings showing the inter-relationships between FIGS. 9A and 9B, 10A–10D, 11A–11H, 13A–13F, 14A–14D, 15A–15D, 19A–19D, 21A and 21B, and 22A–22D.

FIGS. 9A, 9B, 10A–10D, 11A–11H, and 12 are timing diagrams useful in understanding the operation of the section control units of FIG. 1.

FIGS. 13A–13D and 14A–14D are detailed block diagrams of a typical one of the section control units of FIG. 1.

FIGS. 15A–15D, 17, 19A–19D and 22A–22D are detailed block diagrams of a typical one of the meter terminal units of FIG. 1, and FIGS. 16, 18, 20, 21A and 21B and 23 are timing diagrams useful in understanding the operation of the meter terminal units of FIG. 1.

DESCRIPTION OF THE PREFERRED EMBODIMENT

System Description

Figure 1:
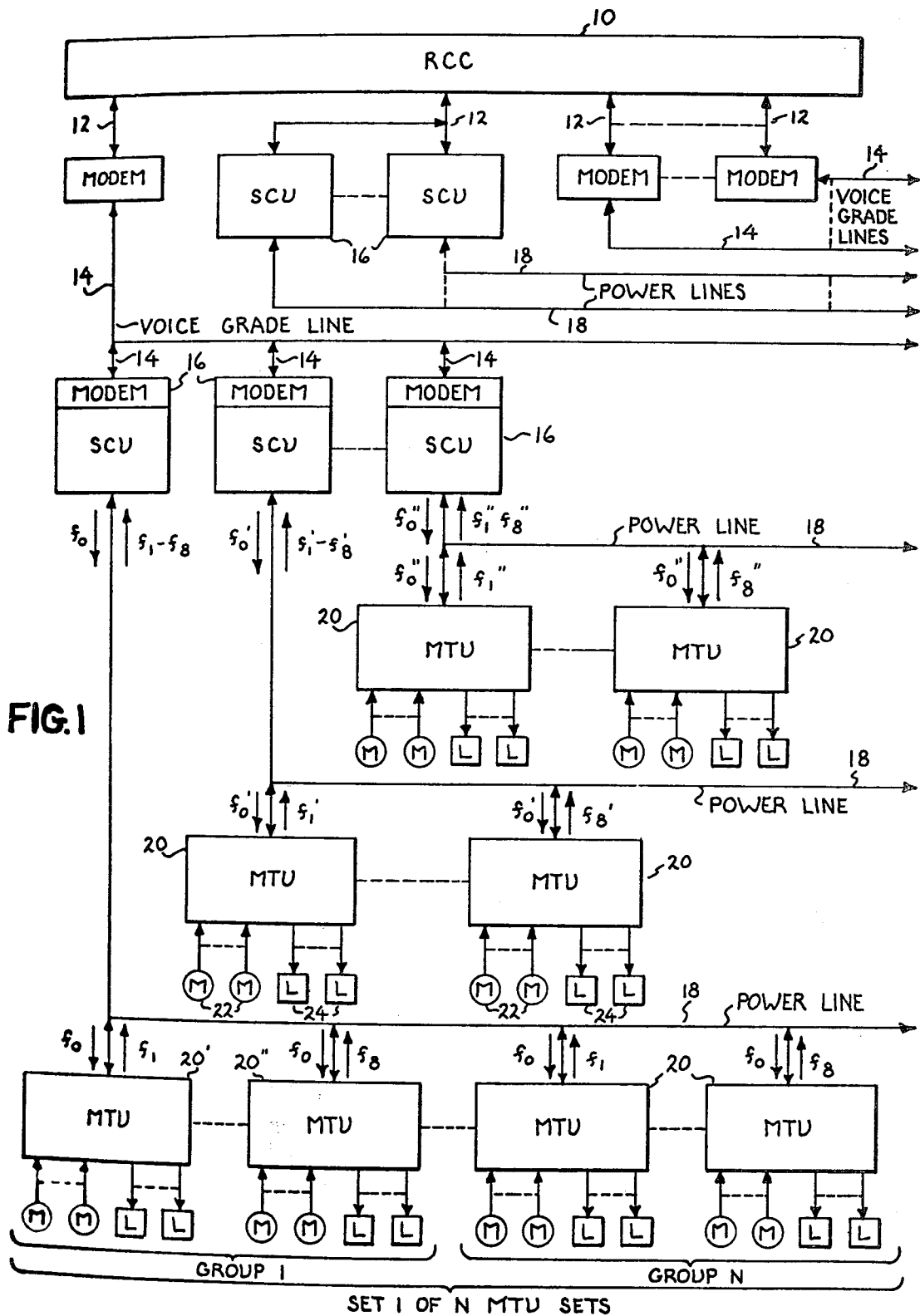
FIG. 1 is a major block diagram of the system of the present invention.

Reference is now made to FIG. 1 of the drawing, which presents a block diagram of the overall system. System control is directed by a reading control center 10 (hereinafter referred to as the RCC), which is comprised of a data processor or digital computer. The computer is of a general purpose type having sufficient memory capacity to store data pertaining to the entire system and is programmed to transmit messages or commands throughout the system and to collect data from the system as described herein below. Many such digital computers are commercially available. For a relatively small system, the PDP8/E computer manufactured by the Digital Equipment Coporation is suitable. For large system applications, the H4010 data processor manufactured by the Honeywell Corporation may be employed. It is to be noted that each of these computers contains its own input/output equipment for the transfer of commands and the receipt of data between the RCC and the rest of the system.

The RCC 10 issues commands and receives data preferably in a multiplex mode over a plurality of digital input/output serial transmission lines 12. It will be noted that some of the lines 12 are connected to modems (modulator/demodulator circuits), which in turn provide communication with a plurality of section control units 16 (SCU) over individual voice grade or trunk lines 14 of the conventional dedicated telephone type. Each SCU 16 also has a conventional modem for interface between its trunk line and the logic internal to the SCU. Transmission of data between the modems is preferably of the frequency shift keying (FSK) type; however, other types of transmission may also be employed. Each of the modems are preferably of the voice frequency type comprised of a commercially available transmitter/receiver. Typical transmitters and receivers of the type which may be employed in the present system are models 68T,2F and 68R,2F, respectively, manufactured by RFL Industries, Inc., Boonton, N.J. These transmitter/receivers are documented in the RFL Industries, Inc. publication entitled Voice-Frequency Carrier Equipment, Series 6850, revised May 1975.

Certain other ones of the digital input/output lines 12 of the RCC are connected directly to the SCU's 16. In most applications, the SCU's will be located at such a distance from the RCC that it is desirable to use the modem in order to properly amplify the signals transmitted over lines 12 and 14. However, there may be situations where one or more SCU's are directly adjacent the RCC, in which case signal strength will be large enough that it is unnecessary to employ the modem.

For purposes of simplicity, the system is illustrated with several SCU's connected to only one modem via their associated voice grade line 14. It is to be understood that all of the other lines 14 could likewise have SCU's connected thereto in the same fashion.

It will be noted that each of the SCU's is connected to an associated electrical power transmission line 18. Each of the power lines also has connected thereto at least one meter terminal unit 20 (MTU). In the preferred embodiment, the transfer of commands and data between the RCC and the SCU's over the voice grade lines 14 is in ASCII code format. Commands or messages issued by the RCC are transferred from the SCU's to their corresponding power lines as digital data consisting of pulses of RF energy at a pulse repetition frequency of preferably 30 Hz. It will be noted in FIG. 1 that output messages from the SCU's are designated as being transferred at a frequency of $f_o$ as indicated by the arrow going downward on the page adjacent each power line 18. The designation $f_o$ indicates the pulse frequency of each bit of transmitted data. Also, as shown in FIG. 1, each SCU, if desired, is capable of transmitting messages at a different frequency as indicated by the $f_o'$ and $f_o''$ notations.

As will be more fully described, each SCU is uniquely addressable and is also capable of recognizing an ALL SCU address in commands received from the RCC. Further, each SCU is capable of recognizing a function code contained within the command to determine the action that it is to take. Message parity is also checked by each SCU. If an SCU recognizes its address, and the command contains proper parity, the SCU will transfer the command onto its associated power line 18. Depending on the contents of the function code, the SCU will go into one of two modes. If the function code specifies that no data is to be received over the power line from one or more MTU's, the SCU will revert to a standby mode. However, if the function code specifies that data is to be received from one or more MTU's, the SCU will go into a receive data mode and wait for receipt of data from the MTU(s) for transfer to the RCC.

It is significant to note that when the reading control center (RCC) issues a command over a voice grade line 14, the SCU's connected to that line simultaneously receive that command. Only those SCU's recognizing their assigned address(es), as specified by the command, will transfer that command over their corresponding power lines 18.

As previously mentioned, messages are transmitted at a frequency of $f_0$ over each SCU's respective power line to a plurality of meter terminal units (MTU's) connected to each of those power lines. In response to certain commands, the MTU's will respond with data representative of a measured commodity at a specified frequency.

Table 1 illustrates representative power line transmission or carrier frequencies which may be employed in the system. A Set No. column in the table specifies a set number of a group of frequencies in the row corresponding to the Set No. The frequency in the $f_0$ column specifies the power line carrier frequency of messages transmitted by the various SCU's. The frequency in the $f_1$-$f_8$ columns specifies the power line carrier frequencies transmitted by a group of eight MTU's connected to the power line by the SCU transmitting the $f_0$ carrier in the Set No. corresponding to those frequencies ($f_1$-$f_8$).

It will be noted that the MTU's 20 on each power line 18 are organized into groups, such as Group 1 through Group N in FIG. 1. Likewise, N number of groups comprise one set of N MTU groups. Each MTU in a group transmits its data at an assigned frequency. For example, in Group 1 it is shown that an MTU 20' transfers its data at a frequency $f_1$, whereas an MTU 20" transfers its data at a frequency $f_8$. All other MTU's, not shown in Group 1, transmit their data at corresponding frequencies $f_2$-$f_7$. Preferably, the data transferred from the MTU's to the SCU's is at 30 bits per second with data pulse bursts of energy at frequencies $f_1$ through $f_8$.

sages or commands to read and store meter data representative of a measured commodity such as the consumption of power, water or gas, and transmit the previously stored data to the RCC via the MTU's associated SCU. Each MTU also responds to commands to control user loads within a residence such as hot water heaters, air conditioners, alert lights, etc.

A command function code specifies to the MTU's whether meter information is to be read and stored, whether the previously stored information is to be transmitted over the power lines or whether a load or loads is to be controlled. The function code also specifies a particular meter to be read or a load(s) to be controlled.

The MTU's are individually addressable, group addressable or addressable in large sets comprised of several groups. A set may encompass all MTU's on a power line. One MTU is generally addressed when it is desirable to interrogate only one residence, for example, during meter survey operations. During normal meter reading operations, however, groups of eight MTU's are generally addressed. The purpose of this will become more clear in the ensuing description. There are situations in a large power system of the type shown in FIG. 1 when it is either desirable, or necessary, to quickly remove all loads from the entire system. This would occur under conditions of a catastrophic power failure which necessitates a mass scramble to shutdown an entire system to prevent damage to the power transmission equipment. In this latter situation, the MTU's can be addressed in large sets or, if desired, all MTU's in an entire system can be simultaneously addressed. Set addressing of the MTU's can also be used for the mass reading and storing of the meter data in the MTU's for subsequent transmission.

The unique addressing scheme of the system permits calling on small concentrated groups of MTU's for the transmission of meter data or for the performance of various functions in large geographically dispersed sets of MTU's for simultaneous actions such as read and store data or load control.

There are many such meters on the market suitable for employment in the present system. In the preferred embodiment, however, the meters employed have encoders for transferring consumed commodities such as power, water or gas to the MTU's for storage for transmission at a later time. Several types of encoder type meters are known such as contact switch closure types, parallel switch contact types, optical read-out, etc. The

TABLE I

| | POWERLINE CARRIER FREQUENCIES | | | | | | | | |
|---|---|---|---|---|---|---|---|---|---|
| Set No. | $f_0$ Hz | $f_1$ Hz | $f_2$ Hz | $f_3$ Hz | $f_4$ Hz | $f_5$ Hz | $f_6$ Hz | $f_7$ Hz | $f_8$ Hz |
| 1 | 31410 | 30030 | 30450 | 30870 | 31290 | 31710 | 32130 | 32550 | 32970 |
| 2 | 34830 | 33390 | 33810 | 34230 | 34650 | 35070 | 35490 | 35910 | 36330 |
| 3 | 38370 | 36930 | 37350 | 37770 | 38190 | 38610 | 39030 | 39450 | 39870 |
| 4 | 41730 | 40290 | 40710 | 41130 | 41550 | 41970 | 42390 | 42810 | 43230 |
| 5 | 45210 | 43770 | 44190 | 44610 | 45030 | 45450 | 45870 | 46290 | 46710 |
| 6 | 49050 | 47610 | 48030 | 48450 | 48870 | 49290 | 49710 | 50130 | 50490 |

Reference is now made to the meter terminal units 20 (MTU's) of FIG. 1. Each of the MTU's is located at metering locations such as household residences, business residences, factories or the like. The primary purpose of each MTU is to provide communication interface between the SCU's 16 via the power lines 18 and commodity measuring meters 22 and electrical loads 24 connected to the MTU's. Each MTU responds to mespresent system preferably employs a mechanical nondestructive storage encoder which provides a meter serial data readout as disclosed in U.S. Pat. No. 3,846,789, issued Nov. 5, 1974, entitled Remote-Reading Register with Error Detecting Capability, to Warren R. Germer et al and assigned to the assignee of the present invention.

Message and Data Formats

Prior to proceeding with a further description of the system, it is considered advantageous at this time to provide a detailed description of the various message and data formats of the information transferred between the RCC and the SCU's and MTU's of the system. Reference is now made to FIG. 2, which illustrates the format of the messages or commands transferred from the RCC to the SCU's. It will be noted that the message is in ten bit ASCII code format wherein each character is comprised of a start bit at the beginning of the character and a stop bit at the end of the character. Eight bits of information are included between the start and stop bits of each character. The first character received by an SCU from the RCC is an SCU address. The second character forms a portion of the MTU address. It will be noted that the third character is comprised of three bits of MTU address and five bits of information which specify an SCU/MTU function code. The decode of these five bits by the SCU specifies to that unit its mode of operation. If the function code specifies that either a control or a meter read and store function is to be performed by an MTU(s), then a data response is not expected by the SCU, and it will revert to the standby mode after transmission of the message to the MTU(s). If, however, the function code specifies that information is to be received from the MTU, the SCU will go into a wait or data receive mode. After the MTU(s) data has been received by the SCU and transferred to the RCC, the SCU will revert back to the standby state in preparation for receipt of another message from the RCC.

The last character in the message received by the SCU from the RCC is a parity character. The present system employs the well-known Bose-Chauduri check code generated by the Polynomial $1+X+X^6$ operating on the 24 message bits transmitted from the RCC to the SCU, and on 36 bits of data transmitted by each MTU. Only six bits of the eight-bit parity character are used, the last two bits being ignored. Even though the use of parity is described in the present system, it forms no part of the invention and is merely illustrated for a more simple understanding of the disclosure. It is to be understood that other types of parity schemes could be just as effectively used.

Reference is now made to FIG. 3, which illustrates the message format of messages transferred from an SCU(s) to an MTU(s). It will be noted in this message that the start and stop bits do not exist. Logic within the SCU removes or strips off the start/stop bits and appends to the front of the message a start message code of three bits having the binary configuration of 001. These start bits are used by the MTU to detect the start of a message from the SCU. It will also be noted that the SCU passes the message intact as received minus the start/stop bits. That is, it transfers the SCU address in an eight-bit field, the MTU address in an eleven-bit field, the MTU function code in a five-bit field and the six-bit parity code. For purposes to be later described, it should be noted at this time that the SCU regenerates the SCU address and does not pass that address on precisely as received from the RCC. Additionally, the SCU regenerates parity because a portion of the message address may be altered.

Figure 4:
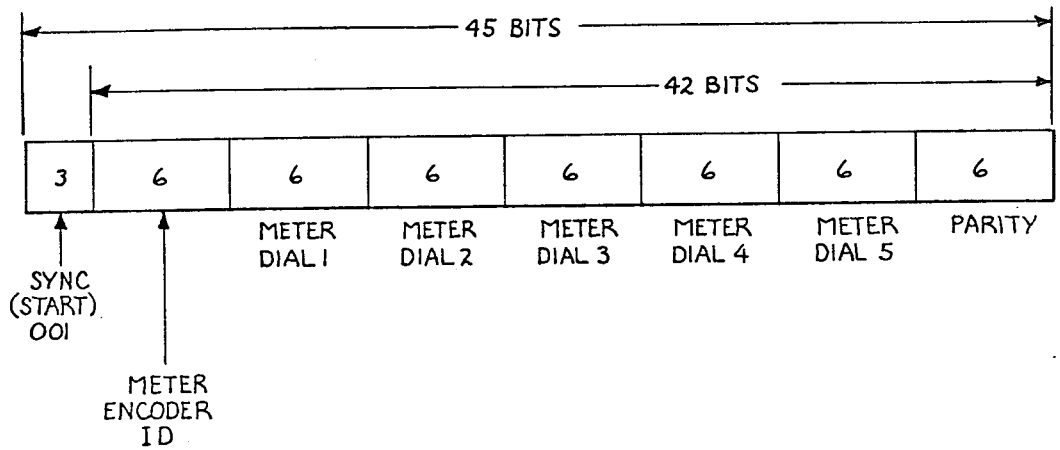

Reference is now made to FIG. 4, which shows the data format of messages transmitted from an MTU(s) to an SCU(s). As previously mentioned, the MTU responds to basically three different commands: Read and store, perform a control action, and transmit a meter reading. As such, as shown in FIG. 4, the only data transferred from the MTU's to the SCU's over the power lines is a message carrying information or data representative of the meter dial readings from the encoder of an addressed MTU meter. When an MTU receives a transmit command from the SCU, the message format as shown in FIG. 4 is transmitted by the MTU. The MTU, like the SCU, generates three message start or sync bits as binary 001 for recognition by the SCU to detect the start of a message or data word. Further, the meter encoder generates an identification code (ID), as the second six-bit character. The generation of this code is shown and described in the aforementioned U.S. Pat. No. 3,846,789, and is for use by the RCC computer program to identify the particular meter being read.

Following the meter encoder identification code are five six-bit binary characters generated by the meter encoder representative of meter dial readings 1 through 5. The last character in the message transferred by the MTU's to each SCU is the six-bit parity code. It is to be emphasized that the message format shown in FIG. 4 is representative of the data message transmitted by each addressed MTU to an SCU over the power lines.

As previously mentioned, in the present system groups of MTU's (e.g., eight MTU's) can be simultaneously addressed to transfer their corresponding meter data to the SCU. In the present system, when a group of eight MTU's is addressed, these eight MTU's basically transfer the meter data simultaneously over the power lines to their corresponding SCU. Also, as previously mentioned, this transmission of data from each MTU is at a different frequency corresponding to each MTU. Each SCU contains eight narrow-band receiver amplifier circuits capable of discriminating between the frequencies of the messages from each of the eight MTU's. As a result, when eight separate messages are placed on the power line, the SCU is capable of receiving each of those eight messages in its corresponding amplifiers.

Figure 5:
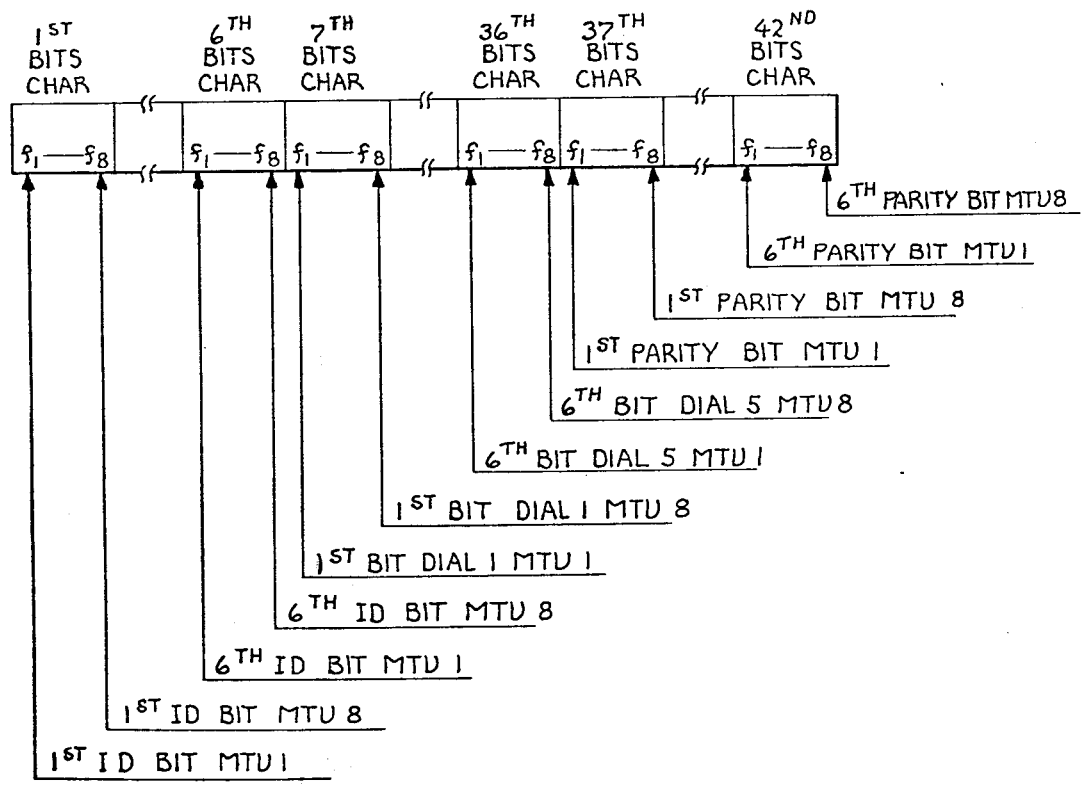

Reference is now made to FIG. 5, which shows the message or data format of information from an addressed group of eight MTU's and how that information appears on the power lines at the SCU's. Not shown in FIG. 5 are the three message start or sync bits 001 generated by each MTU. It will be noted that when eight MTU's are simultaneously addressed to transmit information to an SCU, the message bits of each MTU are transmitted simultaneously in a serial fashion onto the power line. The first character to be transferred by each MTU (at their corresponding frequencies $f_1$-$f_8$) is the first identification code bit of the addressed encoder or meter of each one of the MTU's 1-8 (See FIG. 1). Not shown in FIG. 5, but also transmitted immediately thereafter are the 2nd, 3rd, 4th and 5th identification code bit characters. Next, the sixth identification code bits are transmitted from the MTU's 1-8. Following the last character containing the meter identification code bits are the meter dial readings (dials 1 through 5) in corresponding bits characters 7th through 36th. Following the 36th bits character are bits characters 37th through 42nd, which contain the parity bits generated by each of the MTU's. The information as shown in the message format of FIG. 5 is received a bit at a time in each of the eight separate channel receivers of the SCU and assembled in the SCU into eight-bit ASCII characters for transfer to the RCC for processing.

Figure 6:
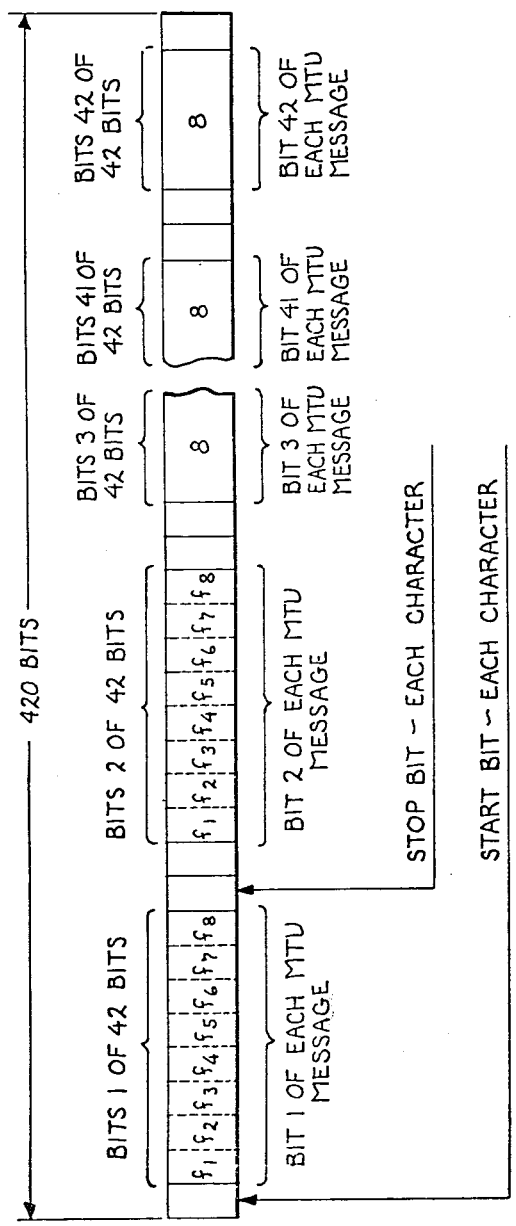

Reference is now made to FIG. 6. Comparing the message formats of FIGS. 5 and 6, it can be seen that a great deal of similarity exists between those formats. The SCU, in reformatting the message for transfer to the RCC, first appends a start and stop bit to each character developing the ASCII code. As previously described, each MTU message to the SCU is comprised of 42 bits (i.e., minus the three message start bits). The SCU detects these three message start bits; however, they are removed before the message is transferred to the RCC. As can be seen in FIG. 6, the message is transferred basically intact as shown in FIG. 4. That is, the first character transferred from the SCU to the RCC is comprised of eight bits corresponding to frequencies $f_1$-$f_8$ from each of the MTU's 1 through 8. Each of these bits corresponds to one bit from the MTU generating the message bit at that specific frequency. The message format of FIG. 6 is basically the same format of FIG. 5, wherein bits 1-8 of characters 1-6 of the message comprise the meter encoder identification code for eight MTU's. Bits 1-8 of characters 7-36 comprise the meter dial readings of meters 1-5 of each of the eight MTU's and bits 1-8 of characters 37-42 comprise the parity bits for each of the eight MTU's.

Although not forming a part of the present invention, it is worth noting that the RCC program receives the data in the format shown in FIG. 6 and organizes that data by assembling each of the bits of the characters into complete words corresponding to data from each of the MTU's. Once this data is formatted into words corresponding to each of the MTU's, then that data can be appropriately processed by a computer program for billing purposes, load control, meter surveying, etc.

System Operation—Flow Charts

Figure 7:
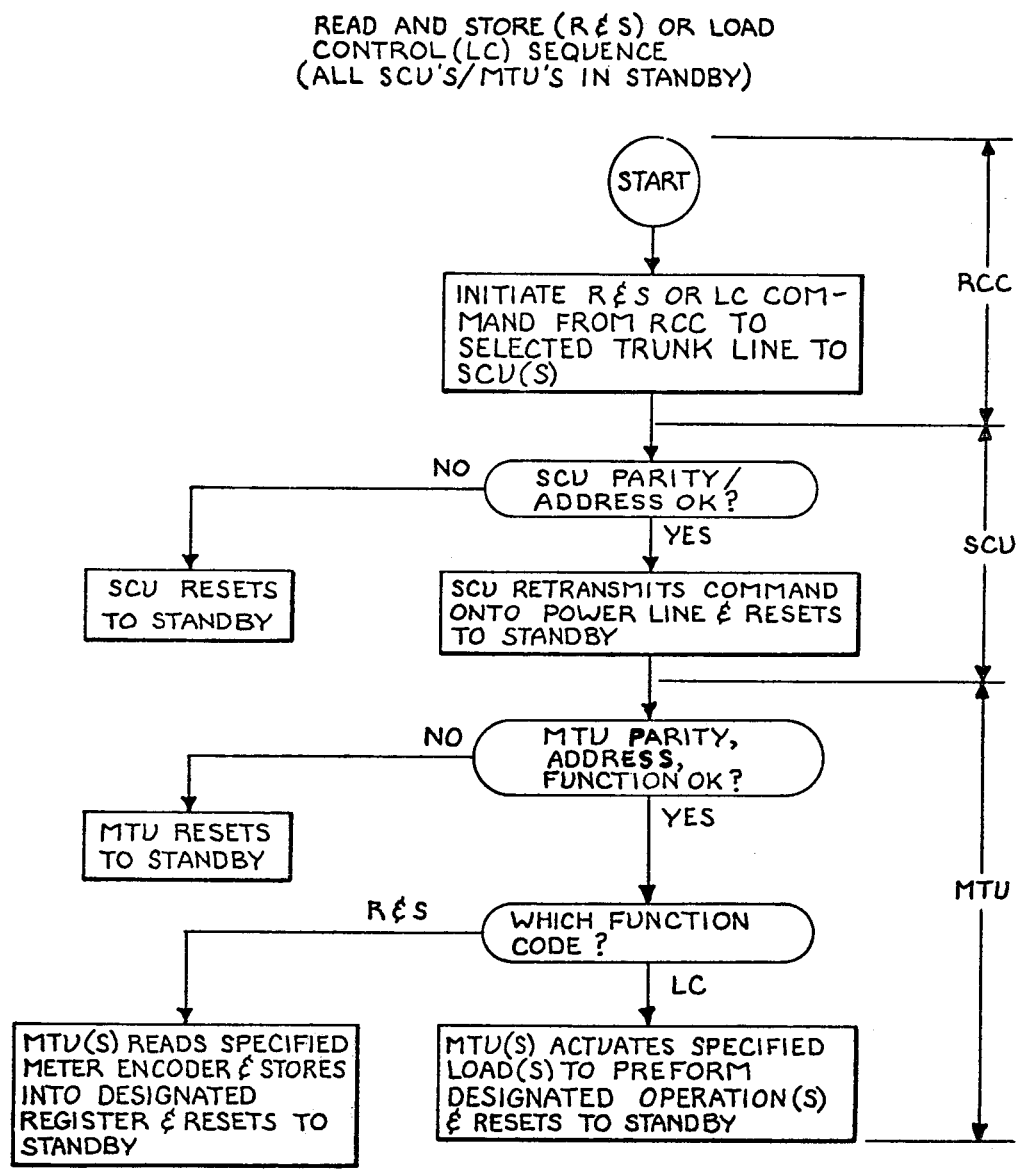
FIGS. 7 and 8 are flow charts useful in understanding the sequence of operations which take place in the system.
Figure 8:
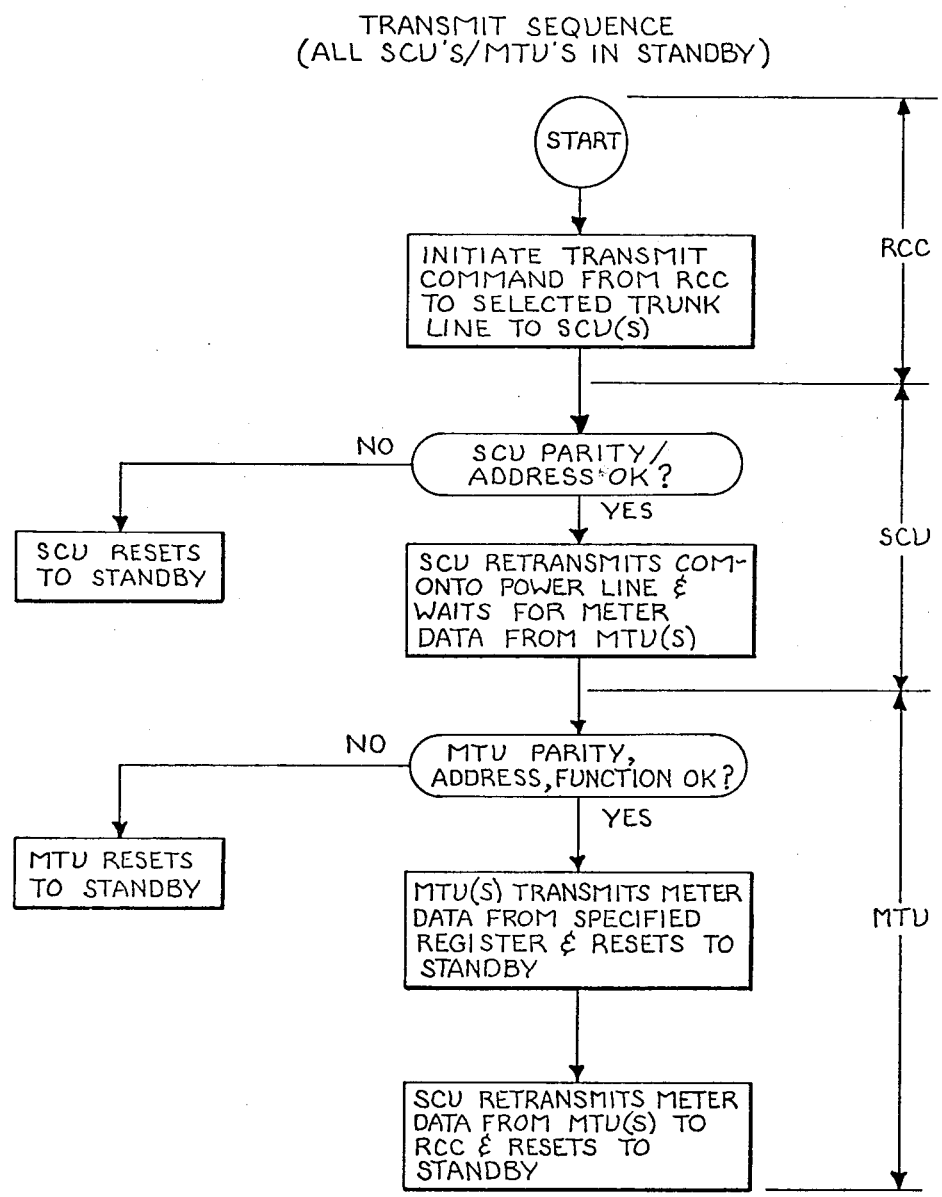

FIGS. 7 and 8 are flow charts showing the sequence of operations for the entire system. Referring first to FIG. 7, there is shown a flow chart which exemplifies the operation of the system during the generation of a read and store or load control sequence by the RCC. The initiation of a command from the RCC is indicated by a start circle in FIG. 7. The read and store or load control command is provided to one of the voice grade trunk-lines 14 (FIG. 1) activated at that time by the RCC. The message is then received by the SCU's on that line, which check to see if message parity is okay and if the address contained within the message is meant for one or all of the SCU's. If an SCU does not recognize the address, or if the parity check is bad, that SCU branches through a no exit into an "SCU resets to standby" block. That SCU will thus remain in a standby mode pending receipt of another message. If, however, an SCU determines that the parity check is okay, and that the address contained within the message is meant for that SCU, it exits through a yes branch into an action block wherein the SCU proceeds to retransmit the command onto the power line and reset to standby.

The message now being transferred onto the power line goes to each of the MTU's connected to that power line. Each MTU checks to see if the parity of the message is okay. Each MTU also checks to see if the message address is meant for that MTU and if the function code is valid. If any one of these conditions does not properly check, the MTU will exit a no branch, at which time it resets to a standby mode in preparation to receive another message. However, if all of the tests are valid, the MTU exits through a yes branch and the function code is decoded to determine which operation is to take place by the MTU. If the function code is detected as a read and store command, the program exits through an R & S branch into an action block wherein the MTU reads the specified meter encoder of one of a plurality of meter encoders and stores the meter dial readings of that encoder into a designated one of several registers in the MTU as specified by the function code. The MTU then resets to the standby mode. It is in this manner that the MTU can be commanded to read and store meter information for subsequent recall by the program in response to an MTU transmit command to subsequently be described.

Referring now back to the "which function code?" decision block, if the function code is decoded as a load and store command, the MTU then exits through an LC branch. The LC branch enters into an action block wherein the MTU or MTU's, if more than one is addressed, actuates the specified load or loads to perform a designated operation or operations as specified by the function code. Upon termination of the load control operation(s), the MTU then resets to standby in preparation to receive another message.

Reference is now made to FIG. 8, which is a flow chart showing how each MTU responds to a transmit command issued by the RCC. Similarly to FIG. 7, the RCC, in a start circle, initiates the transmission of a transmit command to a selected one of the trunk lines 14 to the SCU(s) on that line. The SCU(s) connected to that trunk line checks the message parity and address as described for FIG. 7. If either of these conditions fail, a no branch is taken out of the "SCU Parity Address OK?" decision block and the SCU resets to standby. If, however, the parity and address checks are positive, the SCU exits through a yes branch into an action block wherein the SCU retransmits the command onto the power line and then goes into a wait mode for receipt of the meter data from the addressed MTU(s). The MTU(s) then checks the parity, address and function code as previously described. If either of these checks fail, the MTU exits through a no branch and resets to standby. If all conditions are positive, however, the MTU(s) begins to transmit the meter data from the register as specified by the function code in the transmit command. After the MTU(s) has transmitted all of the meter data from the designated register, it resets to the standby state in preparation to receive another command.

SECTION CONTROL UNIT (SCU) OPERATIONAL DESCRIPTION

Reference is now made to FIGS. 9, 10, 11, 13 and 14, which are legendary drawings showing the inter-relationships between the various drawings of the SCU.

The timing diagrams showing the operation of the SCU are shown in FIGS. 9A and 9B, FIGS. 10A-10D, FIGS. 11A-11H, and the detailed logic of the SCU is shown in FIGS. 13A-13F and 14A-14D. The various shift registers, counters, flip-flops and gating circuits utilized in the construction of the SCU are preferably fabricated from integrated circuit logic.

The various blocks comprising the above-mentioned circuits may be fabricated from commercially available devices as listed in Table 2. The listing in Table 2 gives the manufacturers' names, the manufacturers' part number and the circuit name identification as shown in the drawing. Footnotes 1-5 at the end of Table 2 give the manufacturers' references where the various circuits can be found.

TABLE 2
SECTION CONTROL UNIT MANUFACTURERS' CIRCUIT IDENTIFICATION

| CIRCUIT NAME | MANUFACTURER | MANUFACTURER'S NO. |
|---|---|---|
| MODEM | RFL INDUSTRIES,[1] INC. | TRANSMITTER (68AT-WF-D) RECEIVER (68R-2F-5) |
| DATA TRANSMITTER/RECEIVER | GENERAL INSTRUMENT[2] CORP. | AY-5-10131 AY-5-10134 |
| RECEIVE DATA MEMORY REGISTER | SIGNETICS CORP.[3] | S54170 |
| CHARACTER COUNTER | " | S5493 |
| WRITE CHARACTER F/F | " | S5474 |
| SYSTEM CONTROL F/F | " | S5474 |
| PARALLEL IN SERIAL OUT REGISTER | " | S54166 |
| RESPONSE EXPECTED F/F | " | S5474 |
| FFEF | " | S5474 |
| FFDF | " | S5474 |
| RTSFF | " | S5474 |
| PLRFF | " | S5474 |
| SAXFF | " | S5474 |
| GRFF | " | S5474 |
| POWER LINE CONTROL COUNTER | " | S54161 |
| REGISTER READ OUT/ADDRESS CHECK COUNTER | " | S54161 |
| S/R CONTROL F/F | " | S5474 |
| SCUADD F/F | " | S5474 |
| POWER LINE XUITR F/F | " | S5474 |
| 1SEC DELAY FOR NEXT CHAR. | " | S5490 |
| 30 Ms DELAY COUNTER | " | S5495 |
| 3 Ms DELAY CONTROL F/F | " | S5474 |
| STATE F/F | " | S5474 |
| STORE A F/F | " | S5474 |
| STORE B F/F | " | S5474 |
| 267 Ms DELAY ÷ COUNTER | " | S5492 |
| FF1A | " | S5474 |
| 50 Ms F/F | " | S5474 |
| FF2A | " | S5474 |
| EOM F/F | " | S5474 |
| 50 Ms DELAY ÷ 12 COUNTER | " | S5493 |
| 30 HZ STROBE CLOCK COUNTER | " | S5493 |
| MESSAGE LENGTH COUNTER | " | S54161 |
| φA, φB, φC, φD F/F's | " | S5474 |
| REMOVE START BITS COUNTER | " | TWO S5473 |
| ONE SHOT | " | S54121 |
| NARROW BAND RECEIVER/AMPS | TEXAS INSTRUMENTS[4] INC. | THREE SN52709AL |
| BAND PASS FILTER | GENERAL INSTRUMENTS[5] CORPORATION | TWO AY-6-4016 INTERCONNECTED THROUGH AN SN52709AL |

[1] This modem can be found in RFL Industries, Inc., Boonton, N.J. U.S.A. publication entitled, Voice-Frequency Carrier Equipment, Series 6850, revised 5/75.
[2] This circuit can be found in General Instruments Corp. Microelectronics Technical Bulletin entitled, UAR/T Universal Asynchronous Receiver/Transmitter, AY-5-1013/AY-5-1013A, March 1974.
[3] All Signetics circuits, including logic gates not listed in Table 1, can be found in the manual entitled, Signetics Digital Linear MOS Data Book, copyright 1974.
[4] This circuit can be found in the Texas Instruments, Inc. manual entitled, The Linear and Interface Circuits Data Book for Design Engineers, copyright 1973.
[5] This circit can be found in General Instruments Corp. Advance Bulletin 1970, entitled MTNS 16 Channel Random/Sequential Access Multiplexer AY-6-4016.

The operation of the SCU will be described in basically two modes of operation. The first mode will be with the SCU starting in standby and its operation when receiving a message from the RCC and the transmission of that message onto the power line for receipt by an MTU(s). The second mode of operation to be described will be with the SCU in the wait mode and its operation when receiving meter data over the power line from an MTU(s) and the transfer of that data to the RCC.

Let it first be assumed that power has just been applied to the SCU. With the application of power, a power on reset block 26 in FIG. 13A applies a binary 1 reset pulse to an R terminal of a system control flip-flop 28 via an OR gate 30 and a conductor 32. Flip-flop 28 now resets generating a binary 1 SCU reset signal on a conductor 34 connected to an O output terminal of flip-flop 28. The SCU reset signal is applied to the various registers, counters and flip-flops in the SCU, causing those devices to all reset to a binary 0 state and placing the SCU in the standby mode.

Figure 13A:
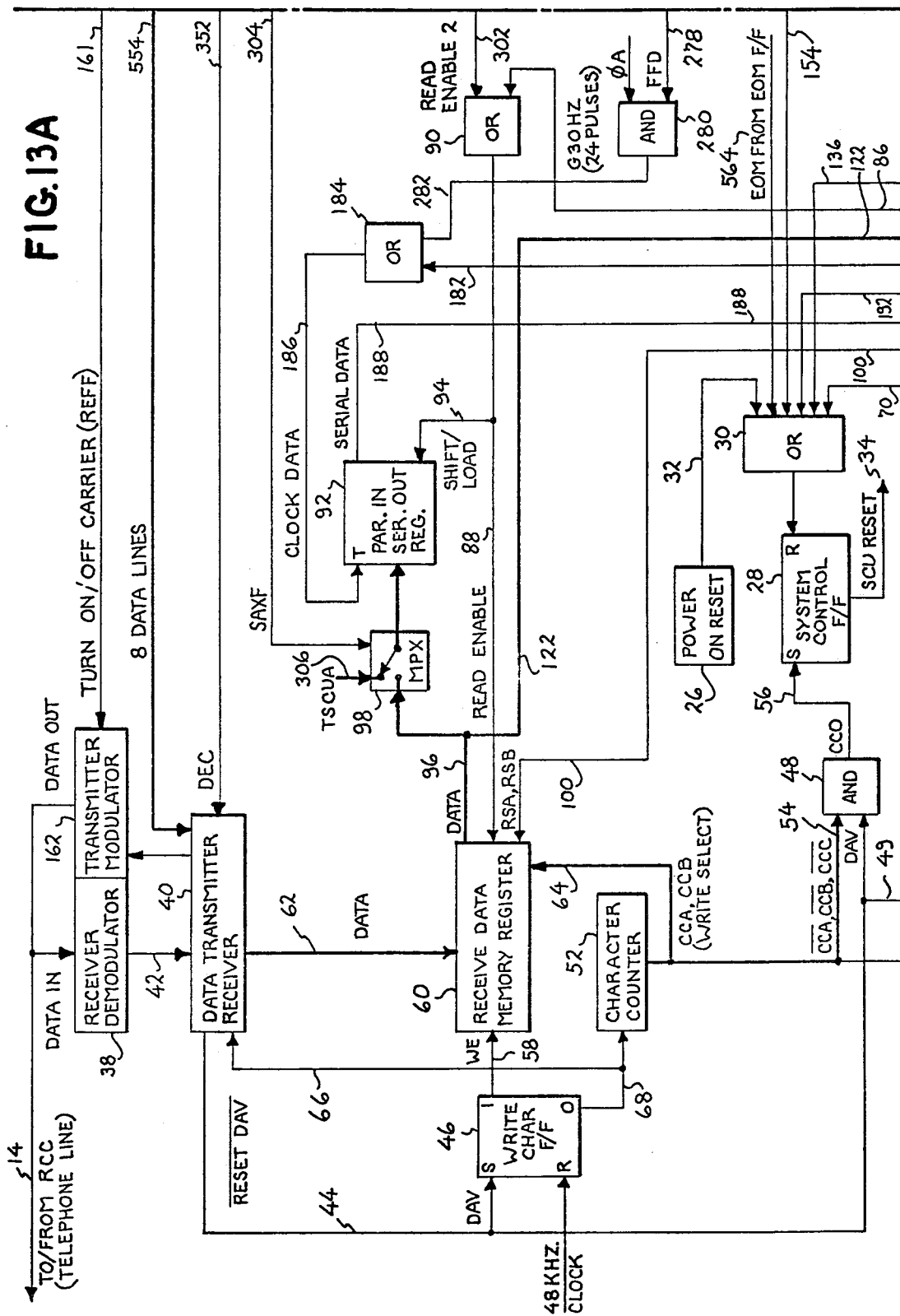
Figure 13B:
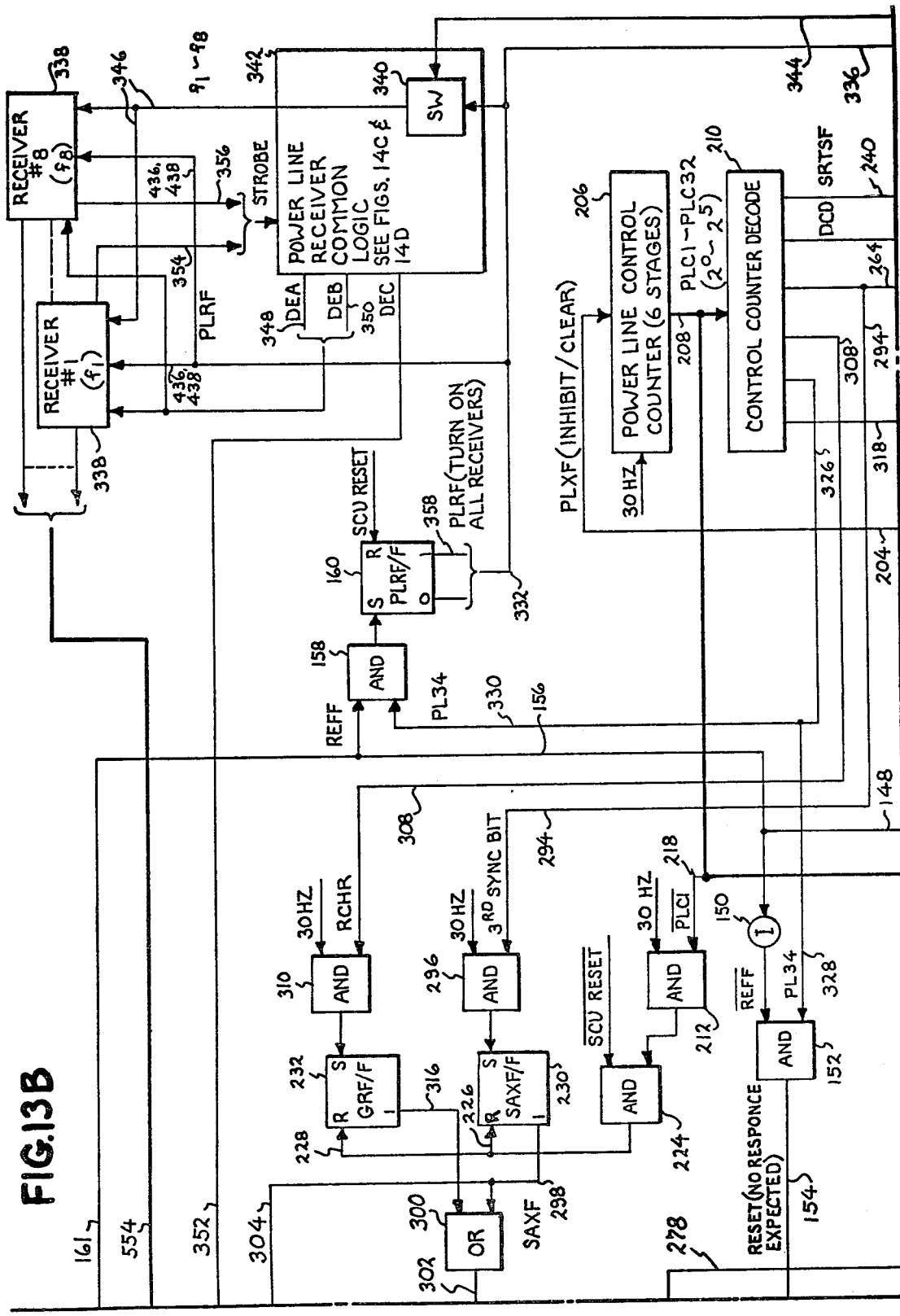
Figure 13C:
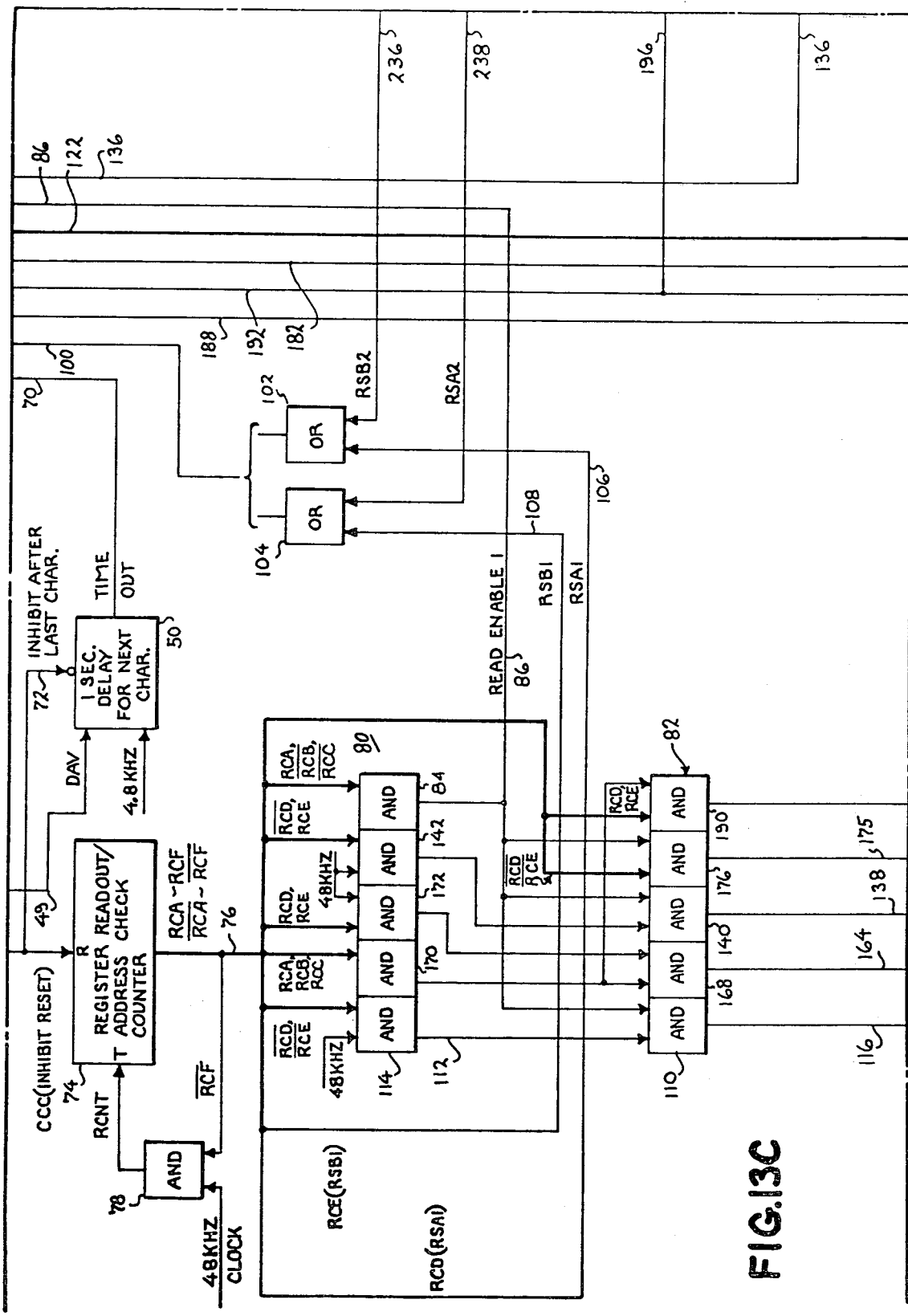
Figure 13D:
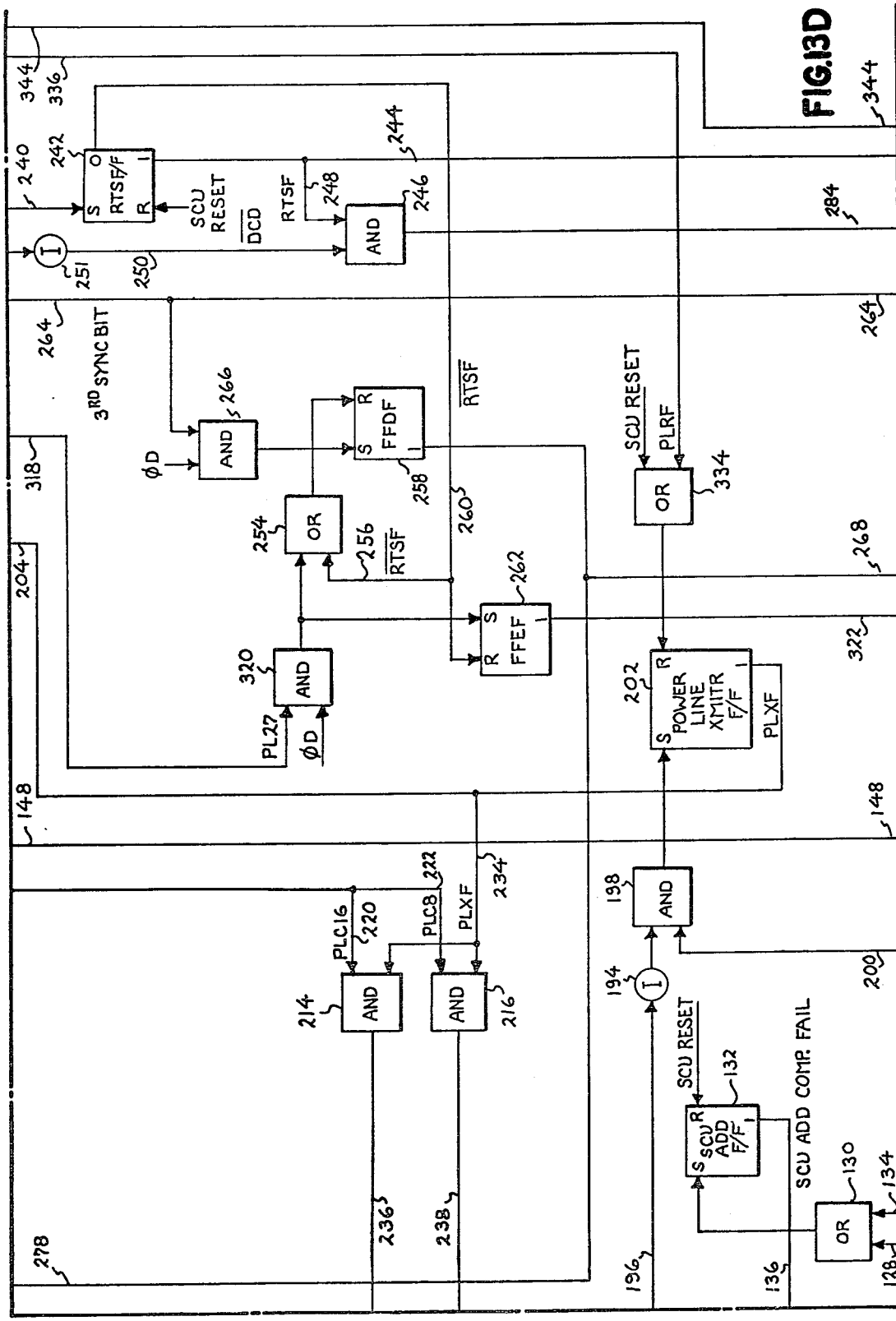
Figure 13E:
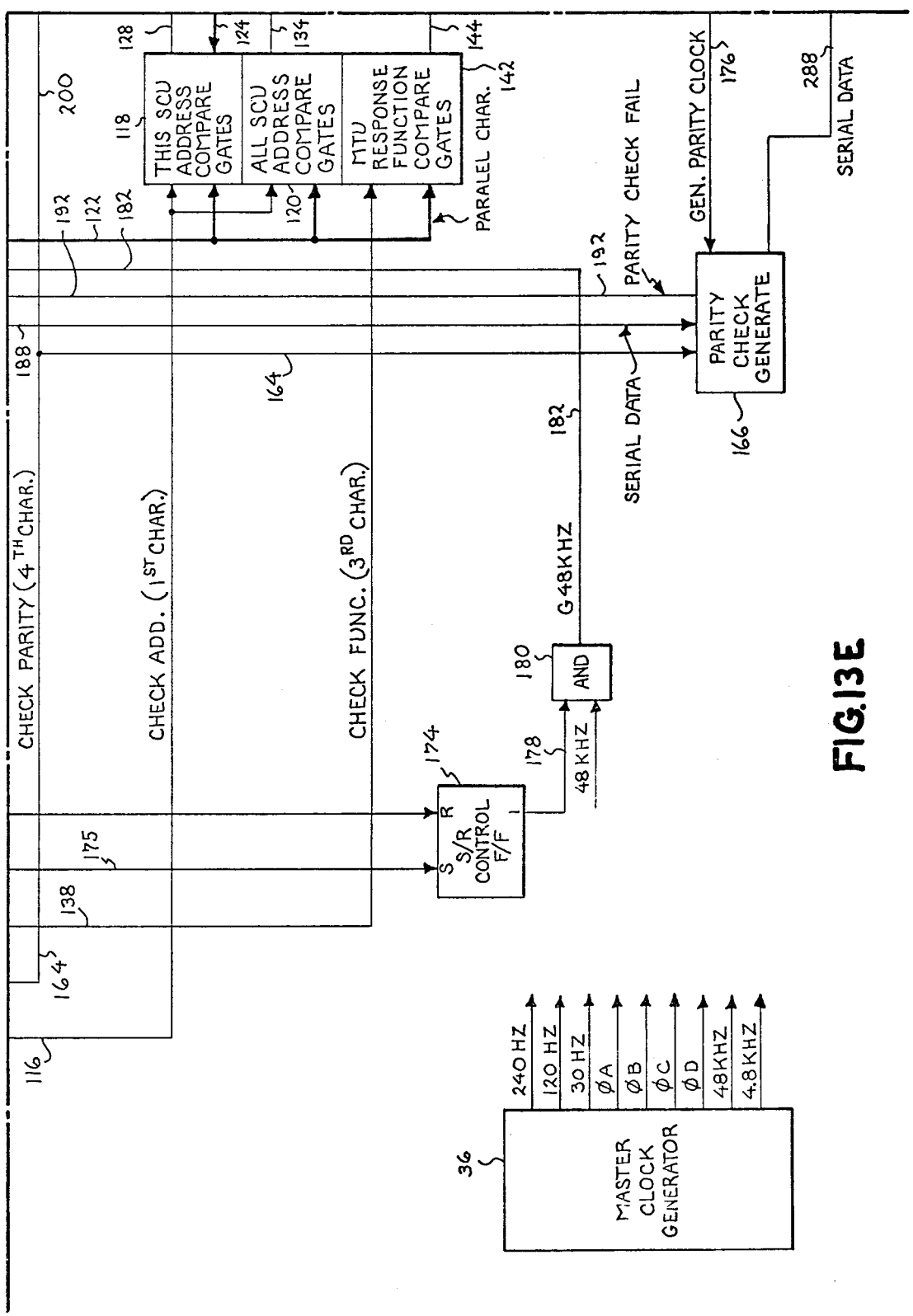

Referring now to FIG. 13E, there is shown a master clock generator 36 now generating a plurality of output timing signals for use in controlling the SCU timing operations. These various timing signals are shown connected to the appropriate circuits in the SCU as well as being shown in the aforementioned SCU timing diagrams.

Figure 9A:
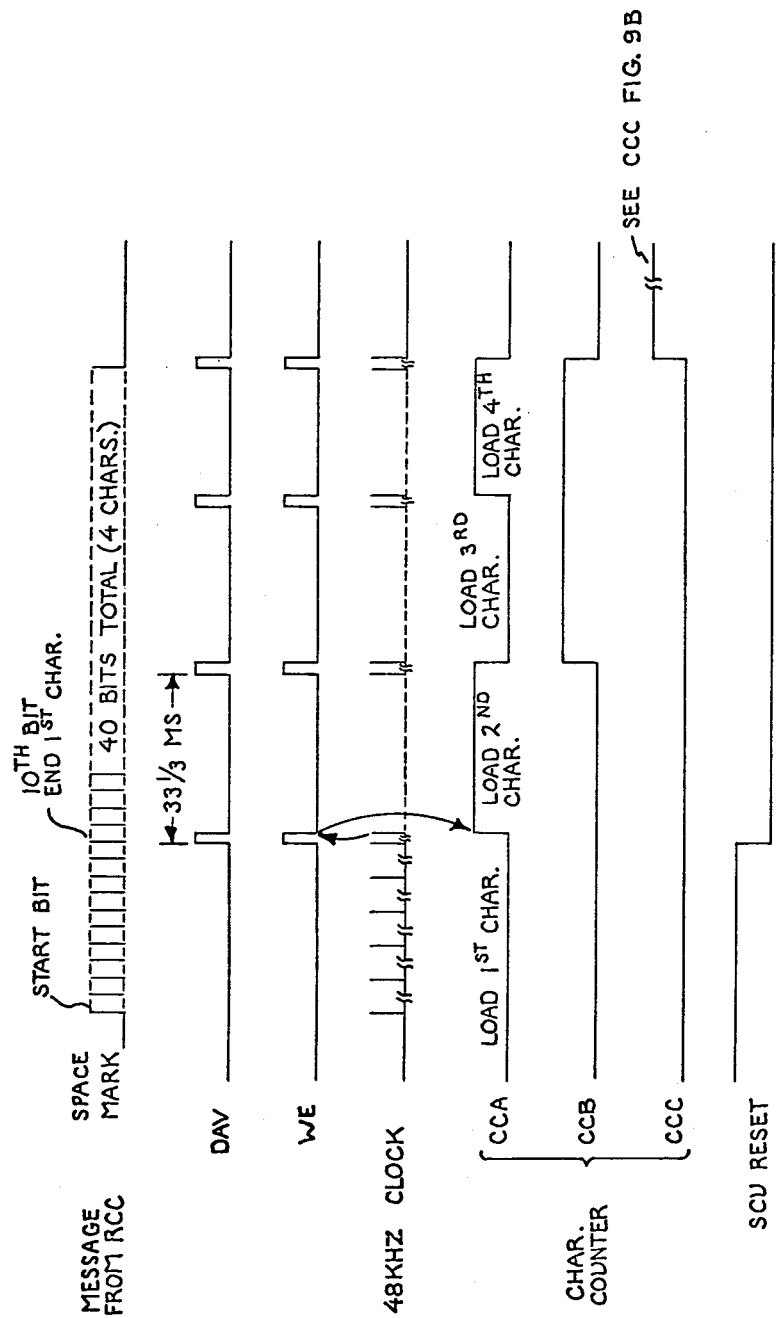

Reference is now made to FIGS. 9A and 13A. In FIG. 9A at the top of the timing diagram, there is shown a message from the RCC appearing at a receiver/demodulator 38 of an SCU modem on a trunk line 14. As previously described, this message is transmitted in ASCII code using FSK transmission techniques. Transmission is preferably at 300 baud. The receiver 38 passes the message in serial form into a data transmitter receiver circuit 40 via a conductor 42. The data transmitter receiver 40 is a universal asynchronous receiver/transmitter LSI subsystem which accepts binary characters from either a terminal device such as a modem, or a computer such as the RCC. As will subsequently be described, this subsystem also receives data characters in parallel. Data output from this subsystem is also in serial or parallel.

As previously described in connection with FIG. 2 and as shown in FIG. 9A, all incoming characters to the SCU from the RCC contain a start bit, eight data bits and a stop bit. As shown in FIG. 9A, when the data transmitter/receiver 40 detects a mark to space transition, it detects that transition as the start bit of a character and begins to take in the eight data bits plus the stop bit. When the tenth bit (end of the first character) is received by the data transmitter/receiver 40, that circuit generates a binary 1 data available signal DAV on a conductor 44. The DAV signal is applied simultaneously to a set input(s) of a write character flip-flop 46, as one input to an AND gate 48 and to a one-second delay circuit 50 of FIG. 13C via a conductor 49.

The presence of the DAV signal at AND gate 48 causes that gate to be enabled due to three binary 1 output signals, $\overline{CCA}$, $\overline{CCB}$, $\overline{CCC}$, applied to gate 48 from a character counter 52 via a plurality of conductors 54. With AND gate 48 enabled, a binary 1 CCO (character count 0) signal is generated on a conductor 56 and applied to a set(s) input terminal of the system control flip-flop 28, setting the latter.

It will be recalled, at the outset of the present discussion, flip-flop 28 was reset when power was applied to the system. With the system control flip-flop 28 now set at the time shown in FIG. 9A, the SCU reset signal goes to a binary 0 removing the reset signal from all counters, registers and flip-flops in the system, thus freeing the system to run.

Reference is now made back to the write character flip-flop 46, which is set by the DAV signal. As can be seen in FIGS. 9A and 13A, the write character flip-flop 46 generates a write enable signal WE on a conductor 58, which is applied as an enable signal to a receive data memory register 60 to effect the parallel transfer of the eight-bit data character now in the data transmitter/receiver 40 into the receive data memory register via conductors 62.

The receive data memory register 60 is basically an LSI memory capable of storing a complete 32-bit message (four eight-bit characters) into selectable character locations of that memory. The locations in the data memory register are selected by a plurality of address signals CCA and CCB (called write select in FIG. 13A) on conductors 64 from the character counter 52. As shown in FIG. 9A, the WE signal allows the first message character to be loaded into the receive data memory register into a location specified by CCA and CCB. It will be noted that the write character flip-flop 46 receives at its reset (R) input terminal a 48 kHz clock signal from the master clock generator 36 of FIG. 13E. This signal is shown in FIG. 9A resetting flip-flop 46.

As soon as the write character flip-flop 46 is reset by the 48 kHz clock, its one-output terminal causes the WE signal to go to a binary 0 and its O output terminal to go to a binary 1 generating a $\overline{Reset\ DAV}$ signal. As shown in FIG. 13A, this latter signal is applied to the data transmitter/receiver 40 and to the character counter 52 via conductors 66 and 68, respectively. The $\overline{Reset\ DAV}$ signal causes the DAV signal to now go to a binary 0 and simultaneously causes the character counter 52 to count up to a count of one as shown in FIG. 9A (CCA set). With the character counter now setting at a count of one, it can be seen that the CCA signal is at a binary 1 and the CCB signal is at a binary 0, thus applying the proper input address signals to the receive data memory register 60 on conductors 64 for receiving the second message character.

The second, third and fourth characters will continue to be taken into the data transmitter/receiver 40 and placed in the proper character positions of the receive data memory register 60 under control of the CCA, CCB and WE signals in the manner just described. As shown in FIG. 9A, when the fourth character has been loaded into the receive data memory register, the CCC output of the character counter 52 goes to a binary 1, indicating that the receive data memory register is full.

A momentary digression is now made in the present description by referring to FIG. 13A to the one-second delay for next character circuit 50. It will be noted that that circuit receives the DAV signal and a 4.8 kHz clock signal. The purpose of the one-second delay is to cause the SCU to reset if it does not receive a data character within one second from the generation of the first DAV signal. If a character is not received within the one-second time interval, a binary 1 time-out signal on conductor 70 is applied to the system control flip-flop via OR gate 30 causing the SCU to reset. In this manner, should a false start bit come down the telephone line 14 from the RCC, the system will not be falsely triggered into operation. It will also be noted that the CCC signal from the character counter is applied to an inhibit input of the one-second delay via conductor 72. The CCC signal is normally a binary 0 to enable the one-second delay through a circle inverter. However, when the CCC signal goes to a binary 1, that signal is inverted to a binary 0 inhibiting the operation of the one-second delay and preventing the time-out signal from being generated after the last character has been fully loaded into the receive data memory register.

Figure 9B:
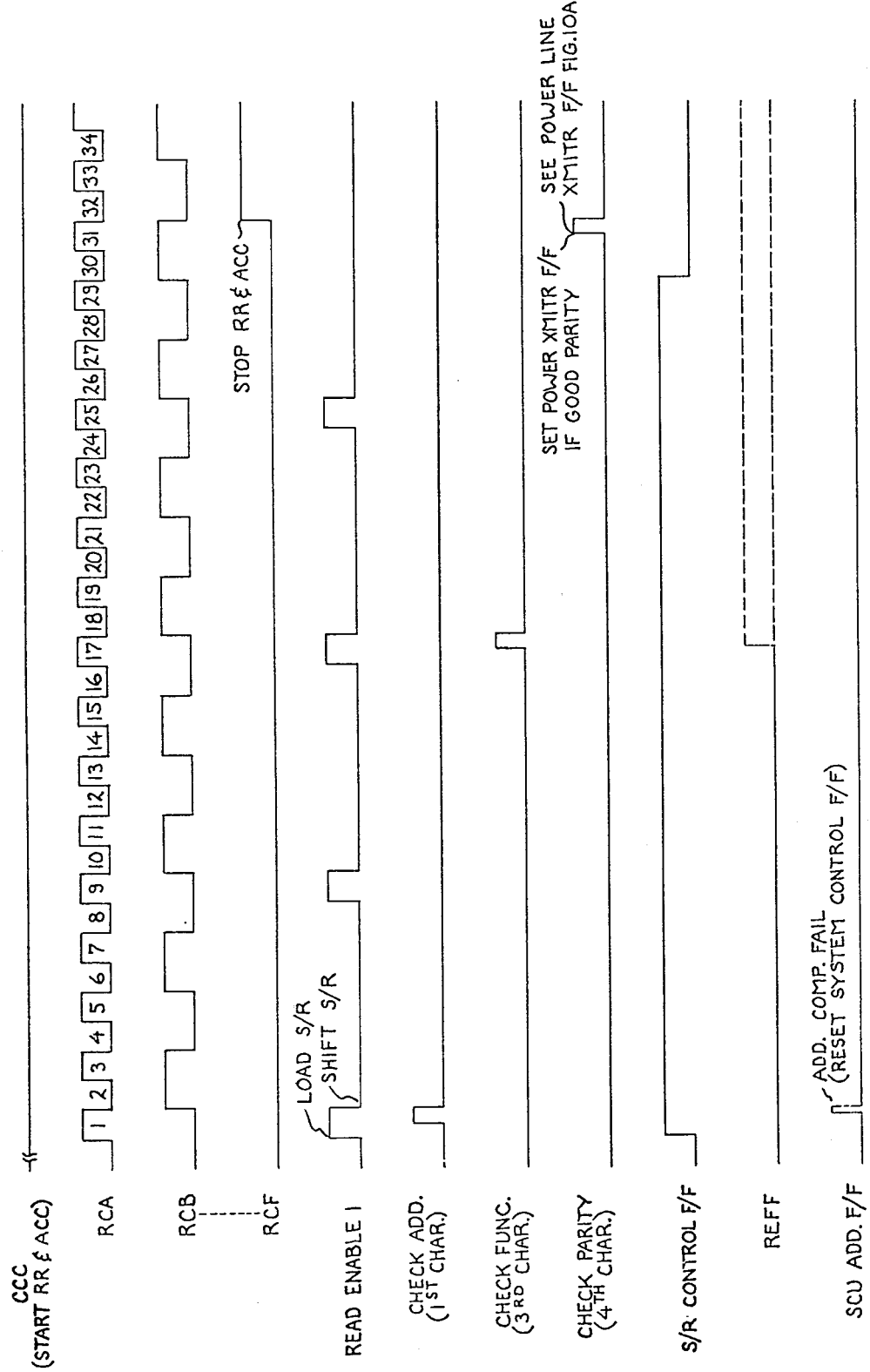

Reference is now made to a register read-out/address check counter 74 of FIG. 13C receiving the CCC signal from the character counter 52. The CCC signal is a binary 0 until the character counter has counted to its maximum (count of 4). When the CCC signal is a binary 0, it provides an inhibit/reset input signal to an R terminal of counter 74 preventing the counter from counting and keeping it in the binary 0 or reset state. As shown in FIGS. 9A and 9B, when the CCC signal goes to a binary 1, the inhibit/reset signal is removed, enabling the register 74 to begin counting at a 48 kHz rate as shown by a start RR and ACC line in FIG. 9B. FIG. 9B is actually a continuation of FIG. 9A, but it is based on a different time frame with all timing derived at a basic 48 kHz rate.

The purpose of the register read-out/address check counter 74 is to generate coded count output signals to control the operational timing of the SCU during checking of the message received from the RCC.

It will be noted that register 74 generates six output signals designated RCA through RCF on a plurality of conductors 76. The final stage of register 74, designated RCF, is applied as one input to an AND gate 78 as $\overline{RCF}$. The other input to AND gate 78 is the 48 kHz clock signal as shown in FIG. 13C. Since register 74 is reset at this time, the $\overline{RCF}$ signal is a binary 1, thus enabling AND gate 78 to allow the 48 kHz clock to be applied as a register count signal RCNT to a trigger (T) input terminal of register 74. The relationships between the RCA through RCF signals are shown in FIG. 9B. Since register 74 is a straight-forward binary counter, only signals RCA, RCB and RCF are shown, it being understood that the operation of such type counters is well understood by those of ordinary skill in the art.

A decode network comprised of two sets of AND gates 80 and 82 in FIG. 13C receives the RCA–RCF output signals from register 74 to generate the proper control signals for controlling the operation of the SCU. Reference is first made to an AND gate 84 of the group of AND gates 80 receiving input signals RCA, $\overline{RCB}$ and $\overline{RCC}$. As shown in the timing diagram of FIG. 9B, a binary 1 read enable 1 signal is generated on conductor 86 from AND gate 84 in response to the just described input logic conditions. The read enable 1 signal is applied via conductors 86, 88 and on OR gate 90 as a read enable signal to the receive data memory register 60. The read enable signal is also applied as a shift/load signal to a parallel in-serial out-register 92 via a conductor 94 to enable that register to receive a parallel character from memory register 60.

The read enable signal now enables the receive data memory register 60 to transfer the first message character, in parallel, via its output data lines 96 through a conventional multiplexer circuit 98 into the parallel in-serial out-register 92. Addressing of the receive data memory register is controlled by two input signals RSA and RSB on conductors 100 from two OR gates 102 and 104. The OR gates 102 and 104 receive respective input signals RSA1 and RSB1 via conductors 106 and 108 from the output of register 74. These two signals are actually the RCD and RCE outputs of register 74. As can be seen in the timing diagram of FIG. 9B, during the transfer of the first character from memory register 60 into registry 92, the RCD(RSA1) and RCE (RSB1) signals are binary 0's. These two binary 0 signals effect the generation of binary 0, RSA and RSB signals to cause the read-out of the least significant character of the message from the receive data memory register by referring to FIG. 2, it can be seen that this first character is the SCU address character.

The SCU address character, which is now present in the parallel in-serial out-register 92, is the first character to be checked. This character is checked as follows: Reference is now made back to FIG. 13C to the group of AND gates 82, wherein one of those AND gates 110 is receiving the read enable signal and an output signal on conductor 112 from another AND gate 114, the latter receiving the 48 Khz clock and the two input signals $\overline{RCD}$ and $\overline{RCE}$ from the register read-out address counter 74. Since these latter two signals are now binary 1's, AND gate 114 is enabled to allow the 48 kHz clock to be applied to AND gate 110 generating a check address (first character) output signal on a conductor 116. The generation of this latter signal is shown in FIG. 9B in coincidence with the read enable signal applied to the memory register 60 and register 92.

The check address (first character) signal on conductor 116 is applied to two gate logic structures labeled, this SCU address compare gates 118 and all SCU address compare gates 120 of FIG. 13E. As previously mentioned, each SCU is capable of recognizing its own distinct address as well as an address which is common to all SCU's in the entire system. The comparison of the address in these two gate structures is effected by the parallel input address bits being applied thereto from the receive data memory register via a data bus 122.

The comparison of the distinct SCU address in gate structure 118 is effected by a comparison of the SCU address now applied from the receive data memory register with a plurality of binary signals TSCUA (this SCU address) on conductors 124 from a box 126 designated this SCU fixed address. Box 126 may be hard-wired or switch selectable to apply the appropriate binary input signals (TSCUA) to the compare gate structure 118. The contents of box 126 is preferably switch settable so that each SCU can easily be assigned its own address. If the address from the receive data memory register does not match the TSCUA addressing signals, a fail 1 signal is generated on conductor 128 and applied via an OR gate 130 of FIG. 13D to the set(s) input terminal of an SCU address flip-flop 132.

The ALL SCU address compare gate structure 120 contains its own hardwired address for comparison with that address coming from the receive data memory register. The logic in box 120 is designed to recognize an address common to all SCU's in the system. If the ALL SCU address compare does not check with the message address, compare gates 120 will also generate a fail 2 signal on conductor 134. This latter fail signal is also applied to the SCU address flip-flop 132 via OR gate 130.

Setting of the SCU address flip-flop 132 generates a binary 1 output signal designated address compare fail on a conductor 136, which is applied to the system control flip-flop 28 via OR gate 30 to reset the SCU. Thus, it can be seen, upon examination of the very first character of a message, if the address does not match the ALL SCU address or the address of the specific SCU, the system will revert immediately to the reset or standby mode. The timing for setting and resetting the SCU address flip-flop 132 is shown in FIG. 9B.

Let it now be assumed that the address check is valid. Under this condition, as can be seen in FIG. 9B, the read enable 1 signal is again generated (the second read enable 1 signal) to again enable the receive data memory register to gate the data in parallel through multiplexer 98 into the parallel in-serial out-register 92. The second data character is the MTU address (see FIG. 2), which is gated from the second character position of the receive data memory register under control of the RSA and RSB signals as previously described. At this time the RCD signal is a binary 1 and the RCE signal is binary 0. Thus, the RSA1 signal is in binary 1 and the RSB1 signal is a binary 0. It is the decode of these two signal states which selects the second character position out of the receive data memory register 60. This data character is loaded into the parallel in-serial out-register. However, as shown in FIG. 9B, the MTU address is not checked.

After the MTU address is loaded into the parallel in-serial out-register, the next character to be read into that register from the receive data memory register is the third message character, the SCU/MTU function code (see FIG. 2). As shown in FIG. 9B, the third read enable 1 signal is now applied to the receive data memory register in conjunction with the RSA and RSB signals on conductor 100. At this time the RSA1 signal is a binary 0 and the RSB1 signal is a binary 1 (RCD is a binary 0 and RCE is a binary 1). Thus, the third data character is selected out of the receive data memory register and transferred via the multiplexer 98 into the parallel in-serial out-register. At this time, the function code is to be checked to see if the message from the RCC is of that type which dictates a response from an MTU(s). This is accomplished by the generation of a check function (third character) signal on a conductor 138 from an AND gate 140 of the group of AND gates 82 for application to an MTU response function compare gate structure 142 (see FIG. 13C).

Referring to AND gate 140 and to FIG. 9B, the check function signal is generated as a result of the decode of the binary 1 $\overline{RCD}$ and RCE signals along with the 48 kHz clock applied to AND gate 142, the output of which is applied as one input to AND gate 140 along with the read enable 1 signal on conductor 86. The generation of the check function signal effects a comparison of a hardwired coding in the MTU response function compare gates 142 with the coding of the third character now applied in parallel to that gating structure from the receive data memory register 60. If there is no comparison between the SCU/MTU function code and the wired function code, a normally binary 0 signal on a conductor 144 applied to a set(s) input terminal of a response expected flip-flop 146 remains at binary 0, thus leaving that flip-flop in the reset state.

With the response expected flip-flop 146 in the reset state, its one (1) output terminal is a binary 0 signal REFF on a conductor 148, which is applied to an inverter 150. The output of the inverter 150 is a binary 1 signal $\overline{REFF}$, applied as one input to an AND gate 152. If no response is expected, AND gate 152 will be enabled at a later time by a signal designated PL34 to apply a reset (no response expected) signal to the system control flip-flop via a conductor 154 and OR gate 30. The generation of the PL34 signal will subsequently be described.

Let it now be assumed, however, that the function code of the command specifies that a response is expected from a meter terminal unit(s). In this case, the response expected signal on conductor 144 will go to a binary 1 causing the response expected flip-flop 146 to set. Flip-flop 146 now generates a binary 1 REFF signal on conductor 148. The REFF signal is applied via conductor 148 and 156 as one input to an AND gate 158 of FIG. 13B. The other input signal to AND gate 158 is the PL34 signal to subsequently be described. As can be seen (FIG. 13B), when the PL34 signal is generated, a power line receiver flip-flop PLRFF 160 will be set generating a binary 1 output signal designated PLRF to turn on all of the SCU power line receivers. The operation of the PLRFF flip-flop will be described in more detail later.

It should also be noted at this time that the REFF binary 1 signal is also applied via a conductor 161 to a transmitter modulator 162 of the modem to turn on the carrier signal for the transmission of a data message to subsequently be received from the addressed MTU or MTU's. It should also be noted that when the REFF signal is a binary 0, the transmitter modulator carrier signal is turned off or diabled. This would be the situation when the response expected flip-flop 146 is reset.

Reference is now made back to FIG. 9B. After the SCU/MTU function code has been checked and the response expected flip-flop either set or left in the reset state, the fourth read enable 1 signal is generated to effect the transfer of the 4th character from the receive data memory register 60 into the parallel in-serial out-data-register 92. As can be seen in FIG. 2, this 4th character is the parity character. At this time the selection of that 4th character from the receive data memory register is effected by the two binary 1 states of the RSA and RSB signals (RCD and RCE, both binary 1's). It will be noted, however, that parity is not checked concurrently with the presence of the read enable 1 signal, as in the case of the first and third characters of the message. A check parity (4th character) signal is applied via a conductor 164 to a parity check generate circuit 166 from the output of an AND gate 168. The generation of the check parity signal is the result of the ANDING in an AND gate 170 of the RCA, RCB, RCC and the ANDING in an AND gate 172 of the RCD, RCE and 48 kHz clock signals. The output of AND gates 170 and 172 enable AND gate 168 to generate the check parity signal on conductor 164. The operation of the SCU under a parity check fail condition will be described later in more detail.

In order to further understand the operation of the SCU, it is now necessary to refer to a shift register control flip-flop 174 as shown in FIG. 13C. Referring now to FIGS. 13C and 9B, it is shown that the shift register control flip-flop 174 is set via a conductor 175 from AND gate 176 enabled by the binary 1 signals $\overline{RCD}$, $\overline{RCE}$ and read enable 1. Flip-flop 174, now generating a binary 1 output signal on conductor 178 from its 1 output terminal, enables an AND gate 180 also receiving the 48 kHz clock signal. The output of AND gate 180 is a gated 48 kHz signal designated G48KHZ on a conductor 182. The G48KHZ signal is applied to an OR gate 184 of FIG. 13A. The output of OR gate 184 is applied as a clock data signal on conductor 186 to a trigger (T) input of the parallel in-serial out-register 92. The purpose of the clock data signal is to control the parallel loading and serialized shifting of the parallel in-serial out-register.

Reference is now made to FIGS. 9A, 9B and 13A. As previously described, the read enable signal on conductor 88 is also applied as a shift/load signal on conductor 94 to one input of the parallel in-serial out-register. As shown in FIG. 9B, when the read enable signal (also shift/load signal) is a binary 0, the shift register 92 is enabled to be serially shifted. On the other hand, when the read enable (shift/load) signal is a binary 1, the parallel in-serial out-register 92 is enabled to be parallel loaded from the receive data memory register 60. The actual parallel clocking of data into the parallel in-serial out-register from the receive data memory register is performed with the G48KHZ clock data signal via gates 180 and 184. It will be noted that the G48KHZ signal falls in the middle of the read enable 1 pulse. The set/reset timing of the shift register control flip-flop 174 is shown in FIG. 9B and how that flip-flop controls the application of the G48KHZ signal to the trigger input of the parallel in-serial out-register 92.

When data is serially shifted out of register 92, that data is shifted in response to the G48KHZ pulses on conductor 186 starting at the time immediately following the return of the shift/load signal from a binary 1 to a binary 0 as shown in FIG. 9B. As can be seen, the spacing between the read enable 1 signal allows 7 G48KHZ clock signals to be applied to the parallel in-serial out-register each time a character is shifted out of that register. In other words, for each read enable signal generated, the eight bits in each character residing in register 92 are shifted out in a serial data stream via a conductor 188 and fed to one input of the parity check/generate circuit 166. It is to be noted that this serialized shifting of data out of the parallel in-serial out-register is taking place substantially simultaneously with the parallel checking of the SCU address and the MTU response function code. The obvious reason for the serialized shifting of the data into the parity check generate circuit 166 is so that that circuit can check a binary 0, now removes an inhibit clear input from a power line control counter 206 of FIG. 13B. With the PLXF binary 1 signal now present at the input of the power line control counter, the latter is enabled to now begin counting at a 30 Hz rate as shown in FIGS. 10A and 10B.

The power line control counter is a six-stage conventional binary counter generating binary count output signals PLC1–PLC32 on a plurality of conductors 208. Certain ones of the PLC1–PLC32 output signals are applied directly to a control counter decode 210 and other ones of those output signals are applied to three AND gates 212, 214, and 216 via conductors 218, 220 and 222, respectively. The logic structure of the control counter decode 210 is defined in the following Table 3, which is a listing of Boolean equations defining that structure.

TABLE 3
SCU POWER LINE CONTROL COUNTER DECODE EQUATIONS $$\text{SRTSF} = \text{PLC1} \cdot \overline{\text{PLC2}} \cdot \overline{\text{PLC4}} \cdot \overline{\text{PLC8}} \cdot \overline{\text{PLC16}} \cdot \overline{\text{PLC32}}$$

$$\text{DCD} = \overline{\text{PLC4}} \cdot \overline{\text{PLC8}} \cdot \overline{\text{PLC16}} \cdot \overline{\text{PLC32}}$$

$$\text{3RD SYNC BIT} = \text{PLC1} \cdot \text{PLC2} \cdot \overline{\text{PLC4}} \cdot \overline{\text{PLC8}} \cdot \overline{\text{PLC16}} \cdot \overline{\text{PLC32}}$$

$$\text{RCHR} = [\text{PLC1} \cdot \text{PLC2}(\overline{\text{PLC4}} \cdot \text{PLC8} \cdot \overline{\text{PLC16}} \cdot \overline{\text{PLC32}}) + (\overline{\text{PLC4}} \cdot \overline{\text{PLC8}} \cdot \text{PLC16} \cdot \overline{\text{PLC32}})]$$

$$\text{PL34} = \overline{\text{PLC1}} \cdot \text{PLC2} \cdot \overline{\text{PLC4}} \cdot \overline{\text{PLC8}} \cdot \overline{\text{PLC16}} \cdot \text{PLC32}$$

$$\text{PL27} = \text{PLC1} \cdot \text{PLC2} \cdot \overline{\text{PLC4}} \cdot \text{PLC8} \cdot \text{PLC16} \cdot \overline{\text{PLC32}}$$

parity of the entire message coming from the RCC. This type of checking in conjunction with the decoding of the message saves time causing the SCU to expedite overall operations.

After the entire message has been checked, the shift register control flip-flop is reset from an AND gate 190. That AND gate is enabled as a result of the ANDING of signals RCE and RCD with the output of AND gate 170 receiving the RCA, RCB and RCC signals.

Reference is now made back to the parity check generate circuit 166 wherein that circuit, in response to the check parity signal on conductor 164, will generate a parity check fail signal which goes from a binary 0 to a binary 1 if parity of the message is invalid. If the parity check does fail, the parity check fail signal on conductor 192 will go to a binary 1 resetting the system control flip-flop via OR gate 30, thus immediately placing the SCU back in the standby mode.

Let it now be assumed that the message parity check is valid. In this case, the parity check fail signal on conductor 192 remains at a binary 0. This signal is applied to an inverter 194 of FIG. 13D via conductors 192 and 196, where it is inverted to a binary 1. The output of inverter 194 is applied as one input to an AND gate 198 along with the now present check parity signal on a conductor 200 to enable that gate. Since parity is valid, it is now proper to transfer the message from the SCU to the MTU(s) via the SCU's power line. This is accomplished by the enablement of AND gate 194, which applies a binary 1 set signal to the S input terminal of a power line transmitter flip-flop 202. As noted in FIG. 9B, the fourth character (parity check) signal is utilized to set the power line transmitter flip-flop.

With the power line transmitter flip-flop now set, its one output terminal generates a binary 1 PLXF output signal on a conductor 204. The PLXF signal, previously a binary 0, now removes an inhibit clear input from a power line control counter 206 of FIG. 13B. With the PLXF binary 1 signal now present at the input of the power line control counter, the latter is enabled to now begin counting at a 30 Hz rate as shown in FIGS. 10A and 10B.

As previously described, before the binary 1 PLXF signal is applied to the power line control counter 206, that counter is held in the reset state. Thus, prior to the occurrence of the first 30 Hz signal to counter 206, a $\overline{\text{PLC1}}$ binary 1 signal is applied via conductor 218 to AND gate 212 in conjunction with the 30 Hz signal. These two signals now enable AND gate 212, which in turn enables an AND gate 224 now receiving a binary 1 SCU RESET signal from the system control flip-flop 28 of FIG. 13A. The output of AND gate 224 applies a binary 1 reset signal via conductors 226 and 228 to two flip-flops SAXFF 230 and GRFF 232, respectively.

Reference is now made to AND gates 214 and 216 of FIG. 13D. A second input to each of these AND gates is the now binary 1 PLXF signal on a conductor 234 from the power line transmitter flip-flop 202. Since that flip-flop is set at this time, these two AND gates are in a condition to be enabled when their respective input signals PLC8 and PLC16 from the power line control counter become binary 1's. It will be noted that the outputs of the two AND gates 214 and 216, designated as RSB2 and RSA2 on conductors 236 and 238, are applied to the two OR gates 102 and 104 of FIG. 13C.

The RSA2 and RSB2 signals are utilized to enable OR gates 102 and 104 in the same fashion as previously described for the RSA1 and RSB1 signals. These two signals (RSA2 and RSB2) will generate the proper logic levels for signals RSA and RSB on conductors 100 to the receive data memory register to effect the proper retrieval of message characters from that memory during the transmit sequence of the message. It will be noted at this time that the two signals PLC8 and PLC16, applied to AND gates 214 and 216, are now binary 0's; thus, the RSA and RSB signals applied to the receive data memory register are likewise binary 0's.

Reference is now made back to the control counter decode 210 (FIG. 13B) now providing a plurality of output signals which are generated at the proper times to effect the serial transmission of the message from the section control unit (SCU) to the power lines and on to the meter terminal unit(s). In describing the operation of the transmit sequence of the SCU now under discussion, reference will be made to FIGS. 10A–10D and 13A–13F and to the previously mentioned Table 3. As previously described, at the beginning of a transmit sequence, the power line transmitter flip-flop 202 is set, enabling the power line counter 206 to count. As shown in Table 3, the first signal to be generated by the counter decode 210 is an SRTSF (set ready to send flip-flop) signal on a conductor 240. The SRTSF binary 1 signal sets an RTSFF flip-flop 242 causing its 1-output terminal to generate a binary 1 RTSF signal on conductor 244 at the time shown in FIG. 10C. The RTSF signal is applied to an AND gate 246 on a conductor 248. A binary 0 signal $\overline{DCD}$ (data control delay) on a conductor 250 from an inverter 251 is keeping gate 246 disabled at this time because of the binary 1 DCD signal from decode 210 (see Table 3). The purpose of the $\overline{DCD}$ signal will subsequently be described. The RTSF signal is also applied as one input to a transmit AND gate 252 of FIG. 13F. One other input to this latter AND gate is the output frequency $f_0$ of a crystal oscillator 253 in the SCU. It is this oscillator which generates the high frequency pulse bursts of the message bits transmitted onto the power line from the SCU.

Reference is now made back to the RTSFF flip-flop 242 of FIG. 13D. The zero (0) output terminal of that flip-flop is now a binary 0 applying a signal $\overline{RTSF}$ to an OR gate 254 via a conductor 245. OR gate 254 is disabled at this time removing a reset input signal from the R terminal of a flip-flop FFDF 258. The binary 0 $\overline{RTSF}$ signal on a conductor 260 also removes a reset signal from the R terminal of a flip-flop FFEF 262. These latter two flip-flops are now in a condition to be set at the proper time.

Figure 10C:
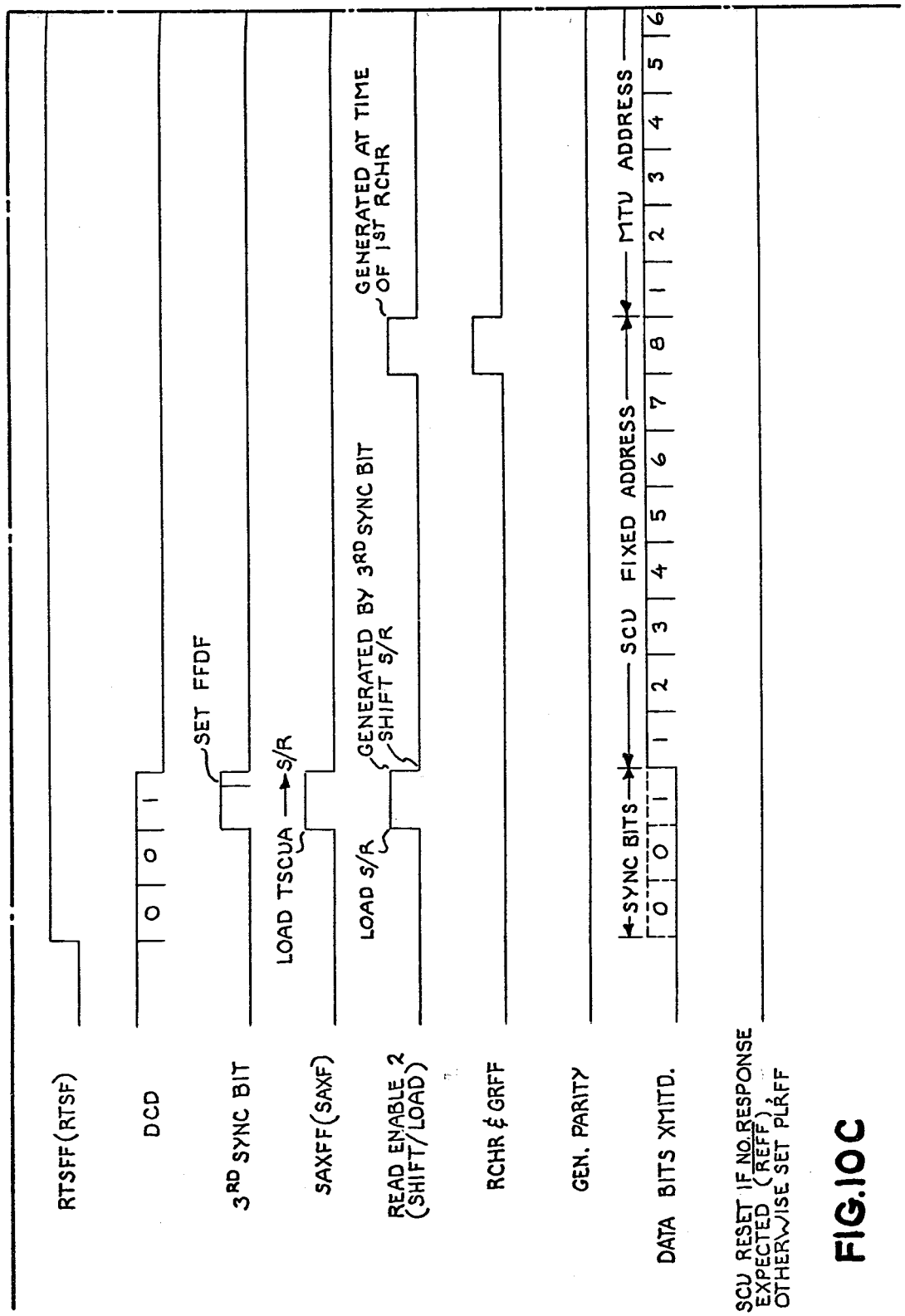
Figure 13F:
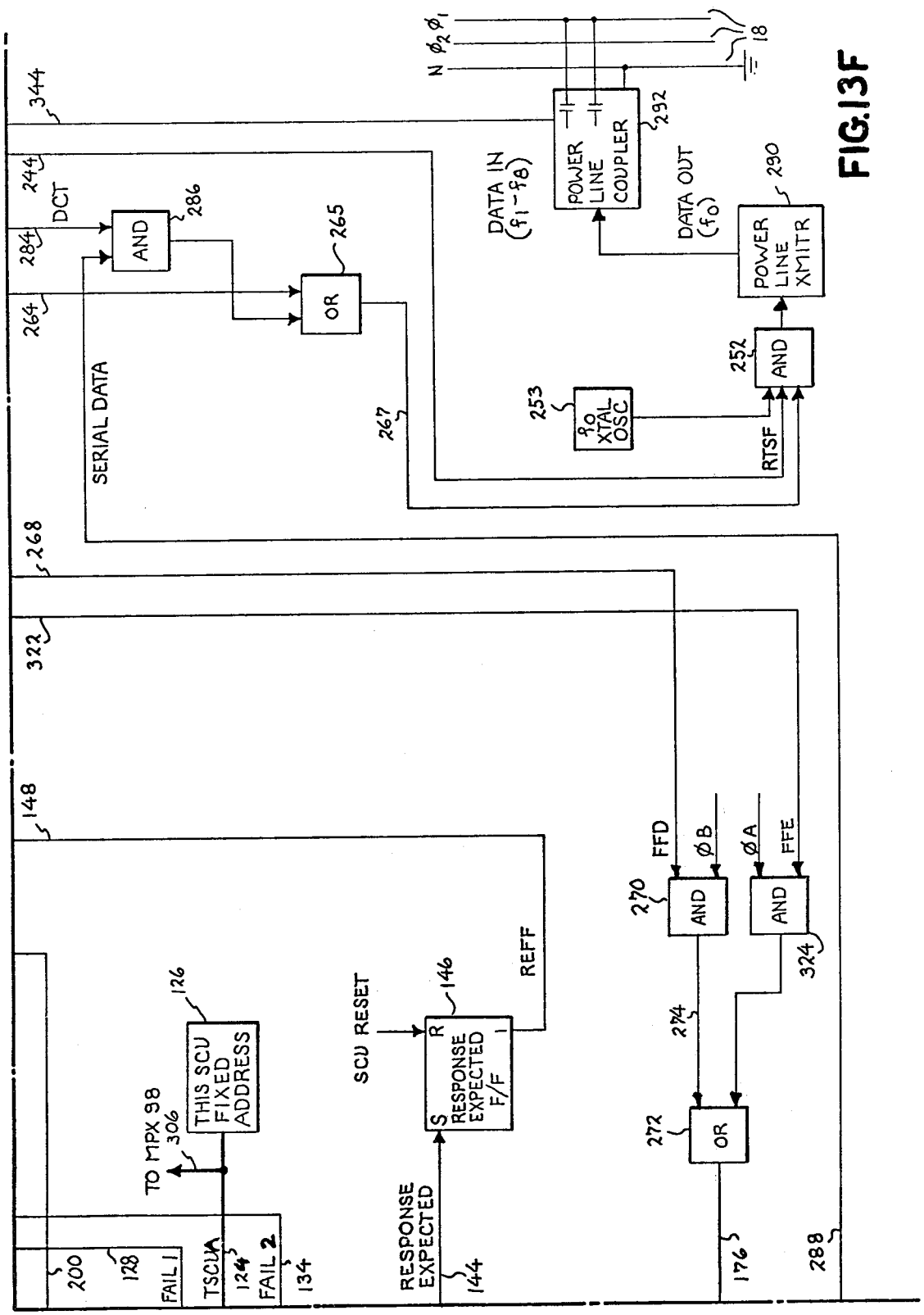

The next output signal to be generated by the control counter decode 210 of FIG. 13B is a 3rd sync bit binary 1 signal on a conductor 264. The equations for the generation of this signal are shown in Table 3 and the timing for the generation of that signal is shown in FIG. 10C. As can be seen, the 3rd sync bit signal has a pulse width of one bit time and is generated at the count of three by counter 206. The generation of the 3rd sync bit signal at this time effects the generation of the 001 sync bits which are appended to the front of the message going to the MTU as shown in FIG. 10C on the data bits XMITD. line. The binary 1 in the 001 sync bits is transferred to the power line by the 3rd sync bit signal enabling an OR gate 265 (FIG. 13F). The 3rd sync bit is passed through OR gate 265 to AND gate 252 via a conductor 267.

Referring to FIG. 13D, the 3rd sync bit signal is also applied to an AND gate 266 in conjunction with a $\phi D$ signal from the clock generator 36 of FIG. 13E, enabling that AND gate to set FFDF 258. Setting FFDF performs two functions. Its one (1) output terminal now applies a binary 1 signal FFD via conductor 268 to an AND gate 270 of FIG. 13F. AND gate 270 is also receiving a $\phi B$ signal to now allow the generation of parity clock signals for application to the parity check generate circuit 166 through an OR gate 272 via conductors 274 and 276. The binary 1 FFD signal from FFDF 258 is also applied via conductor 278 as one input to an AND gate 280 of FIG. 13A in conjunction with a $\phi A$ signal. This latter AND gate is now enabled to generate a gated 30 Hz signal (G30HZ of 24 pulses) on a conductor 282. As shown in FIGS. 10D and 13D, the FFDF flip-flop which controls the G30HZ signal will be reset after a period of 24 counts by a PL27 signal thus covering a period of 24 bits to be shifted onto the power line from the SCU. The G30HZ signal will be applied via OR gate 184 to the T input terminal of register 92 to control the shifting of data through that register for this 24-bit period.

Reference is now made back to the control counter decode of FIG. 13B and to Table 3. The $\overline{DCD}$ signal will enable AND gate 246 (still receiving the RTSF signal) when the power line control counter 206 achieves a binary count of 4 (the end of the three sync bits). The output of AND gate 246 is a binary 1 DCT signal on a conductor 284 applied to an AND gate 286 in conjunction with serial data coming from the parity check generate circuit on a conductor 288 (FIGS. 13E, 13F and 13D). It should be noted that AND gates 246 and 286 are not enabled until the 4th bit of the message is to be transmitted onto the power line. Simultaneously, the 3rd sync bit signal goes to a binary 0. Referring to FIG. 10C, to the line designated data bits XMITD., it can be seen that the 3rd sync bit is transmitted just prior to the first eight message data bits designated SCU fixed address. AND gate 286 is now enabled to allow the 24-bit message of serial data to be transferred through that AND gate out to the power line 18 via OR gate 265, AND gate 252, a power line transmitter 290 and a power line coupler 292.

Reference is again made back to the control counter decode 210 of FIG. 13B to the 3rd sync bit signal line. This signal is also applied via a conductor 294 to an AND gate 296 also receiving the 30 Hz signal. As shown in FIGS. 10C and 13B, AND gate 296 is enabled with the 3rd sync bit signal to set a flip-flop SAXFF 230. The SAXFF flip-flop now generates a binary 1 signal SAXF on a conductor 298, which is applied to an OR gate 300 to generate a read enable 2 (shift/load) signal on a conductor 302 at the time shown in FIG. 10C. In FIG. 13A, the read enable 2 signal is applied via OR gate 90 to the registers 60 and 92 on conductors 88 and 94, respectively. The first read enable 2 signal is generated at the time shown in FIGS. 10C and 13B by the application of the 3rd sync bit signal to the SAXF flip-flop via AND gate 296.

It will also be noted that the SAXFF flip-flop is reset one 30 Hz clock after it is set. This is due to the $\overline{PLC1}$ signal going to a binary 1 at a count of 4, thus enabling AND gates 212 and 224 to apply a reset signal to the SAXF flip-flop 230 via conductor 226. This resetting is illustrated in FIG. 10C. The generation of the read enable 2 signal via OR gates 90 and 300 effects the reading of the first message data character to be transmitted into the parallel in-serial out-register 92. This character is the SCU fixed address on conductors 306 labeled TSCUA. It will be noted in FIG. 13A that the multiplexer 98 receives the SAXF signal from the SAXF flip-flop on a conductor 304. The multiplexer 98, which is basically a two-way switch, normally channels data from the received data memory register into the parallel in-serial out-register 92 when the SAXF signal is a binary 0. As previously mentioned, however, the SCU does not pass on the address which it receives from the RCC, but rather it regenerates its own fixed address for transmission to the MTU(s). This is accomplished by the SAXF signal. With the SAXF signal now a binary 1, the multiplexer 98 directs the TSCUA signals (SCU fixed address) via conductors 306 through the multiplexer into the input of the parallel in-serial out-register. The TSCUA signals are clocked into register 92 in response to the shift/load and clock data signals on conductors 94 and 186, respectively. As shown in FIG. 10C, when the shift/load signal goes to a binary 1, the TSCUA is parallel loaded through the multiplexer into the parallel in-serial out-register. The SCU fixed address is now shifted out of register 92 as the first eight bits of the message on conductor 188 and applied to the parity check generate circuit 166. These bits of the first character are fed into the parity generate circuit where that circuit monitors these bits and all subsequent bits of the message in order to generate the proper parity in the last character of the message. The first character (SCU fixed address) is shifted out of the parity check generator circuit as serial data on conductor 288, and applied to the power lines 18 via AND gate 286, OR gate 265, AND gate 252, power line transmitter 290 and the power line coupler 292.

As shown in FIG. 10C, as soon as the SCU fixed address has been shifted out of register 92, the second read enable 2 (shift/load) signal is generated and applied to registers 60 and 92 via conductors 88 and 94 to load and shift the MTU address to the power line. A third enable 2 (shift/load) signal is also generated to load and shift the MTU function code onto the power lines. The generation of these two read enable 2 (shift/load) signals is described by reference now back to the control counter decode 210 of FIG. 13B. The signal which controls the generation of these two read enable 2 signals is a read character signal RCHR coming out of the control counter decode on conductor 308. By observation of Table 3 and of the timing diagram of FIGS. 10A–10D, it can be seen that the RCHR signal is generated at binary counts of 11 and 19. In reality, the count of 11 is actually representative of a count of 8 message bits and the count of 19 is representative of 16 message bits. This is due to the necessity of having to count the three sync bits previously appended to the front of the message. The first RCHR signal is applied to an AND gate 310 in conjunction with the 30 Hz signal. The RCHR and 30 Hz signals now enable AND gate 310 to apply a binary 1 set signal to the S input terminal of the GRFF flip-flop 232. The GRFF flip-flop 1-output terminal now goes to a binary 1 on conductor 316 to enable OR gate 300 to generate the second read enable 2 signal for application to registers 60 and 92. As shown in FIG. 10C, the generation of the second read enable 2 signal allows the second character (8-bit MTU address) to be transferred in parallel from the receive data memory register via the multiplexer into the parallel in-serial out-register.

It should be mentioned at this time that the SAXFF flip-flop is in the reset state; thus, the SAXF signal is a binary 0 allowing the message data to now be transferred through the multiplexer 98 from the receive data memory register into the parallel in-serial out-register. Since the FFDF flip-flop is still set, the G30 Hz clock pulses are still being applied to the parallel in-serial out-data-register via AND gate 280, OR gate 184 and conductors 282 and 186. Thus, the second character is shifted out of register 92 to the power line as previously described.

The addressing of the second character just loaded into register 92 from the memory register 60 is effected by the enabling of AND gate 216 with th PLC8 binary 1 signal on conductor 222 from the power line control counter. With the PLC8 signal at a binary 1, AND gate 216 generates a binary 1 RSA2 output signal, which now enables OR gate 104 to provide an RSA binary 1 signal to the receive data memory register. AND gate 214 is presently disabled, generating binary 0 RSB 2 output. Thus, OR gate 102 is disabled to make the RSB signal on conductors 100 a binary 0. This binary combination of the RSA and RSB signals addresses the second character location in memory register 60.

Counter 206 will now continue to count, and at a count of 19, the second RCHR signal is generated. The RCHR signal will again effect the setting of the GRFF flip-flop via AND gate 310 as previously described. This will again cause the generation of the read enable 2 signal to this time load the third character (function code) from the receive data memory register into the parallel in-serial out-register. As shown in FIGS. 10A, 10B, 10D and 13D, the addressing of this third character is effected by the PLC16 signal on conductor 220 from the power line control counter 206 now being a binary 1 and the PLC8 signal being a binary 0. These two signals cause the RSA and RSB signals to become binary 0 and 1, respectively, to effect the addressing of the third message character for transfer from the receive data memory register into the parallel in-serial out-register. This third data character is serially shifted out of register 92 on out to the power line as previously described.

After transmission of the first three characters (24 bits), the control counter decode now generates an output signal designated PL27 (PL27 minus 3 sync bits=24 bits). The equation for the generation of the PL27 signal is shown in Table 3 and is correspondent with the 24th bit of the message (see FIG. 10D). The PL27 signal is applied via conductor 318 to AND gate 320 in conjunction with a $\phi D$ signal to enable that AND gate at $\phi D$ time to set the FFEF flip-flop 262 and reset the FFDF flip-flop 258 via OR gate 254. Resetting the FFDF flip-flop now applies a binary 0 signal to AND gate 280 of FIG. 13A, thus disabling the G30 HZ signal being applied to the parallel in-serial outregister and preventing further shifting of that register. Additionally, when FFDF resets, the FFD signal on conductor 268 goes to a binary 0, disabling AND gate 270 of FIG. 13F preventing the $\phi B$ signals from being applied as parity clock signals to the parity check generate circuit 166. However, at this time, since FFEF is set, its binary 1 output terminal applies a binary 1 signal via conductor 322 to an AND gate 324 of FIG. 13F. The parity clock signals now continue to be generated as a result of the coincidence between the FFE and the $\phi A$ signals at AND gate 324. With each $\phi A$ signal, AND gate 324 applies a generate parity clock signal via OR gate 272 to the input of the parity check generate circuit. In this manner the necessary clock pulses will be generated to allow the parity check generate circuit to generate proper parity in accordance with that determined from the previously transmitted message bits. The parity check generate circuit as shown in FIG. 10D will now generate the six parity bits of the message and place them onto the paper lines 18 as previously described.

Reference is now made back to the control counter decode 210 of FIG. 13B for a description of the last operation preformed during the transmit sequence of a message from the SCU to the MTU(s). The signal to be generated by the control counter decode 210 is a PL34 binary 1 signal. The equations for the generation of this signal are shown in Table 3. The PL34 signal is applied via conductor 326 to an AND gate 152 also receiving the $\overline{\text{REFF}}$ signal from inverter 150. If the function code, as previously described, specified that no response is expected from the MTU(s), the $\overline{\text{REFF}}$ signal will be a binary 1 at this time. Thus, the PL34 signal will enable AND gate 152 to apply a binary 1 reset signal to the system control flip-flop via OR gate 30, placing the SCU back in the standby mode. The reset timing is shown in the last line of FIGS. 10C and 10D.

If, however, the function code indicated that a data message response is expected from the MTU(s) the $\overline{\text{REFF}}$ signal will be a binary 0, disabling AND gate 152 and the SCU will go into a wait mode for receipt of the data message. This wait mode is accomplished by the application of the PL34 signal via conductor 330 to the input of an AND gate 158 also receiving the binary 1 REFF signal. In this case, if a response is expected, AND gate 158 will be enabled to apply a binary 1 set signal to a power line receiver flip-flop PLRFF 160 at the time shown in FIG. 10D.

Figure 11A:
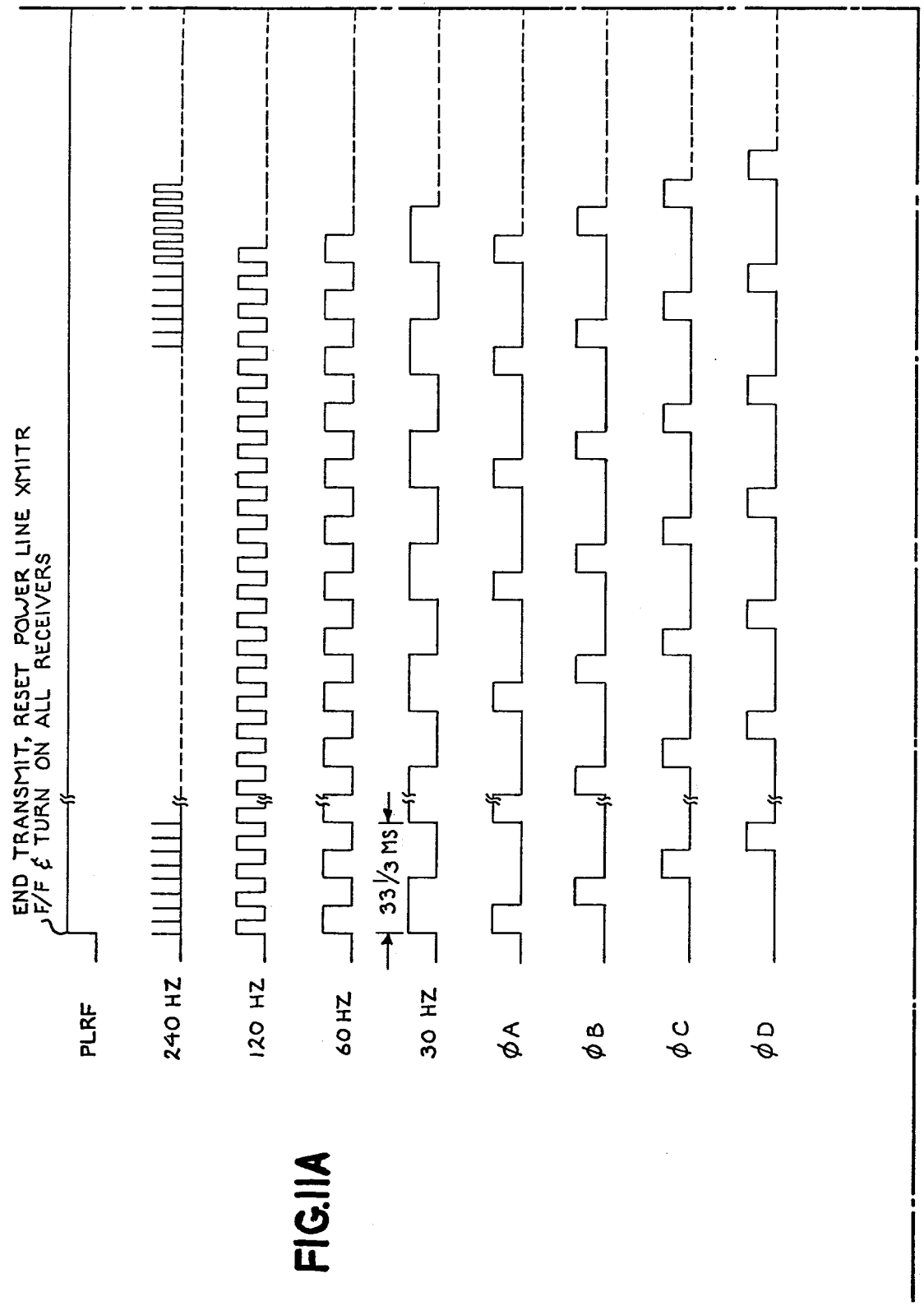

Reference is now made to FIGS. 11A–11H, which show the SCU timing for the receipt of a data message from one or more MTU's. With the PLRFF flip-flop now set as shown in FIG. 11A, a binary 1 PLRF output signal from its 1-output terminal is applied via conductors 332 and 336 to an OR gate 334, which applies a binary 1 reset signal to the power line transmitter flip-flop 202. The time of resetting this flip-flop is noted in FIG. 11A as the leading edge of the PLRF signal. When flip-flop 202 resets, its binary 1 output terminal goes to a binary 0 disabling AND gates 214 and 216 and replacing the inhibit/clear signal on the power line control counter. Counter 206 is now reset in preparation to receipt of the next message from the RCC. Resetting counter 206 causes the $\overline{\text{DCD}}$ signal on conductor 250 to go to a binary 0, thus preventing any further transmission of message data through AND gate 286 to the power line. This now frees the SCU to receive data messages via the power line coupler 292.

Referring now to FIG. 13B, the PLRF signal is also applied to a plurality of receivers 338 and to a common data path switch 340 in a power line receiver common logic block 342. The PLRF signal is essence simultaneously turns on all receivers 338 and enables switch 340 for receipt of data from the power lines 18 via the power line coupler 292, conductor 344, and conductor 346. After an MTU(s) had decoded the function code of its received message as a transmit data command, it will serially transmit the meter data onto the power lines for receipt by the SCU. The serialized meter data appears at switch 340 after passing through coupler 292 and is transferred therethrough at frequencies $f_1$ through $f_8$, with each frequency corresponding to a separately addressed MTU. The meter data on conductor 346 is applied in common to all of the receivers 338. Each receiver will accept only the meter data being received at its tuned frequency (one of $f_1$–$f_8$). The timing signals for controlling the transfer of data into the receivers and to the RCC are controlled by a plurality of clock signals $D_eA$, $D_eB$ and $D_eC$ generated by common logic 342 on conductors 348, 350 and 352, respectively. The common logic 342 also receives a strobe signal from each of the receivers 338 via conductors 354 and 356 when a receiver detects the receipt of a message of meter data. The meter data is transferred in parallel from each of the receivers via conductors 554 to the data transmitter receiver 40. The $D_eC$ signal clocks the meter data into the transmitter receiver, which transfers that data to the RCC via the transmitter 162.

SCU Receiver Operational Description

Figure 14C:
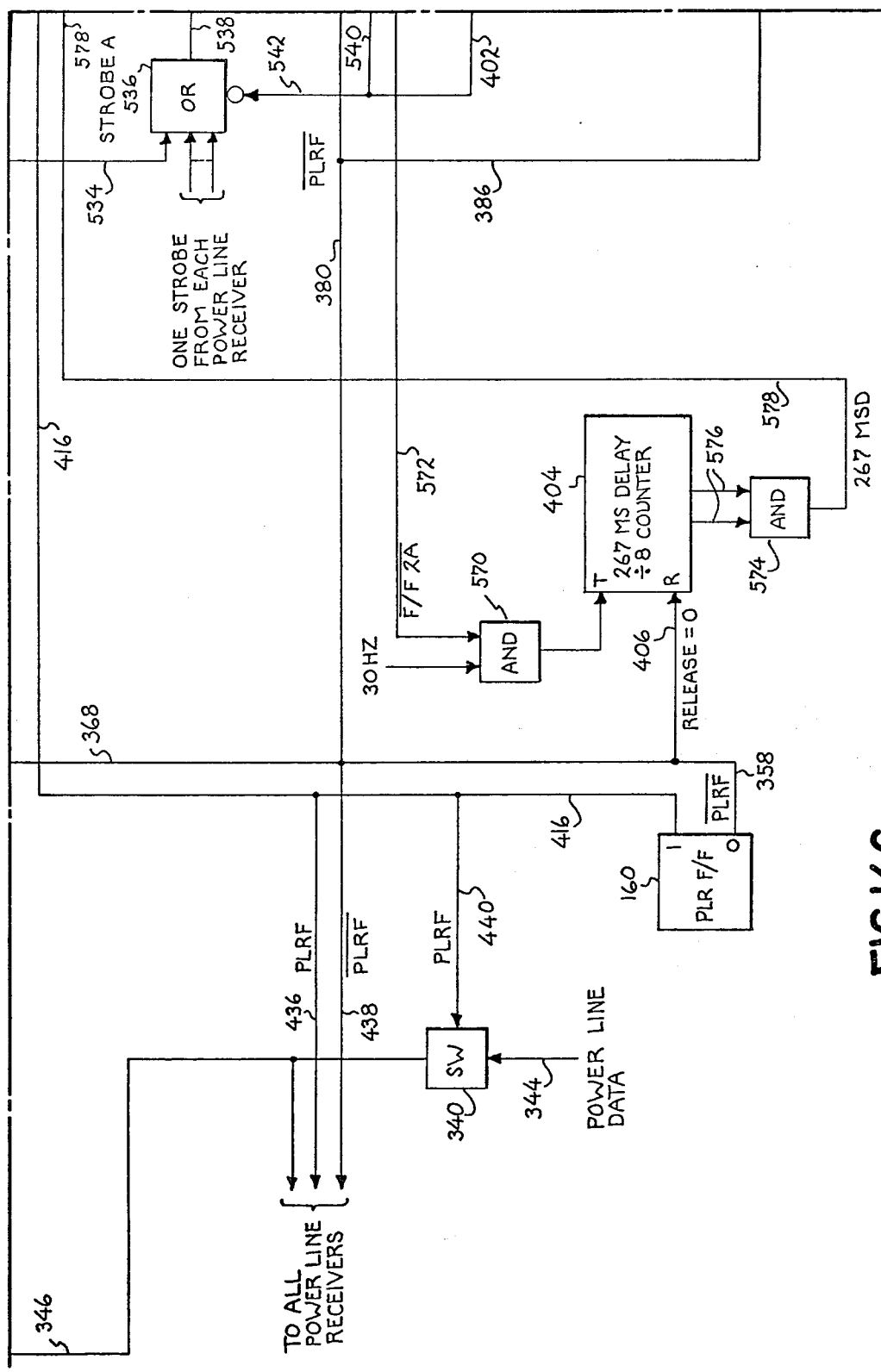
Figure 14D:
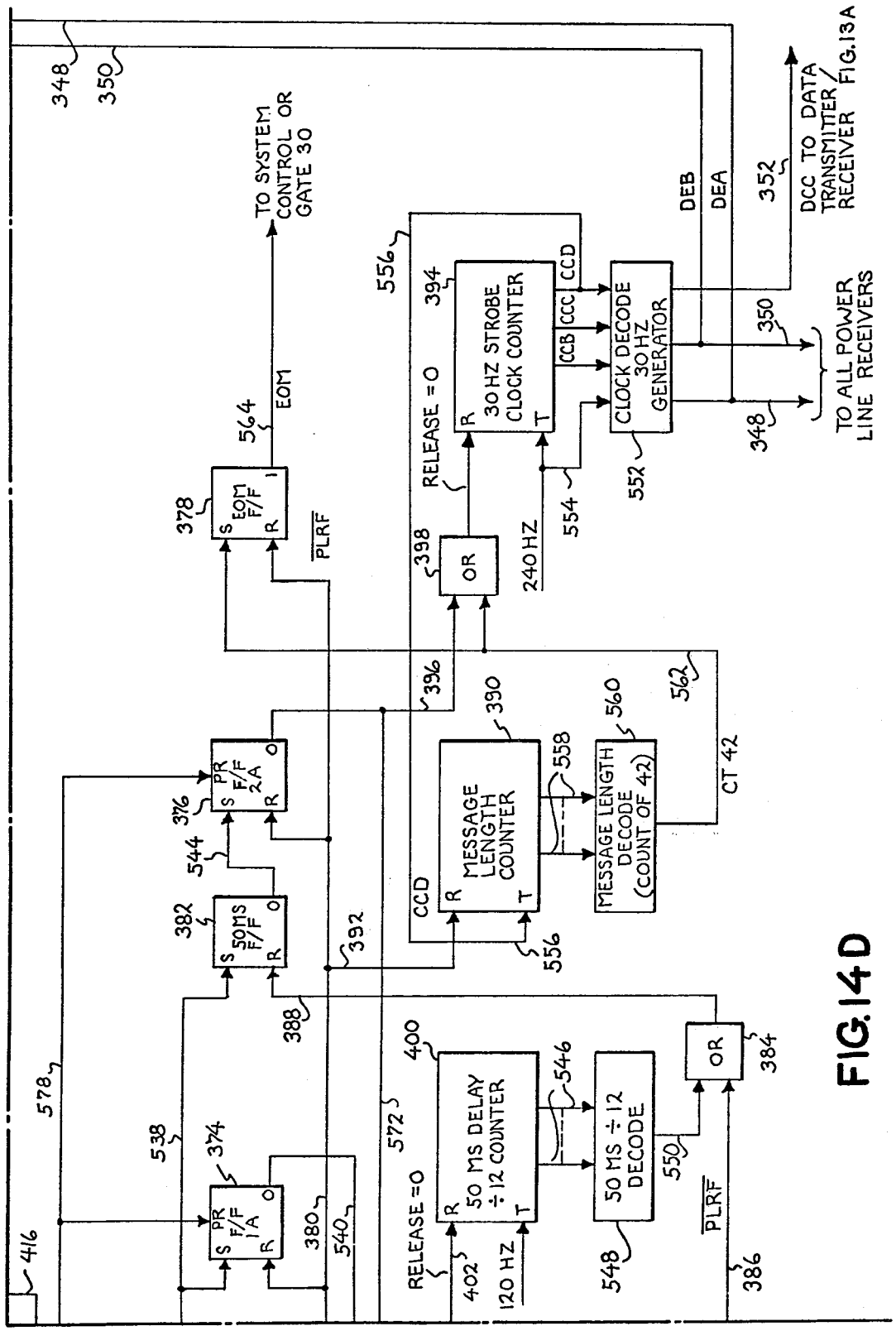

Reference is now made to FIG. 14, which is a legendary drawing showing the inter-relationships between FIGS. 14A through 14D. In order to follow the operational description of the receiver portion of the SCU, it is recommended that FIGS. 14A through 14D be organized as shown in accordance with FIG. 14. In a similar fashion, it is recommended that FIGS. 11A–11H be positioned in accordance with the legendary drawing of FIG. 11.

The previously mentioned power line receiver common logic 342 is illustrated in detailed block diagram form in FIGS. 14C and 14D. Each of the previously mentioned receivers 338 in FIG. 13B is similar with the exception of their ability to receive data messages from the MTU's at a specified frequency for a particular MTU. Since all of the receivers 338 are substantially the same, the operation of only one of these receivers will be described. The detail logic for a typical one of the receivers 338 is shown by FIGS. 14A and 14B.

Figure 11B:
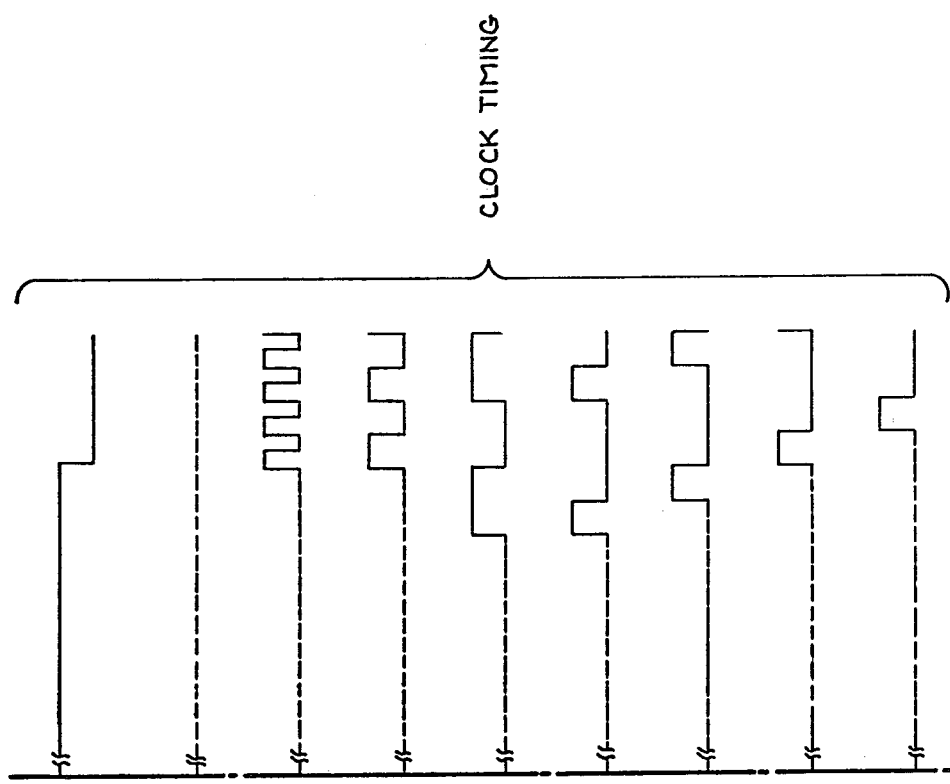
Figure 11C:
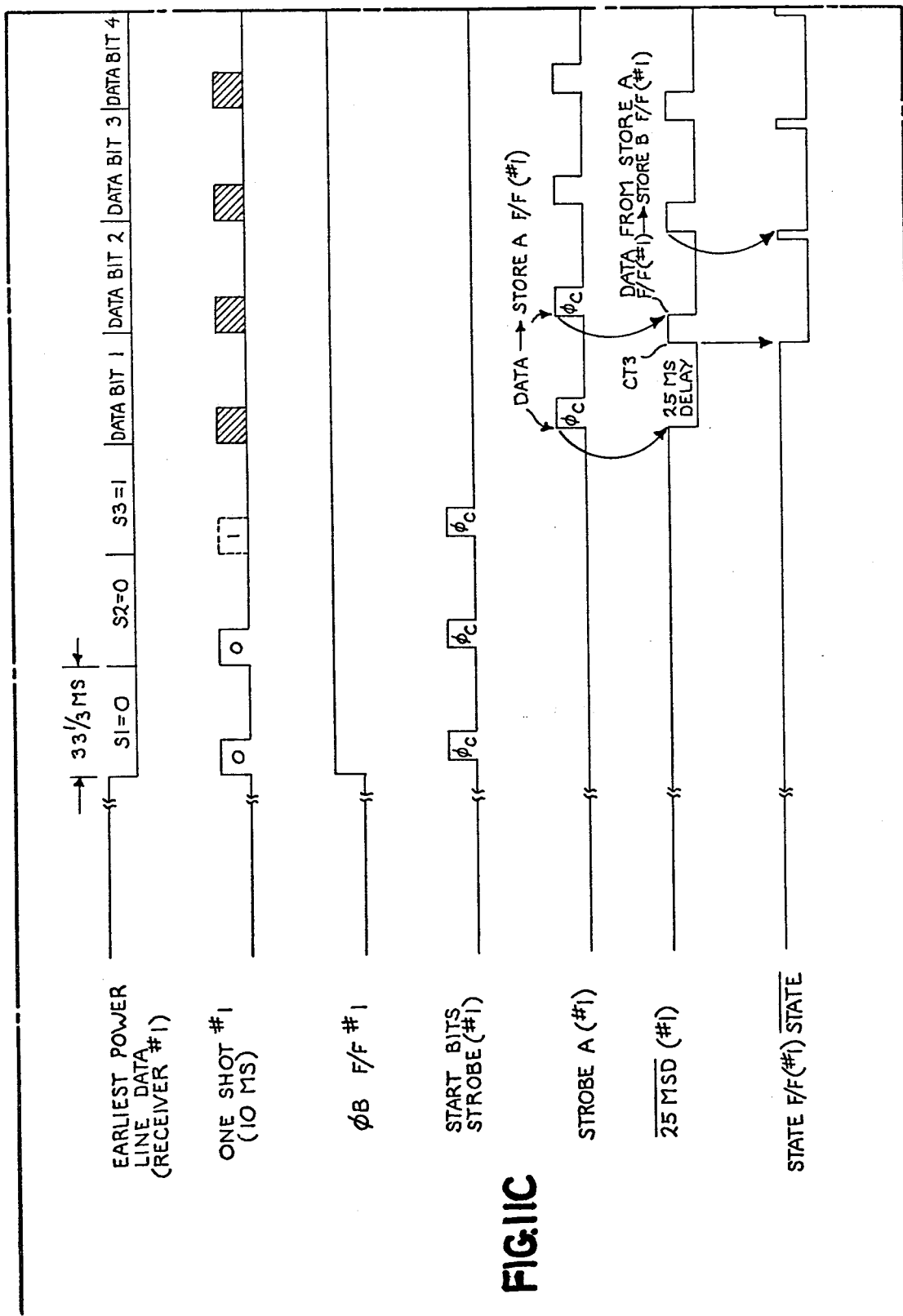
Figure 11G:
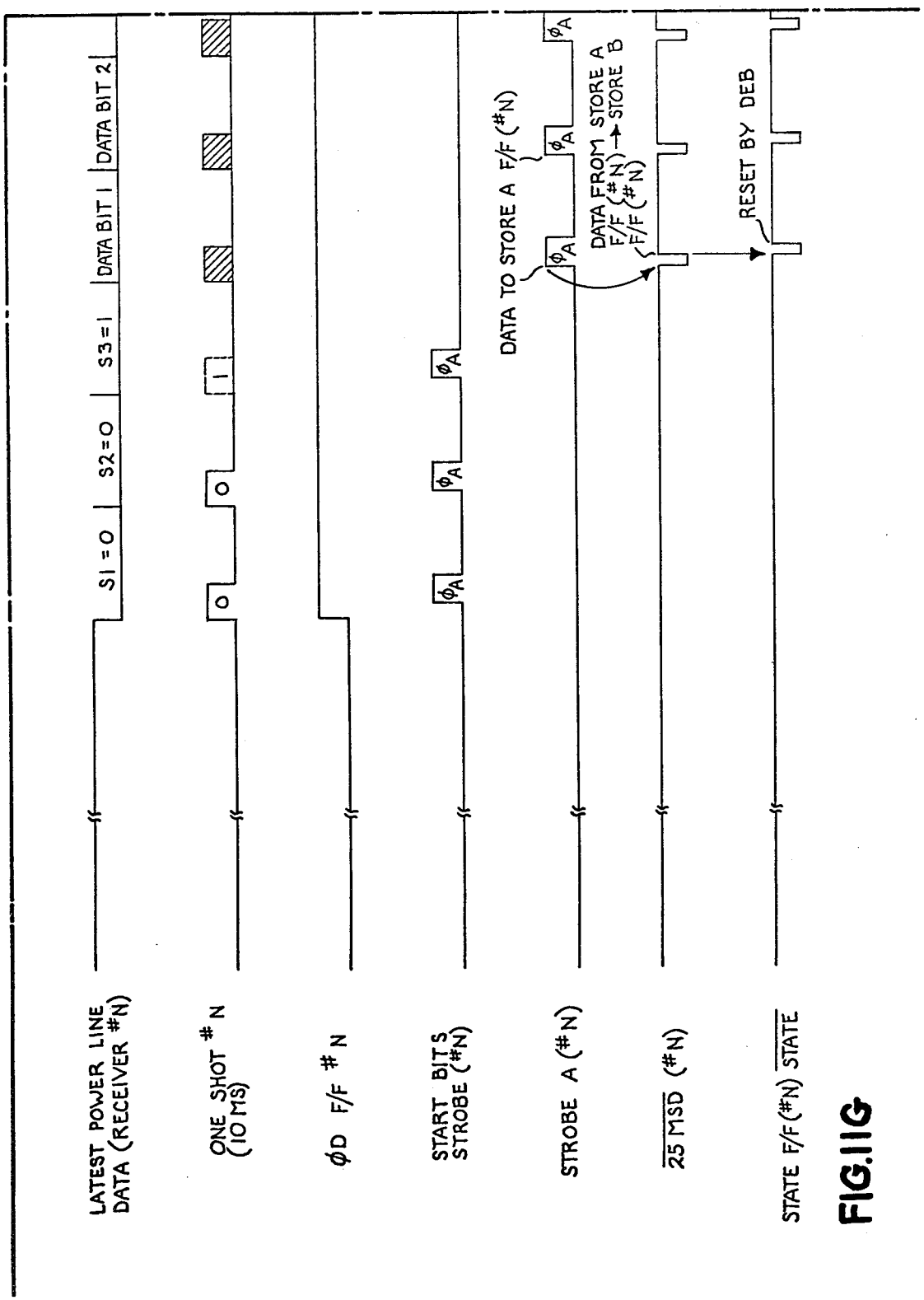
Figure 11H:
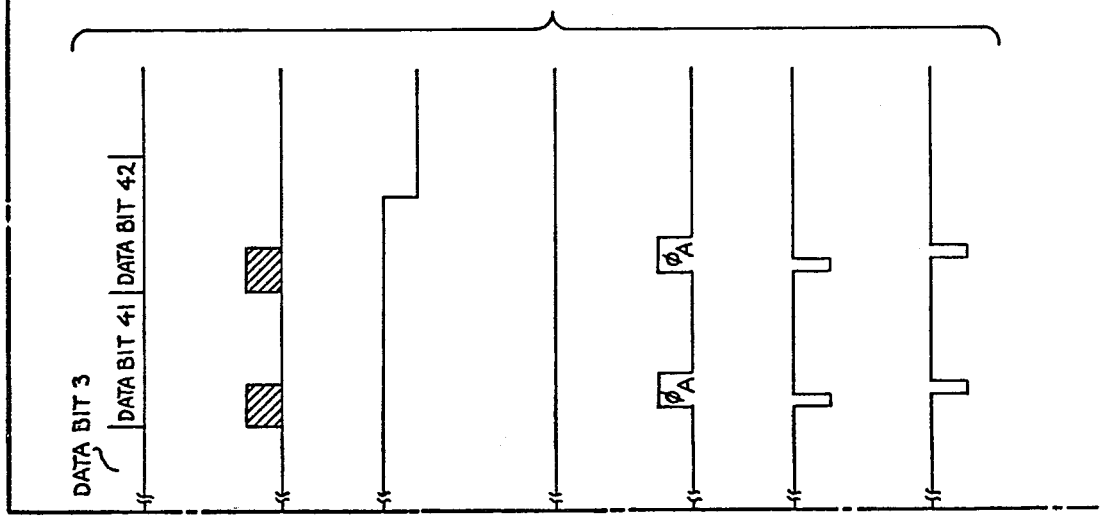

Reference is now made to FIGS. 11A–11H. FIGS. 11A and 11B show the basic timing of the various clock pulses provided to the receiver logic from the master clock generator 36 of FIG. 13E. FIGS. 11C and 11D illustrate the timing of a typical one of the receivers 338, which is receiving message data from the power line. In the illustrated embodiment, it will be recalled as previously described in connection with FIG. 1, that as many as eight MTU's can be transmitting information onto the power line simultaneously. Because of various delays in the system caused, for example, by the physical displacement of MTU's along the power line and the turnaround or response time in each of the various MTU's to received messages, the message data from each of eight addressed MTU's may not reach the SCU at exactly the same time. For this reason, the SCU must be capable of insuring that the first message received from an MTU and the latest message received from an MTU is captured by the SCU and transferred to the RCC. In FIGS. 11C and 11D, it will be noted that that timing diagram specifies the receipt of the earliest power line data from a receiver #1, which could by any one of the receivers 338. FIGS. 11G and 11H are somewhat similar to FIGS. 11C and 11D; however, FIG. 11G and 11H show the operation of a receiver #N, which can be any one of the receivers 338, receiving the latest power line data from the MTU. The power line receiver common logic timing is illustrated by FIGS. 11E and 11F.

In the ensuing description, the receiver operation will be described by first assuming that a message has been transmitted onto the power line by an SCU to address only one MTU on that power line. Thus, that one MTU will be the only one to respond with a data message back to the SCU. In this particular instance, that message could be considered to be the earliest power line data illustrated by the timing diagram of FIGS. 11C and 11D. The common logic for the receiver as illustrated by FIGS. 11E and 11F will also be described in connection with this one addressed MTU. Following that description, the operation of the receiver logic will be described, utilizing FIGS. 11G and 11H with the assumption that a message transmitted to the MTU's is a message which addresses a plurality of MTU's (e.g., eight MTU's) to transmit their meter data simultaneously to the SCU. In this particular instance, the description of FIGS. 11G and 11H will entail the receipt of an SCU of the latest data from one of the addressed MTU's. FIGS. 11E and 11F will also be described in connection with FIGS. 11G and 11H.

Reference is now made to FIG. 14C. In that figure the PLRFF flip-flop 160 has been re-illustrated as a portion of the power line receiver common logic 342 to make it easier to understand the overall operation of the power line receiver logic.

As previously described in connection with FIG. 13B, the primary purpose of the PLRFF flip-flop is to turn the power line receivers on and off. Let it first be assumed that the PLRFF flip-flop is in a reset state. As a result, its zero output terminal is generating a binary 1 $\overline{PLRF}$ signal on conductor 358. The $\overline{PLRF}$ signal is utilized to keep each of the receivers and the receiver common logic in the reset, or off, state when a message is not to be received from an MTU(s). A plurality of flip-flops, $\phi$ AF/F 360, $\phi$ BF/F 362, $\phi$ CF/F 364, and $\phi$ DF/F 366 are all held in the reset state by the $\overline{PLRF}$ signal applied to the reset terminals of those flip-flops via a conductor 368. The $\overline{PLRF}$ signal is likewise applied on a conductor 370 to a reset R terminal of a remove start bits discounter 172 to reset that counter and simultaneously inhibit it from counting. Three other flip-flops, F/F1A 374, F/F2A 376, and EOMF/F 378 of FIG. 14D, are likewise held in the reset state by the PLRF signal on a conductor 330. Further, a flip-flop 50MSF/F 382 is held in the reset state by the $\overline{PLRF}$ signal's being applied to the reset terminal of that flip-flop via an OR gate 384 and conductors 386 and 388. Additionally, a message length counter 390 is inhibited from counting and held in the reset state by the $\overline{PLRF}$ signal on conductor 392 being applied to a reset input terminal of that counter. A 30 Hz strobe clock counter 394 is held in the inhibited reset state indirectly by the $\overline{PLRF}$ signal, which reset flip-flop 376 to apply a binary 1 signal from its zero output terminal via a conductor 396 and an OR gate 398 to the reset terminal of counter 394. In a similar fashion, a 50 MS delay divide by 12 counter 400 is held in a reset inhibit count state indirectly by the $\overline{PLRF}$ signal from the zero output terminal of flip-flop 374 via conductors 402 and 540.

Referring to FIG. 14C, the $\overline{PLRF}$ signal is also applied to a reset inhibit input terminal of a 267 MS delay divide by 8 counter 404 on a conductor 406 holding that counter in a reset inhibit count state. Four additional flip-flops, a 25MS Delay Control flip-flop 408, a STATE F/F flip-flop 410, a STORE A flip-flop 412, and a STORE B flip-flop 414 of FIG. 14B are also held in the reset state by the $\overline{PLRF}$ signal. It will be noted that the $\overline{PLRF}$ signal applied to the reset input terminal of each of these latter flip-flops is the complement of the binary zero PLRF signal now present at the one output terminal of the PLRF flip-flop 160 on conductor 416. The PLRF signal on conductor 416 is inverted through an inverter 418 to the $\overline{PLRF}$ binary 1 signal on conductor 420. An OR gate 422 passes the $\overline{PLRF}$ signal to the reset R input terminal of flip-flop 410 via conductor 424. In a similar manner, the $\overline{PLRF}$ signal is applied to the reset input terminal of flip-flop 408 via conductors 426, 428 and an OR gate 430. Flip-flops 412 and 414 are reset by the $\overline{PLRF}$ signal from inverter 418 via conductors 432 and 434 applied to reset input terminals of those flip-flops.

As previously described, the receivers illustrated by FIGS. 14A and 14B are representative of a one of the plurality of receivers 338 in the SCU. As shown in FIG. 14C, the PLRF and $\overline{PLRF}$ signals are provided to all other power line receivers in the SCU in the same manner as just shown and described in connection with FIGS. 14A–14D. The PLRF and $\overline{PLRF}$ signals are shown going to all of the other receivers (not shown) on conductors 436 and 438, respectively. Also, for a more easy understanding of the description of the SCU receivers, the data message switch 340 has been duplicated in FIG. 14C receiving the $\overline{PLRF}$ signal via conductors 416 and 440.

Prior to proceeding with a further description of the SCU receiver operation, it is considered advantageous to reconsider the message format of FIG. 4 showing the format of meter data which is received by the SCU from any one of the MTU's. As shown in FIG. 4, that message is comprised of 45 bits, of which the first three bits are the sync, or start, bits and 42 bits comprise meter data and parity. This message is received by the SCU in the order shown in FIG. 4 from the left to the right, starting with the three sync bits.

Let it now be assumed that the SCU has just decoded a command and transmitted it to an addressed MTU that specifies that the MTU is to transmit meter data back over the power lines to the SCU. As such, the PLRF flip-flop 160 is in the set state, placing the SCU in a message receive wait mode by removing the previously described reset signals from the various flip-flops and counters in the receiver logic. This has the effect of basically turning on all of the receivers simultaneously in preparation to the receipt of a message from the addressed MTU. As previously mentiond, the operation of the receivers will first be described with the receipt of a message from a signal MTU.

Reference is now made to FIG. 14C to the data input $(f_1-f_8)$ on conductor 344 coming into switch 340. Since the PLRF flip-flop is now set, switch 340 is enabled by a binary 1 PLRF signal on conductor 440 applied to that switch. As soon as the meter data arrives at the SCU from the MTU, it will be passed through switch 340 via conductor 346 and applied to a narrow band receiver/amplifier circuit 442. The message data is amplified in receiver amplifiers 442 and provided to the input of a band pass commutating filter 444 via conductor 446. It will be recalled that the MTU is capable of transmitting its metered data at its own specified frequency. These frequencies were previously described as $f_1-f_8$. Further, it was also pointed out that the SCU is capable of receiving in each of its receiver circuits a meter data message at the frequency corresponding to that being transmitted by one of the MTU's. In FIG. 14A there is shown an $f_x$ crystal oscillator 448 providing an $f_x$ RF signal on a conductor 450 to one input of the band pass commutating filter 444. The frequency of the $f_x$ signal on conductor 450 can be representative of any one of the previously mentioned frequencies $f_1-f_8$, depending upon which receiver is being considered. The purpose of the band pass commutating filter 444 is to allow the receiver to receive only the message data corresponding to that frequency $f_x$ by filtering out all unwanted frequencies and passing the message data out of the filter 442 corresponding to the desired message.

Reference is now made to the two top lines of FIGS. 11C and 11D designated earliest power line data (receiver #1) and one-shot #1 (10MS). To understand the operation of the receivers of the SCU, it is important to realize that in the present system, the presence of a pulse burst of energy on a power line is representative of a binary 0, whereas the absence of a pulse burst is representative of a binary 1. As shown in FIG. 11C, the first three bits of information from the MTU entering the SCU receiver of FIG. 14A are the three sync bits designated S1, S2 and S3. It will also be noted that the message data transferred over the power lines between the MTU and SCU and from the SCU to the MTU is at a 30 Hz rate; thus, the pulse spacing between each of the data bits in the message is 33.3 milliseconds as shown in FIG. 11C. As shown in FIG. 11C, the power line data is normally at a binary 1 state and when a pulse burst (binary 0) is placed on the power line by the MTU, the output of the band pass filter 444 will generate a negative signal as shown in the earliest power line data line of FIG. 11C. This negative going pulse is applied via a conductor 452 to a trigger (T) input of a one-shot, 10 millisecond multivibrator 454. The output of multivibrator 454 is shown in FIG. 11C on the one-shot #1 line as two pulses corresponding to the first two binary 0 sync bits and the absence of a pulse shown as a dotted or phantom pulse representative of the binary 1 sync bit. All message bits following the three sync bits are shown in cross-hatched form as those bits are indeterminate, dependent upon the contents of the message. These cross-hatched bits are shown as data bits 1 through 42. For each data bit which is a binary 0, oneshot 454 will be fired to generate a 10 millisecond output pulse as shown in FIG. 11C. The data bits from the output of one-shot 454 are applied to an AND gate 456 via a conductor 458.

The other input to AND gate 456 is a binary 1 signal on a conductor 460 from the output of an inverter 462. Inverter 462 is presently receiving a binary 0 input signal from an OR gate 464 now disabled. This is explained as follows: Prior to the reception of a message from the MTU, the four flip-flops 360 through 366 are in the reset state. Thus, their binary 1 output terminals are each providing a binary 0 signal on conductors 466 to the input of OR gate 464. Thus, it can be seen that with the appearance of the very first sync bit in the message, AND gate 456 will be enabled to apply a binary 1 signal as one input to each of four AND gates 468, 470, 472 and 474 via a conductor 476. The second input to these AND gates are the $\phi$A through $\phi$D signals from the master clock generator 36 of FIG. 13E.

Reference is now made to FIGS. 11A and 11B, which illustrate the timing relationships between the $\phi$A through $\phi$D signals. It will be noted that there are four phase signals ($\phi$A through $\phi$D) generated for each bit time of the incoming message. This is seen by comparing the $\phi$A through $\phi$D signals with the pulse width of the 30 Hz signal shown in FIG. 11A. The reason for the $\phi$A through $\phi$D signals and the circuitry in FIG. 14A is to be able to synchronize the clocking of the data bits into the receiver with a 30 Hz clock signal. The majority of the circuitry shown in FIG. 14A comprises basically a strobe sync detector circuit for developing the just-mentioned synchronization. As will be seen, this circuitry is capable of synchronizing any one of the 30 Hz $\phi$A through $\phi$D signals with the 30 Hz incoming data to generate a synchronization strobe A signal shown in FIGS. 11C and 11D.

As shown in FIG. 11C, it will be noted that oneshot 454 generates the first sync pulse output signal approximately in the middle of the $\phi$B signal. Referring now to AND gate 470 of FIG. 14A, the coincidence between the first sync bit on conductor 476 and the $\phi$B signal applied to AND gate 470 enables that AND gate to apply a binary 1 set signal to the input of the $\phi$B F/F 362. FIG. 11C shows the setting of the $\phi$B F/F #1 on the leading edge of the output of one-shot #1. The one-output terminal of the $\phi$B F/F 362 is connected via a conductor 478 as one input to an AND gate 480. The other input to AND gate 480 is the $\phi$C signal on a conductor 482. With the $\phi$B F/F now set, the first $\phi$C signal following the setting of that flip-flop will enable AND gate 480 to generate a binary 1 output signal on a conductor 484 to an OR gate 486. The OR gate 486 now passes its input signal, via a conductor 488, to an AND gate 490. The other input to AND gate 490 is presently a binary 1 signal from an inverter 492 now receiving a binary 0 input on conductor 494 from disabled AND gate 496.

AND gate 496 is connected to the output of the remove start bits counter 372 and decodes the output of that counter to generate a binary 1 signal on conductor 494 when the counter reaches a count of three. At the present time this counter is zeroed out; thus the output of AND gate 496 is a binary zero, causing inverter 492 to apply a binary 1 enable signal to AND gate 490. Reference is now made back to FIGS. 11C and 14A, which show the start bits strobe #1 being applied to the trigger T input of counter 372 via conductor 498. It will be noted that the start bits strobe coincides with the $\phi$C signal applied to AND gate 480.

It will be noted in FIG. 14A that when the $\phi$B F/F 362 sets, its one-output terminal provides a binary 1 signal on one of the conductors 466 to OR gate 464. This binary 1 signal is passed through OR gate 464 and inverted to a binary 0 signal by inverter 462, thus applying a disable input signal to AND gate 456 via conductor 460. Disabling AND gate 456 applies a binary 0 disable signal to each of the AND gates 468 through 474. Since these AND gates are disabled, those AND gates can no longer apply set signals to any of the other flip-flops 360 through 366. It is significant to note that the circuit of FIG. 14A is capable of synchronizing any one of the $\phi$A through $\phi$B signals with the first data or sync bit coming into the receiver. Further, it will be noted that whenever a particular one of the $\phi$A through $\phi$D flip-flops is set, the strobe A signals will be generated at the phase ($\phi$) signal immediately following that which set the particular flip-flop. In the example shown in FIGS. 11A through 11D, the $\phi$B flip-flop is set at $\phi$B time and the strobe A (#1) signals are generated at $\phi$C time, thus locking in the system to generate the strobe A signal with each $\phi$C signal. If the first sync bit (S1) had happened to coincide, for example, with the $\phi$A signal, AND gate 468 would have been enabled to set flip-flop 360. This would cause the binary 1 output of the $\phi$A F/F 360 to enable an AND gate 506 to begin generating the start bits strobe and the strobe A signals at $\phi$B time.

Reference is again made to FIG. 11C to the start bits strobe #1 line. It is seen there that three sync, or start, strobe signals are generated by AND gate 490 and applied to counter 372 (FIG. 14A). When counter 372 reaches a count of three, AND gate 496 is enabled to apply a binary 1 signal as one input to an AND gate 500 on a conductor 502. The binary 1 signal is also applied to inverter 492, which now disables AND gate 490 preventing application of the start bits strobe to the counter 372. It will be noted that the output of OR gate 486 is also connected as one input to AND gate 500. AND gate 500 will now begin to generate the previously mentioned strobe A signal on a conductor 504 in response to each $\phi C$ signal as shown in FIGS. 11C and 11D on the strobe A(#1) line. The strobe A signal on conductor 504 is applied as one input to an AND gate 508, which is now enabled by the binary 1 PLRF signal also applied to that AND gate. The output of AND gate 508 is utilized to strobe or clock the meter data from the MTU into a STORE A F/F 412 via a conductor 510. The serialized message data from one-shot 454 is also applied to a data terminal D of flip-flop 412 via conductor 512. Referring to FIG. 11C, it can be seen that the strobe A (#1) signal at $\phi C$ time always falls in coincidence with the output of one-shot #1 454. If one-shot 454 is generating a binary 1 output signal, the strobe A signal on conductor 510 will cause flip-flop 412 to set. If the output signal from one-shot 454 is a binary 0, flip-flop 412 will reset. In this manner, binary 1's and 0's are shifted from the power line into the data receiver flip-flop 412.

The output of AND gate 508 is also applied to an OR gate 514 via a conductor 516. For each strobe A signal generated by AND gate 508, OR gate 514 passes that signal to a trigger T input terminal of the 25 MS delay control flip-flop 408 causing that flip-flop to set at a time as shown in FIG. 11C on a $\overline{\text{25MSD}}$ (#1) line. Flip-flop 408 sets at this time causing its 0 output terminal to go to a binary 0 state on conductors 518 and 520. With the 0 output terminal on conductor 518 toing to a binary 0 at this time, it has no effect on the state flip-flop 410. However, the binary 0 signal $\overline{\text{25MSD}}$ on conductor 520 is applied as a release input signal to an R terminal of the 25 MS delay counter 522. This removes the reset inhibit input to counter 522, allowing that counter to begin to count 120 Hz pulses. At the end of the count of three by counter 522, it generates a 25 millisecond delay output signal CT3 on a conductor 524. The CT3 signal enables OR gate 514 to again trigger flip-flop 408, causing it to reset. Resetting this flip-flop 408 results in applying a binary 1 signal back to the R input of counter 522, thus zeroing out that counter and inhibiting it from counting. Further, the binary 1 signal causes the STATE F/F 410 to now set at the time shown in FIG. 11C on the STATE F/F (#1) $\overline{\text{STATE}}$ line. With flip-flop 410 now set, its 0 output terminal generates a binary 0 output signal $\overline{\text{STATE}}$ on a conductor 526 to disable an AND gate 528.

The binary 1 output of flip-flop 408 on conductor 518 is also applied at this time to a trigger (T) input signal of a STORE B flip-flop 414 via a conductor 530. As shown in FIG. 11C, the binary 1 $\overline{\text{25MSD}}$ signal causes the previously stored data bit from flip-flop 412 to now be clocked into the STORE B flip-flop 414 via a conductor 532 applied to a data D input terminal of that flip-flop. Simultaneously with the clocking of the previously stored data bit from flip-flop 412 into flip-flop 414, the next data bit is strobed into flip-flop 412. This is always done on the leading edge of the STROBE A signal as shown in FIG. 11C.

Reference is now made back to FIG. 14A to the output of AND gate 500 generating the strobe A signal on conductor 504. It is shown there that the strobe A signal is also applied via a conductor 534, as one input to an OR gate 536 of FIG. 14D. It is significant to note at this time that OR gate 536 receives a strobe A input from each of the plurality of receivers in the SCU. The reason for this is explained as follows: In order to properly clock all of the message data from the MTU's into the SCU receivers, it is desirable to develop the sync bits and strobe A signals from the first sync bit of the first, or earliest, incoming message from the MTU's. The detection of this first sync bit, as previously described, effects the starting of the strobe A signals on conductor 534. Once that first strobe A signal has been generated, it is necessary to block out all of the other receivers from providing strobe A signals to the common power line receiver logic in FIGS. 14C and 14D so that all data will be clocked into the plurality of receivers simultaneously under control of one strobe A signal.

As shown in FIG. 14B, when OR gate 536 is enabled, it simultaneously applies a binary 1 signal on a conductor 538 to a set input terminal of the FF1A flip-flop 374 and the 50 MS flip-flop 382. This binary 1 signal causes both of those flip-flops to set, generating a binary 0 output signal from each one's 0 output terminal. The timing for the F/F1A and 50 MS F/F is shown in FIGS. 11E and 11F. The binary 0 output signal from flip-flop 374 is applied as an inhibit signal via conductors 540 and 542 to an inhibit terminal shown as a circled inverter on the input of OR gate 536. This inhibits the passage of strobe signals from any of the other receivers through OR gate 536. As shown in FIGS. 11E and 11F, the FF1A flip-flop will remain in the reset state until the complete message has been received, at which time it will be reset. This will be described subsequently.

Reference is now made back to the set S input terminal flip-flop 382. Flip-flop 382, which is now set, generates a binary 0 signal from its 0 output terminal on a conductor 544. This signal is applied to a set S input terminal of a flip-flop FF2A 376. As shown in FIG. 11E, this signal has no effect on the operation of that flip-flop at this time. Referring now to FIG. 14D, it will be noted that the binary 0 output signal from flip-flop 374 is also applied as a release signal on conductors 402 and 540 to an R input terminal of the 50 millisecond delay divide by 12 counter 400. Counter 400 now begins to count 120 Hz input clock signals applied to the trigger T input terminal of that counter. The output signals of counter 400 are applied via a plurality of conductors 546 to the input of a 50 MS divide by 12 decode network 548. As shown in FIG. 11E, after a 50 millisecond delay, the decode network 548 will generate a binary 1 output signal on a conductor 550, which is passed through OR gate 384 via conductor 388 to reset the 50 MS F/F 382. Resetting flip-flop 382 now causes the 0 output terminal of that flip-flop to go to a binary 1 on conductor 544, thus setting F/F2A 376 as shown in FIG. 11E. With flip-flop 376 now set, its 0 output terminal now goes to a binary 0 on conductor 396 to now apply a binary 0 release signal to the R input terminal of the 30 Hz strobe clock counter 394 via OR gate 398.

Counter 394 now begins to count 240 Hz input pulses applied to the T terminal of that counter. The output stages of that counter designated CCB, CCC and CCD are applied via their corresponding output lines to the input of a clock decode 30 Hz generator circuit 552. Decode 552 also receives the 240 Hz input pulses via a conductor 554. The equations defining the internal decode logic of decode 552 are given on the timing diagram of FIG. 11E on the lines $D_eA$, $D_eB$ and $D_eC$. It will be noted in FIG. 11E and 14D that the $D_eA$, $D_eB$ and $D_eC$ signals are sequentially generated by the decode 552.

The generation of the first $D_eA$ signal in the present description has no effect on the operation receiver. However, it will be noted as shown in FIGS. 11E and 11C that the leading edge of the first $D_eB$ signal from the output of decode 552 is applied as a binary 1 signal to OR gate 422 of FIG. 14B via conductor 350. OR gate 422 now passes the $D_eB$ signal to the reset input terminal of flip-flop 410 via conductor 424. This causes the STATE F/F 410 to now reset generating a binary 1 $\overline{\text{STATE}}$ output signal on conductor 526 to AND gate 528. It will also be noted at this time that the 25 MS delay control flip-flop 408 is again triggered to reset at the counter of three (CT3) applying a set signal to the STATE F/F 410, causing that flip-flop to immediately set as shown in FIG. 11C.

It is significant to note that the $D_eA$ and $D_eB$ signals as shown in FIG. 14D are also applied to all of the power line receivers 338, causing those receivers to all operate in the same fashion as just described in connection with FIGS. 14A, 14B, 14C and 14D. Referring now back to FIG. 14D, the next output signal to be generated from the decode 552 is the $D_eC$ signal on a conductor 352. That signal is shown being developed as an output signal from the power line receiver common logic 342 in FIGS. 14D and 13B for application to the data transmitter/receiver circuit 40. It is this $D_eC$ signal which effects the parallel transfer of data from each of the eight receivers (FIG. 13B) into the data transmitter/receiver 40.

Referring back to FIG. 14B, it will be recalled that each data bit which is strobed into the STORE B flip-flop is transferred via a one of the plurality of conductors 554 from the corresponding receivers to the input of the data transmitter/receiver 40 shown as 8 data lines in FIGS. 13A and 13B. As each data bit from the receivers is transferred to the data transmitter/receiver 40, it is necessary to keep track of the number of bits in the message, which have been transferred. This is effected by the CCD signal generated by the clock counter 394 in FIG. 14D. The timing for the generation of the CCD signal is shown in FIGS. 11E and 11F, whereby the leading edge of that signal triggers a message length counter 390 with a binary 1 signal on a conductor 556. As shown in FIGS. 11E and 11F, the message length counter 390 is counted up by one in response to each CCD pulse. The message length counter output stages are provided via a plurality of conductors 558 to a message length decode 560, which generates an output signal CT42 on a conductor 562 when the message length counter achieves a count of 42. The generation of the CT42 signal is shown in FIG. 11F. The CT42 signal, upon the detection of the 42nd count, or 42nd message bit, (see FIG. 4) is applied as a binary 1 set signal to an end of message flip-flop EOM F/F 378 via conductor 562. As shown in FIG. 11F, the CT42 signal causes the EOM F/F to set, thus generating a binary 1 EOM signal from the 1 output terminal on a conductor 564. The EOM signal on conductor 564 is applied to the input of OR gate 30 of FIG. 13A, causing the system control flip-flop 28 to reset, thus generating the binary 1 SCU reset output signal on conductor 34 to completely reset the entire SCU in preparation to receipt of another message from the RCC.

It should also be pointed out that each message bit transferred to the data transmitter/receiver 40 of FIG. 13A by the $D_eC$ signal is strobed through the transmitter modulator 162 for transfer to the RCC prior to the transfer of the next data bit from the receiver. Referring back to FIG. 14D, it will also be noted that the CT42 signal from decode 560 is applied on conductor 562 to OR gate 398 to immediately reset counter 394 after it has generated the last CCD signal shown as a very short signal in FIG. 11F. Referring to FIG. 13B, it will be noted that the SCU reset signal is now applied to the PLRFF flip-flop 160. The PLRFF flip-flop will now reset as shown in FIG. 11B, causing that flip-flop to generate a $\overline{\text{PLRF}}$ binary 1 signal on conductor 358 as shown in FIG. 14C to reset the entire receiver section in the manner as previously described at the outset of this discussion.

The operation of the SCU receiver section will now be described with the assumption that the message command previously transmitted to the power lines addresses eight MTU's and specifies in its function code that all of the MTU's are to simultaneously transmit their meter data over the power lines 18 to the SCU. These eight messages will each be at a different frequency and will be received by the eight receivers corresponding to the frequency of each of the messages from the addressed MTU's. It will be recalled, as previously mentioned, because of inherent delays in the system, that the data from several MTU's may not arrive simultaneously at the SCU. This non-simultaneous arrival of information at the SCU receiver section from the plurality of MTU's is illustrated in the timing diagrams of FIGS. 11C, 11D, 11E, 11F, 11G and 11H. FIGS. 11G and 11H, in particular, illustrate the latest power line data being received by a one of the receivers disignated receiver #N in FIG. 11G approximately 40 milliseconds after receipt of the earliest power line data being received by receiver #1 as shown by FIGS. 11C and 11D. To understand the operation of the plurality of receivers receiving the earliest and latest data, it is necessary to visualize that the receiver of FIGS. 14A and 14B is representing a receiver (receiver #1) receiving the earliest power line data, as well as another receiver (receiver #N) receiving the latest power line data.

Let it now be assumed that all MTU's have been commanded to transmit their meter data over the power lines 18 to the SCU. The first receiver to receive the first sync or start bit of the SCU message is illustrated by the earliest power line data (receiver #1) timing diagram of FIGS. 11C and 11D. The operation of receiver #1 has already been described in connection with the timing diagrams of FIGS. 11A–11F and will operate in the same manner as previously described. However, it will be noted that the receiver #N receiving the latest power line data illustrates certain differences in the timing in FIGS. 11G and 11H compared to that previously described in connection with FIGS. 11C and 11D of receiver #1.

Referring to FIGS. 14C and 14D, it is significant to point out, as previously described, that the power line receiver common logic will always select the first strobe A signal generated by the receiver receiving the earliest power line data. When this occurs, OR gate 536 is inhibited from receiving the strobe A signal from any other receiver later receiving data from an MTU. Let is now be assumed that the receiver illustrated in FIGS. 14A and 14B is that shown by the timing diagram of FIGS. 11G and 11H receiving the latest data. It will be noted that the strobe A #N signal is generated in the same manner as previously described for the strobe A #1 signal. However, for illustrative purposes, it is shown that the stobe A #N signal is being generated at φA time instead of φC time as previously described in connection with FIGS. 11C and 11D. This was done merely to show how any receiver can lock in on any one of the φA–φD pulses. The operation of the remove start bits counter 372 in FIG. 14A to stop that counter at the end of three start bits strobes and to enable AND gate 500 is the same as previously described in connection with FIGS. 11C and 11D. As previously described, the first strobe A signal (#N) will simultaneously clock the first data bit (latest received data bit) into the STORE A F/F 412 and trigger the 25 millisecond delay control flip-flop 408, causing that flip-flop to go into a set state generating a binary 0 $\overline{25MSD}$ signal on conductor 520. The next significant action to note is that the first strobe A signal generated by receiver #1 at φC time has effected the starting of the 30 Hz strobe clock counter 394 to begin the generation of the $D_eA$, $D_eB$ and $D_eC$ signals after the 50 millisecond delay (50 MSF/F) as shown in FIGS. 11E and 11F. It will be noted at this time that the STATE F/F 410 as shown in FIG. 11G is in a reset state, thus generating a binary 1 $\overline{STATE}$ signal on conductor 526 to now enable AND gate 528 to be enabled upon the occurrence of the $D_eA$ signal. As shown in FIGS. 14B, 11E, 11F, 11G, the leading edge of the $D_eA$ signal on conductor 348 causes AND gate 528 to be enabled, generating a binary 1 output signal on conductor 566. This latter signal is passed through OR gate 430 to now set the 25 millisecond delay control flip-flop 408 at a time as shown on the 25MSD (#N) line of FIG. 11G. With flip-flop 408 now reset, its binary 0 output terminal goes to a binary 1 on conductor 518, causing flip-flop 410 (STATE F/F #N) to set, disabling AND gate 528. However, flip-flop 410 will immediately be reset at leading edge of the $D_eB$ signal as shown in FIGS. 11G, 14B and 14D, in preparation for the repeated cycle of the 25 millisecond delay and STATE F/F (#'s N) operations as just described.

By comparing the timing of the $\overline{25MSD}$ signals shown in FIGS. 11G and 11C, it can be seen that this timing allows the data in the latest power line receiver #N to be clocked into its STORE A F/F 412 and from that flip-flop into its STORE B F/F 414 prior to the occurrence of the $D_eC$ signal shown in FIG. 11E, so that the latest received data is in the buffer store flip-flop 414 of all receivers in time to be simultaneously transferred from the receivers via conductors 554 (FIG. 13B) into the data transmitter/receiver 40 for transfer to the RCC via the transmitter modulator 162.

By referring to FIGS. 11D, 11F and 11H, it can be seen that the 42nd data message bit from each MTU is clocked from the eight receivers into the data transmitter/receiver 40 for transfer to the RCC upon the occurrence of the last $D_eC$ pulse appearing in FIG. 11F. Immediately following the shifting of the 42nd data bit out of the SCU to the RCC, the CCD signal as shown in FIG. 11F causes the message length counter to be triggered to generate a count of CT42 from decode 56 to thus set the EOM F/F 378. The EOM F/F, now generating the EOM binary 1 signal on conductor 564, will effect a complete total reset of the SCU in the same manner as previously described, thus preparing the SCU for receipt of another command from the RCC.

Figure 12:
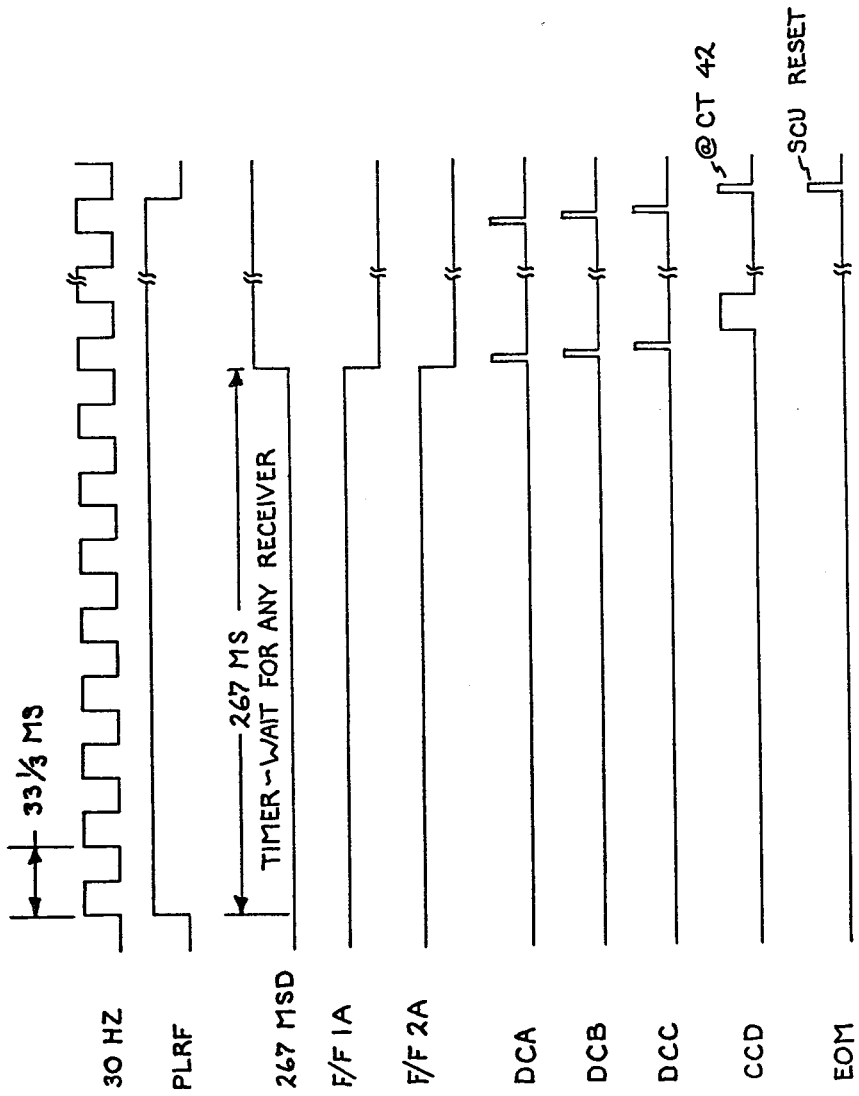

One remaining portion of the SCU remains to be explained. Reference is now made to FIGS. 12, 14C and 14D. There may be circumstances whereby an MTU or MTU's do not respond to a message transmitted to those units from an SCU. These may be situations where an invalid function code or an invalid address is transmitted to MTU(s), in which case the MTU(s) will not respond with a message back to the SCU. If the SCU is in the wait mode, expecting a message response from the MTU(s), that unit will hang up in the wait mode until a message is received. In order to prevent the SCU from hanging up in this mode, a provision has been made whereby, if a message is not received within a specified period of time, the SCU will automatically send a message of, for example, all binary 1's or all binary 0's, to the RCC. This message can be recognized by the program in the RCC as an invalid message. The SCU will reset after that message is transferred to the RCC.

Referring to FIG. 14C, let is now be assumed that the PLRFF 160 is in a set state. With PLRFF 160 in a set state, the $\overline{PLRF}$ signal applied to the 267 millisecond delay counter 404 via conductor 406 is a binary 0 enabling the counter to begin counting the 30 Hz signals applied to an AND gate 570. AND gate 570 is enabled by the binary 1 $\overline{FF2A}$ signal from flip-flop 376 via conductor 572. The timing for the operation of the 267 millisecond counter 404 is shown in FIG. 12 on the 267 MSD line. It will be noted that after 267 milliseconds, an AND gate 574 decoding output signals on conductors 576 from counter 404 generates a 267 MSD binary 1 signal when that gate detects a count representative of a 267 millisecond delay. The 267 MSD signal is simultaneously applied to a preset input PR of flip-flops 374 and 376 via a conductor 578. As shown in FIG. 12, the two flip-flops FF1A 374 and FF2A 376, when set by the 267 MSD signal, will generate binary 0 output signals on their corresponding conductors 540 and 572. The binary 0 signal from the 0 output terminal of FF2A now allows the output of OR gate 398 to go to a binary 0 signal releasing the 30 Hz strobe clock counter 394 to begin counting the 240 Hz clock signals. As can be seen in FIG. 12, the clock decode 552 of FIG. 14B will now begin to generate the $D_eA$, $D_eB$ and $D_eC$ signals in the same manner as previously described. The $D_eA$ and $D_eB$ signals are applied to all of the power line receivers; however, those two signals have no effect on any of the receivers because a message has not been received by any of those receivers to effect the generation of a strobe A signal, which starts those receivers into operation. The one signal which is significant coming out of the clock decode 552 in this particular instance is the $D_eC$ signal on conductor 352. That signal, as previously described, is applied to the data transmitter receiver 40 of FIG. 13A via conductor 352 to parallel transfer the information from the STORE B F/F 414 of each of the receivers onto the trunk line 14 going to the RCC from the transmitter modulator 166. The information transferred to the transmitter receiver 40 will be either binary 1's or binary 0's, dependent upon the state chosen for the STORE B F/F 414. The state of the STORE B F/F is shown in the example of FIG. 14B to be reset at all times, except when data is being received from the STORE A F/F 412. In this example, all binary 0's. would thus be transferred to the RCC as an invalid message for use by the program. However, if the design so dictates that all binary 1's are to be transferred to the RCC, the STORE A F/F 412 would merely have to be in the set state to effect the transfer of all binary 1's from the STORE B F/F to the RCC.

Referring again to FIGS. 12 and 14D, it can be seen that the CCD signal will cause the message length counter 390 to count each bit being transferred (each $D_eC$ pulse generation) to the RCC. When the message length counter decode 560 generates the CT42 pulse on conductor 562, the EOM F/F 378 is set, thus effecting the SCU reset through OR gate 30 by resetting the system control flip-flop 28.

Meter Terminal Unit (MTU) Operational Description

The detail logic and timing for the MTU is illustrated by FIGS. 15 through 22. By referring to FIGS. 15, 19, 21 and 22, it can be seen that each of those figures is a legendary drawing showing the interrelationships between several figures with corresponding numbers. Each of the legendary drawings comprise a designated portion of the MTU. The MTU operates in basically four modes. These modes are (1) a receive message mode, (2) a control mode, (3) a read and store mode and (4) a transmit mode. A great deal of the MTU logic is time shared logic and the MTU utilizes this time shared logic in each of its operating modes. For this reason, the drawings illustrating the detailed logic of the MTU have been segmented into figures which correspond to each of the MTU operating modes. Further, as the ensuing description proceeds, it will be noted that some of the time shared logic is duplicated on some of the figures. This was done for clarity and to simplify the complexity of the drawings. The number designations of the components on the drawings having like numbers are duplicated in the various drawings.

The MTU's are preferably fabricated from commercially available integrated circuit packages. A complete listing of the major operational blocks as shown in the logic drawing is listed in the following Table 4. Table 4 provides a circuit name or description of the major circuit packages, the manufacturers' names, the manufacturers' part number for those packages and a reference to a manual or the like which provides detailed information on the use of each of those packages.

going through the message receive mode, then the control mode, the read and store mode and finally the transmit mode.

Prior to proceeding with the operational description of the MTU, it is considered advantageous at this time to review the format of the message transferred over the power lines from each of the SCU's to the MTU's as shown in FIG. 3. The message entering an MTU from an SCU enters in the format as shown from the left to the right of FIG. 3. The first three bits of the message are the start code (001) bits, which are utilized by the MTU to detect the start of a message. The following eight bits are the SCU address which, as previously described, were reconstructed by the SCU's address generation logic. This SCU address is utilized by the MTU as a part of its address during the receive mode operation. Following the SCU address is the previously mentioned 11 bit MTU address. As will be described in detail, the MTU address is decoded by the MTU to select either one MTU, a group of eight MTU's, one section of MTU's (e.g., one-eighth of all MTU's on a power line) or all of the MTU's on a power line or in a complete system. Following the MTU address is the MTU function code previously noted in connection with the SCU as the SCU/MTU function code. The MTU function code is decoded by the MTU to place that unit into a specified one of its modes of operation. Following the MTU function code is a 6-bit parity field, which is checked by the MTU during the receive mode to see if the message contains valid parity. As previously described, the parity check and generate function of the MTU plays no part in the operation of the invention, it merely is being shown to complete the description of the present disclosure.

TABLE 4

METER TERMINAL UNIT
MANUFACTURERS' CIRCUIT IDENTIFICATION

| CIRCUIT NAME DESCRIPTION | MANUFACTURER | MANUFACTURERS'NO. |
|---|---|---|
| MULTIPLEXERS (MPX's) | MOTOROLA[1] | MC14539 |
|  | RCA[2] | CD4019A |
| DEMULTIPLEXERS (DMPX's) | RCA | CD4555B |
| ALL FLIP FLOPS | RCA | CD4044A |
| RECEIVE MESSAGE REGISTER | RCA | CD4015A |
| MTU AND SCU ADDRESS COMPARATORS | RCA | CD4030A |
| CLOCK SYNC REG & XMIT CLOCK REG | RCA | CD4035A |
| SYNC BITS COUNTER | RCA | CD4027A |
| CLOCK COUNTER | RCA | CD4518B |
| ALL ONE SHOT | MOTOROLA | MC14528 |
| ⅛ SEC DELAY COUNTER | RCA | CD4024A |
| PARITY CHECK GENERATE | NATIONAL[3] | MM74C174 (PLUS GATING NOT SHOWN) |
| LOAD SELECT DECODE | RCA | CD4556B FOR LOADS CD4555 FOR LIGHTS |
| PHASE LOCKED LOOP | RCA | CD4046A |
| DIVIDE BY 48 COUNTER | RCA | CD4024A |
| DIVIDE BY 5 DOWN COUNTER | MOTOROLA | MC14522 |
| 36 BIT SHIFT REGISTERS | MOTOROLA | MC14557 |
| METER SELECT DECODE | RCA | CD4555B |

[1]All Motorola circits can be found in the manual entitled McMOS Integrated Circuits Data Book, copyright 1973 by Motorola Corp.
[2]All RCA circuits can be found in the manual entitled COS/MOS Integrated Circuits, copyright 1974 by RCA Corp.
[3]This circit can be found in the manual entitled CMOS Integrated Circuits, copyright 1975 by National Semiconductor Corp.

The operation of the MTU will now be described in the above sequence as previously mentioned. First,

MTU Receive Mode Operational Description

In the ensuing description it should be assumed that all flip-flops, registers, counters, etc. in the MTU have been reset or initialized at the time of power application to the MTU from a source not shown.

Figure 15C:
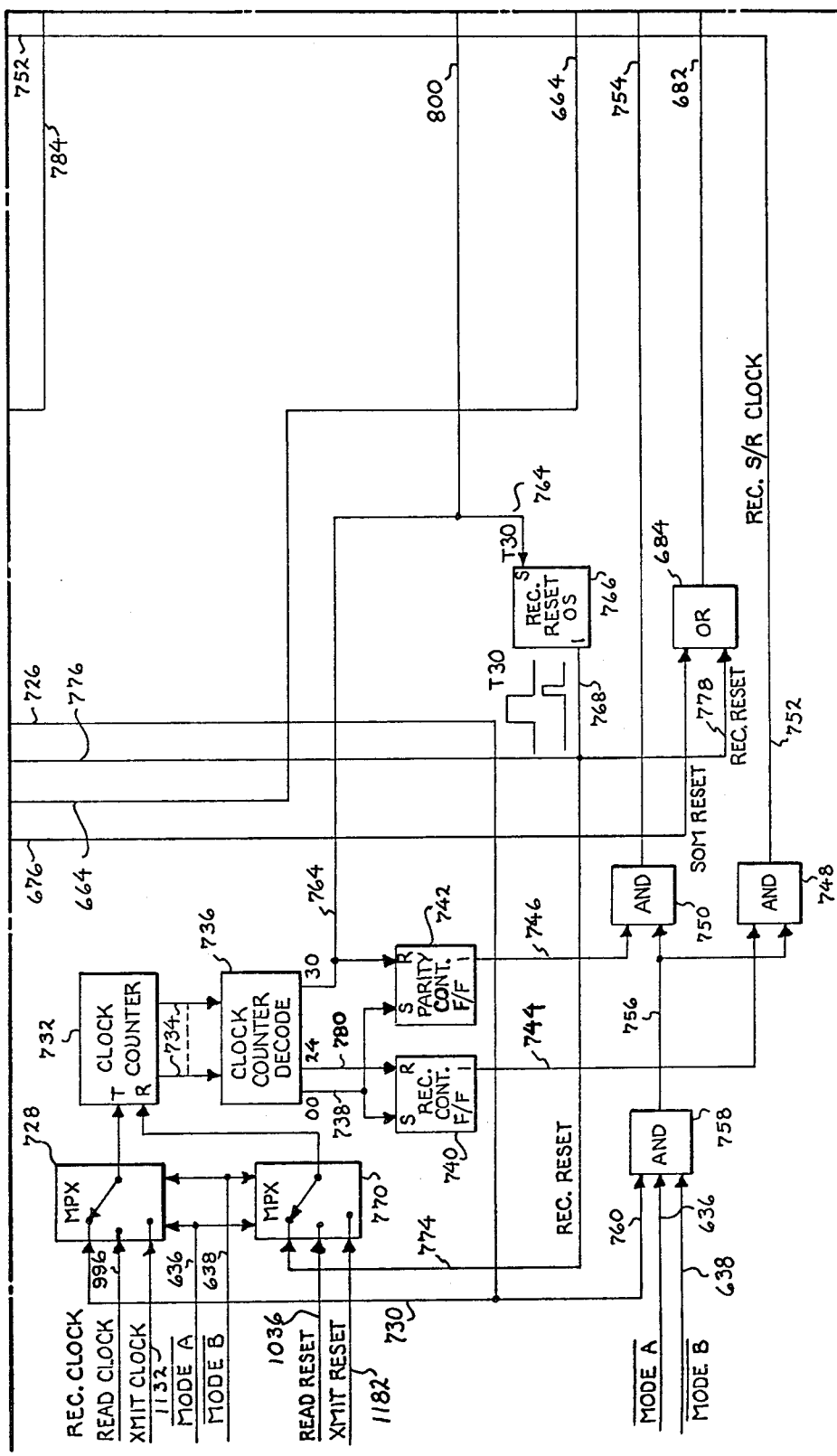
Figure 15D:
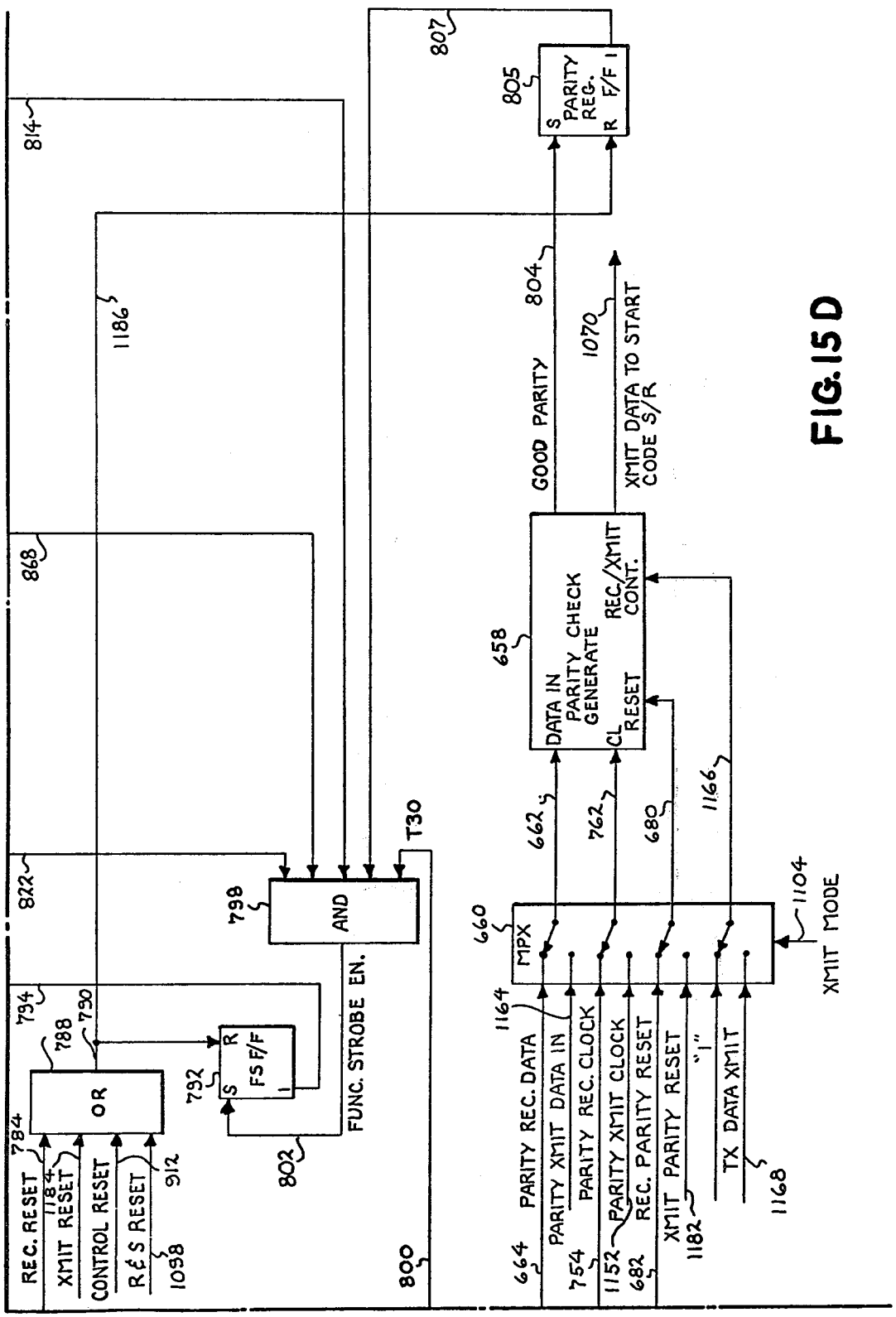

Reference is now made to FIG. 15, which illustrates the interrelationships between FIGS. 15A-15D. These latter figures illustrate in detailed block diagram form the MTU logic which controls the message receive mode of operation. It is suggested at this time that FIGS. 15A-15D be placed as shown by FIG. 15, since those drawings interconnect with each other by interfacing lines. Additionally, the timing diagram which illustrates the operational timing of the MTU during the message receive mode is illustrated by FIG. 16.

Reference is now made to FIG. 16 to an RF data line illustrating the message format of data being provided to the MTU over the power lines. As previously described, a burst of energy on the power line represents a binary 0, whereas a binary 1 is represented by the absence of a burst of energy. In FIG. 16 the first three bits of RF data which enter the MTU are the sync bits 00 shown as bursts of energy and a 1, followed by the remainder of the message. It will be noted that the message excluding the three sync bits, is comprised of 30 data bits shown as dotted blocks, since these data bits are indeterminate depending upon whether they are binary 1's or binary 0's.

Reference is now made to FIG. 15A, which shows the MTU receiving the RF data into a capacitive power line coupler low frequency attenuator 600. The power line coupler, which isolates the 60 Hz line voltage from the input of the MTU, passes the RF data pulses to a conventional operational amplifier 602 via a conductor 604. The output of amplifier 602 designated RF data is on a conductor 606. The RF data from amplifier 602 is provided to a commutating band pass filter 608 similar to that previously described in connection with the SCU. Band pass filter 608 is also receiving an $f_0$ signal on a conductor 610 from an AND gate 612. It will be recalled that the frequency of the $f_0$ signal is that frequency at which the SCU's transmit their messages over their corresponding power lines to the MTU's. It should be mentioned that the frequency of the $f_0$ signal may be any one of several frequencies as listed in the previously mentioned Table 1, which allows the MTU's on various power lines to operate at different receive frequencies.

Still referring to FIG. 15A, the $f_0$ signal is generated by a receive oscillator 614 on a conductor 616 and provided to a multiplexer (MPX) 618 illustrated as an electronic switch. MPX 618 receives two control inputs, mode A and mode B, via conductors 620 and 622. The control inputs to MPX 618 are generated by function decode logic illustrated in FIG. 19B. The generation of mode A and mode B signals will be covered subsequently in more detail; however, for the present let it be recognized that the $\overline{\text{mode A}}$ and $\overline{\text{mode B}}$ signals are both binary 1's at this time. These two signals enable MPX 618 and a demultiplexer (DMPX) 624 to activate their corresponding switches to connect the $f_0$ signal from the receive oscillator 614 to the input of AND gate 612 via conductor 630. AND gate 612 is enabled at this time by a binary 1 signal on a conductor 632 from a now enabled AND gate 634 also receiving the $\overline{\text{mode A}}$ and $\overline{\text{mode B}}$ signals via conductors 636 and 638, respectively.

A digression is momentarily made back to the MPX 618 of FIG. 15A, also receiving an $f_1$ input signal from a transmit oscillator (XMIT OSC) 640 via a conductor 642, and a 60 Hz pulsating signal via a conductor 644. In the present description, these two input signals have no effect on the operation of the MTU in that those signals are utilized during the operation of two other modes to be explained in the subsequent description. However, it should be noted at this time that, as the binary configurations of the $\overline{\text{mode A}}$ and $\overline{\text{mode B}}$ signals applied to MPX 618 and DMPX 624 change during subsequent operations, the switches of those two circuits will likewise change to the appropriate positions in accordance with the binary configurations of the mode A and mode B signals.

The description now continues by reference back to the commutating band pass filter 608, which now selects the message coming from the SCU and passes that message via a conductor 646 to a detector circuit 648. The output of detector 648 is applied to a one-shot multivibrator 650 on a conductor 652. One-shot 650 is triggered upon the detection of each binary 0 in the input message data stream as shown on the data line of FIG. 16. Thus it can be seen that each time one-shot 650 is triggered, a binary 0 data bit is clocked out of that one-shot, whereas if a binary 1 is detected, one-shot 650 is not fired and its output is representative of a binary 1.

The output of one-shot 650 is simultaneously applied to three elements. One connection from one-shot 650 is the receive data (REC DATA) on a conductor 654 applied to a D or data input terminal of a message receive register 656 of FIG. 15B. The manner in which the receive data is clocked into register 656 will subsequently be described. The receive data is also applied from one-shot 650 to a data input (DATA IN) terminal of a parity check generate circuit 658 of FIG. 15D via a multiplexer MPX 660 and conductors 662 and 664 (the latter conductor traverses through FIG. 15C to FIG. 15D).

Reference is now made back to FIG. 15A and to an SOM line of FIG. 16, where it is shown that the first binary 0 detected by the MTU fires one-shot 650 and applies the negative going edge of first data bit to a set input terminal of a start-of-message flip-flop SOMFF 666 on a conductor 668. As shown in FIG. 16, the SOMFF 666 sets at this time generating a binary 1 output signal on a conductor 670 to fire another one-shot designated SOM reset 672. The output of one-shot 672 is shown in FIG. 16 as a short binary 1 pulse applied as a SOM reset signal to a common reset CR input terminal of a clock sync register 674 via conductors 676 and 678. The purpose of the clock sync register 674 will momentarily be described. The SOM reset signal on conductor 676 is also applied to a reset terminal of the parity check generate circuit 658 of FIG. 15D through the multiplexer 660 via conductors 680, 682 and an OR gate 684 of FIG. 15C. The parity check generate circuit 658 is now reset to receive a parity receive data on conductor 664 to check parity of the incoming message from the SCU.

Reference is now made back to FIG. 15A to the clock sync register 674 and to the timing diagram of FIG. 16. It will be noted in FIG. 16 that a 120 Hz pulsating signal is applied to a T input terminal of the clock sync register on a conductor 686. The 120 Hz signal is generated from a master clock generator 688 shown in FIG. 19C. The master clock generator receives a 60 Hz sine wave input signal on a conductor 690 from any 60

Hz source not shown (e.g., the power lines 18). It will also be noted that the master clock generator 688 generates a 60 Hz pulsating output signal on a conductor 692. As will subsequently be described, the 60 Hz signal is also utilized in the MTU to derive the appropriate timing for that unit.

Reference is now made back to FIG. 15A and FIG. 16. The purpose of the clock sync register 674 is to synchronize the incoming data bits with clock pulses generated by that circuit. It will be recalled that the SOM reset signal caused the clock sync register 674 to reset upon the detection of the very first binary 0 in the sync bits of the message. With the clock sync register 674 now reset, the output signal from the 0 terminal of the first three flip-flops of that register on conductors 694 are now binary 1's. These three binary 1 signals on conductors 694 now enable an AND gate 696 to apply a binary 1 signal to a S input terminal of the first flip-flop of register 674 via conductor 698. As shown in FIG. 16, the first 120 Hz pulse following the SOM reset pulse causes the first flip-flop of register 674 to be set generating a positive going basic clock signal at the output of an inverter 700 to trigger a sync bits counter 702 via conductors 704 and 706.

The clock sync register 674 is a conventional shift register which will cause a binary 1 from the first register to be clocked sequentially through each of the flip-flops in that register upon the occurrence of each 120 Hz signal on conductor 686, thus generating a basic clock output signal from inverter 700 as shown in FIGS. 15A and 16. It will be noted that AND gate 696 is enabled only when the first three flip-flops of register 674 are binary 0's. Thus, upon the occurrence of the fourth 120 Hz input signal, the fourth flip-flop of register 674 will be set and the first three flip-flops will be reset, thus causing AND gate 696 to be enabled to repeat the cycle as previously described. The reset signal to the clock sync register 674 is applied from AND gate 696 when that AND gate is disabled by the application of a binary 1 signal to a reset R input terminal of the first flip-flop of register 674 via an inverter 708 and a conductor 710.

Reference is now made to the sync bits counter 702 of FIG. 15A, which is now counting the basic clock signals on conductor 706. When the sync bits counter 703 achieves a count of three, an AND gate 712 receiving input signals from the counter 702 on conductors 714 is enabled to generate a count of three, CT3, output signal on conductor 716. The timing for the generation of the CT3 signal is noted on the basic clock line of FIG. 16. The CT3 signal now sets a sync flip-flop 718 by the application of a binary 1 signal to a set S input terminal of that flip-flop. With the sync flip-flop 718 now set, a binary 1 signal is generated from that flip-flop's 1 output terminal on a conductor 720 to now enable an AND gate 722, also receiving the basic clock signal at a 30 Hz rate from inverter 700 on a conductor 724. Referring to FIG. 16, it can be seen that AND gate 722 now begins to generate receive clock signals (REC clock) on a conductor 726. The purpose of the REC clock is to generate two additional signals shown in FIG. 16 as a receiver shift register clock (REC S/R clock) and a parity receive clock (PARITY REC CLOCK). These two clock signals are generated as follows.

The REC clock of conductor 726 is now applied through a multiplexer MPX 728 of FIG. 15C on a conductor 730 to a trigger T input terminal of a clock counter 732. Clock counter 732 will now begin to count the REC clock pulses and provide count output signals on a plurality of conductors 734 to a clock counter decode logic 736. Three output signals representative of binary counts in counter 732 are generated by the clock counter decode 736. It will be noted that the clock counter 732, when in a reset state, generates a binary 1 00 count output signal on a conductor 738 to apply set signals to a receive control flip-flop (REC CONT FF) 740 and a parity control flip-flop (PARITY CONT FF) 742, placing each of those flip-flops in a set state. Flip-flops 740 and 742 at this time are now providing binary 1 output signals from their 1 terminal on conductors 744 and 746 as one input to two AND gates 748 and 750, respectively. Still referring to FIG. 15C, it will be noted that AND gates 748 and 750 are now enabled to generate the REC S/R clock signals on a conductor 752, and AND gate 750 is enabled to generate the PARITY REC CLOCK signals on a conductor 754. The enablement of these two AND gates is effected by the previously mentioned input signals on conductors 744 and 746 in conjunction with the REC clock signal now applied on a conductor 756 from an AND gate 758. AND gate 758 is receiving the binary 1 $\overline{\text{mode A}}$ and $\overline{\text{mode B}}$ input signals on conductors 636 and 638, along with the REC clock signals on a conductor 760. The timing for the generation of the REC S/R clock and PARITY REC CLOCK signals is shown in FIG. 16.

The PARITY REC CLOCK on conductor 754 is applied from the output of AND gate 750 from FIG. 15C to a CL clock input terminal of the parity check generate circuit 658 of FIG. 15D via the MPX 660 on a conductor 762. It should be noted at this time that the PARITY REC CLOCK signals now allow the PARITY REC DATA to be clocked into the parity check generate circuit 658 to allow that circuit to now begin checking message parity. Simultaneously with the clocking of the PARITY REC DATA into the parity check generate circuit, the REC DATA from the one-shot 650 of FIG. 15A is clocked into the message receive register 656 under control of the REC S/R clock signal applied to that register to a CL clock input terminal as shown in FIG. 15D.

It is significant to note at this time that the three sync, or start, bits (001) of the incoming message have been stripped off of that message under control of the sync bits counter 702 in FIG. 15A. This removal of the three sync pulses is illustrated by the delay in the generation of the REC CLOCK signal after the three sync pulses have been counted as a result of the generation of the CT3 signal on conductor 716 in FIG. 15A. This prevents the three sync bits from being clocked into the message receive register 656.

Reference is now made back to FIG. 15C to an output conductor 780 from the clock counter decode 736 generating a binary 1 signal at a count of 24 of the clock counter to provide a reset input signal to the REC CONT FF 740. The flip-flop 740 is reset at a count of 24 to prevent the six parity bits of the 30-bit message from being taken into the message receive register 656. When the receive control flip-flop 740 resets, a binary 0 output signal on conductor 744 disables AND gate 748 to thus prevent the further application of the REC S/R clock signals on conductor 752 to the CL input terminal of the message register 656. Thus, it can be seen that the message register 656 receives only the 24 data bits of the incoming message from the SCU.

The message will not continue to be clocked into the message register 656 of FIG. 15B until the clock counter decode 736 of FIG. 15C decodes a count of 30 from the clock counter 732. Referring to the clock counter decode 736, a signal T30 is generated by that decode on a conductor 764 when the 30th message bit is received (see T30 of FIG. 16). The T30 signal is applied to a rest B input terminal of the parity control flip-flop 742 at this time causing that flip-flop to reset, generating a binary 0 output signal on conductor 746 to disable AND gate 750. Disabling AND gate 750 now removes the PARITY REC CLOCK signal to the parity check generate circuit 658 of FIG. 15D inhibiting the further clocking of the message through that circuit. Simultaneously, the T30 signal on conductor 764 is applied to a set S input terminal of a receiver reset one-shot (REC RESET OS) 766 causing that one-shot to generate a receiver reset (REC RESET) bindary 1 output pulse on a conductor 768 as shown in FIGS. 15C and 16. One-shot 766 is fired on the trailing edge of the T30 pulse as illustrated in those two figures. The binary 1 REC RESET signal is now applied to a reset R input terminal of the clock counter 732 via a multiplexer MPX 770 and conductors 772 and 774. It will be noted that the MPX 770 is also receiving at this time the mode A and mode B input signals to establish the proper switch position for MPX 770. The application of the REC RESET signal to the clock counter 732 now causes that counter to be reset back to a binary 0 state in preparation to the receipt of another message from the SCU. It will also be noted as shown in FIGS. 15A, 15C and 16 that the REC RESET signal is applied to an R reset input terminal of the SOM flip-flop 666 via a conductor 776, resetting that flip-flop. Additionally, the REC RESET signal is applied to the RESET input terminal of the parity check generate circuit 658 via the multiplexer 660, conductors 680, 682, OR gates 684 and 778. The parity check generate circuit is now in a reset state in preparation to the receipt of another message from the SCU.

Reference is again made back to FIG. 15C to the REC RESET output signal from the REC RESET OS 766. The REC RESET signal on conductor 776 is also applied to a reset R input terminal of the sync bit counter 702 of FIG. 15A via a conductor 782, resetting that counter in preparation to receipt of another message from the SCU. The REC RESET signal is also applied off of conductor 782 of FIG. 15A to a reset R input terminal of the SYNCFF 718 via conductors 784 and 786. Resetting the SYNCFF 718 now causes a binary 0 signal on conductor 720 to disable AND gate 722, preventing the further generation of the REC CLOCK signals. Additionally, the REC RESET signal on conductor 784 is applied as one input to an OR gate 788, which now passes that signal via a conductor 790 to a reset R input terminal of a function strobe flip-flop FSFF 792. The FSFF 792 now resets, generating a binary 0 output signal on conductor 794 disabling the function code gating circuit 796 of FIG. 15B.

At time T30 the entire message is now loaded into the message receiver register 756 of FIG. 15B. It will be noted that the T30 signal from the clock counter decode 736 of FIG. 15C is now applied to an AND gate 798 of FIG. 15D via conductors 764 and 800. AND gate 798 will be enabled at this time to generate a function strobe enable (FUNC.STROBE EN.) signal on a conductor 802 to set the FSFF flip-flop 792, provided that all inputs to AND gate 798 are binary 1's at this time. At the leading edge of the T30 pulse, if the parity check generate circuit 658 of FIG. 15D has determined that the message contains good parity, that circuit will generate a GOOD PARITY binary 1 output signal on a conductor 804 to set a PARITY REG FF 805. The 1 output terminal of flip-flop 805 applies a binary 1 signal on conductor 807 to AND gate 798. The purpose of the PARITY REG FF 805 is to keep AND gate 798 enabled during the transmit mode because the GOOD PARITY signal is lost during the execution of that mode. The other inputs to AND gate 798 come from various decode functions from the message receive register 656 of FIG. 15B. The decoding of these input signals applied to AND gate 798 will now be described.

Register 656 is 24 bits in length having bits or stages 3-26 illustrating the format of the message as it resides in the register at T30. Bits 0, 1 and 2, not shown correspond to the three sync bits removed from the received message. Reference is now made to the SCU address field shown in FIG. 15B comprising 7 bits (3-9). As previously described in connection with FIG. 3, the SCU address was shown as eight bits; however, in the SCU the eighth bit (bit 10) is designated as a mode bit having a purpose to be described. It will be recalled from the previous description that an MTU must recognize the SCU address from which it is receiving a message before that MTU can be activated. This is accomplished by an SCU address comparator 806 monitoring bits 3-9 of the SCU address from register 656 on a plurality of conductors 808 and comparing that SCU address with a fixed SCU address provided to the comparator 806 on a plurality of conductors 810 from an SCU address switches block 812. Switches 812 are set to duplicate the SCU address of that SCU in communication with the MTU. If the SCU address switches compare with the SCU address from register 656, the SCU address comparator will generate a binary 1 output signal designated SCU ADD. COMPARE on a conductor 814. The SCU ADD. COMPARE signal on conductor 814 will thus provide one of the enable input signals to AND gate 798.

Reference is now made back to FIG. 15B to that field of the message register 656 designated FUNC. CODE. The function code field of the message is comprised of five bits (22-26) as previously described in connection with FIG. 3. These five bits are decoded as bits $F_c0-F_c4$ by a valid function decode (VALID FUNC. DECODE) circuit 716 receiving those signals via a plurality of conductors 818 and 820 from the output of the message register 756. If the VALID FUNC. DECODE 816 determines that the binary bit configuration of the function code is a valid MTU operation, that circuit will generate a binary 1 VALID FUNC. output signal on a conductor 822 as an additional enable input signal to AND gate 798.

Reference is now made back to FIG. 15B to the message register 656. That which remains to be described in connection with the decoding of the message register 656 is a determination as to whether the MTU is receiving an address designated for that MTU. As previously mentioned, each MTU in the system is capable of being individually selected, selected as a group of MTU's, a section of MTU's or selected in conjunction with all MTU's in the system or on an SCU power line. Referring to the MTU aggress field of register 656 of FIG. 15B, it will be noted that that address field is comprised of bits 11-18 making up the entire 11-bit MTU address as previously described in connection with FIG. 3. Bits 11-18 are applied via a plurality of conductors 824 to an ALL MTU GATES 826 and to a comparator 828 of a pair of comparators 830. Bits 19-21 of the MTU address are applied to a comparator 832 of comparators 830 via a plurality of conductors 834. The comparators 830 receive fixed MTU address input signals from an MTU ADD. SWITCHES block 836 comprised of a set of switches 838 and 840 via a plurality of conductors 842 and 844, respectively, connected to the comparators 828 and 832. Each of the comparators 828 and 832 has its own respective output signal lines, which will become binary 1's whenever the MTU address from register 656 compares with the corresponding address in the MTU ADD. SWITCHES 836.

To select a single MTU, the comparators, when decoding the proper binary bit configuration of the MTU address, will generate a binary 1 output signal on each of two conductors 846 and 848 to enable an AND gate 850, which in turn generates a 1 MTU binary 1 output signal on a conductor 852. To select ⅛, or a section, of the MTU's on a designated power line, an AND gate 854 is enabled by a binary 1 signal on conductor 848 from the comparator 832 and a binary 1 signal on conductor 856 from the ALL MTU GATES 826.

The ALL MTU GATES monitor bits 11–18 to generate a binary 1 output signal on conductor 856 whenever the address as specified by bits 11–18 specify on all MTU address.

Reference is now made to bit 10, designated MODE of register 656. Bit 10 will be either a binary 1 or a binary 0 dependent upon the type of mode addressing specified to the MTU by the message. When bit 10 is reset, a binary 0 on a conductor 858 will disable two AND gates 860 and 862. This will prevent the selection of a group of eight MTU's and all MTU's. However, when the MODE bit 10 is a binary 1, AND gates 860 and 862 are conditioned to be enabled to generate a binary 1 output signal in accordance with an address signal provided to each of those gates. Referring to AND gate 860, it will be noted that that AND gate is enabled to generate an eight MTU's binary 1 signal whenever the MODE bit is set and when the output of comparator 828 generates a binary 1 on conductor 846. Comparator 828, which monitors bits 11–18 of the MTU address, can thus generate a binary 1 output signal to select any number of groups of MTU's on a designated power line limited only by the size of the MTU address field. When AND gate 860 is enabled, the 8 MTU's binary 1 address signal is generated on a conductor 864. AND gate 862 is similarly enabled when the MODE bit is a binary 1 and bits 11–18 specify to the ALL MTU GATES 826 an address common to all MTU's on a power line or in the system. The combination of the binary 1 signals on conductors 856 and 858 will cause AND gate 862 to generate an ALL MTU's signal on a conductor 866.

Whenever the MTU decodes an acceptable address, one of the AND gates 850, 852, 854 or 860 will be enabled to apply a binary 1 signal on their corresponding conductors to an OR gate 867 to allow that OR gate to provide a binary 1 MTU ADD. ENABLE signal to AND gate 798 via conductor 868. It can now be seen how AND gate 798 will be enabled at time T30, as shown in FIGS. 15A and 16 to set the FSFF 792 with the FUNC. STROBE EN. signal at the time the message is decoded. Assume now that all inputs to AND gate 798 are binary 1's, thus indicating the received message has good parity, an SCU address compare, a recognized MTU address and a valid function code. As a result, the AND gate 798 will generate a binary 1 FUNC. STROBE EN. signal on conductor 802 to set FSFF 792. The setting of FSFF 792 is shown in FIG. 16 on the FUNC. STROBE line, whereby that flip-flop is providing a binary 1 FUNC. STROBE signal on a conductor 794 to a function code gating 796. The FUNC. STROBE signal now enables the function code gating circuit 796 to pass the $F_c0$–$F_c4$ signals on conductors 818 through that gating network generating binary output signals $F_c0'$–$F_c4'$ on a plurality of conductors 870. The $F_c0'$–$F_c4'$ signals are provided to various decode logic in the MTU to subsequently be described. It is these signals which are decoded to determine the subsequent mode of operations that the MTU will go into.

Reference is now made to FIG. 15D to OR gate 788 receiving the REC RESET signal on conductor 784. As can be seen in the timing diagram of FIG. 16, the REC RESET signal occurs, after the message is decoded, at the trailing edge of the T30 pulse to reset the FSFF 792 via OR gate 788 to remove the FUNC STROBE signal from the function code gating 796 at the time shown by the dotted lines in the FUNC STROBE pulse.

This completes the message receive mode description for the MTU. In all subsequent descriptions, the assumption should be made that a message has been loaded into the message receive register 656 and that that message has been decoded as a valid message with a proper address, good parity and valid function code to activate the function code gating to allow the MTU to go into the mode specified by the $F_c0'$–$F_c4'$ signals.

MTU Control Mode Operational Description

Figure 18:
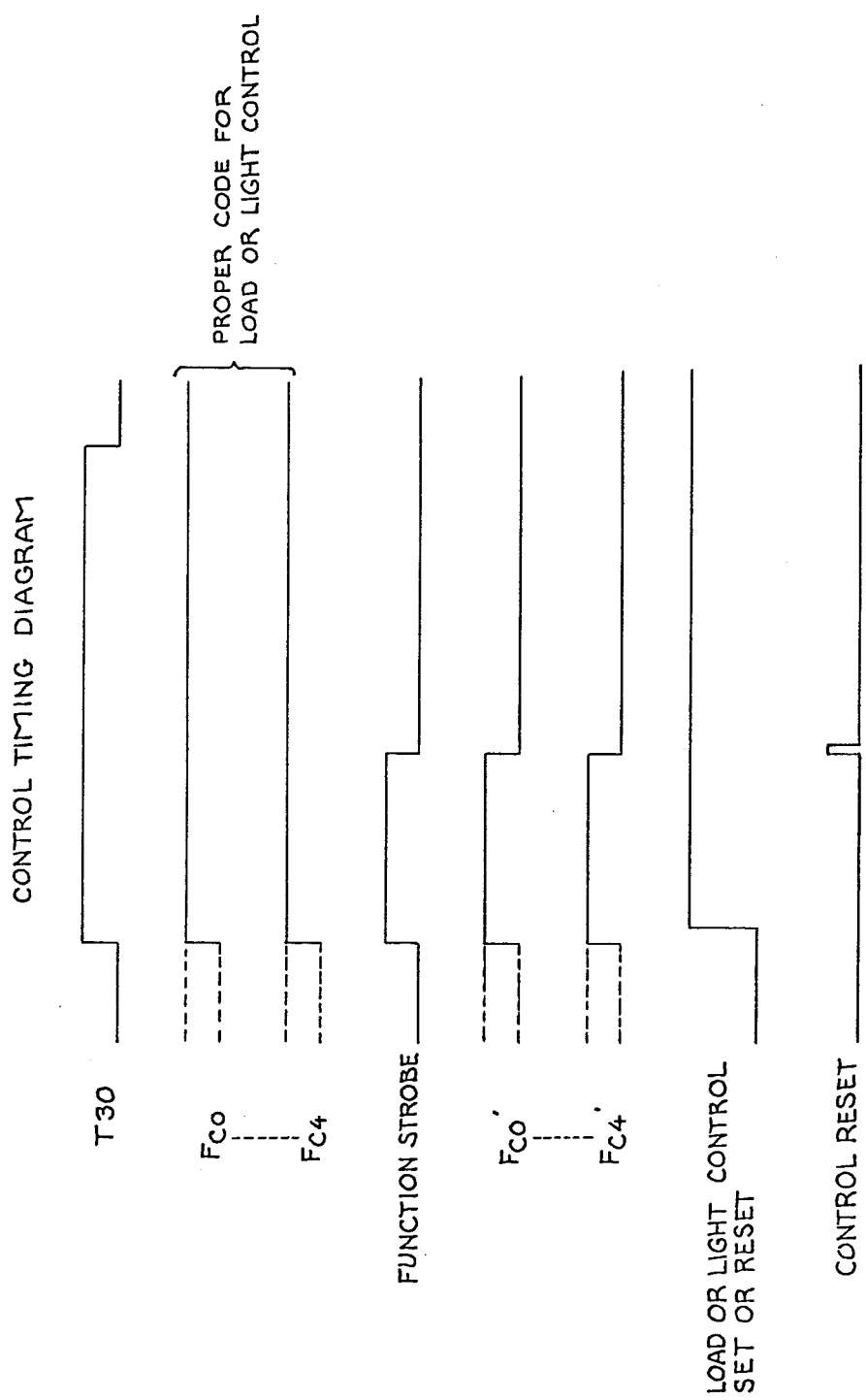

Reference is now made to FIGS. 17 and 18, wherein FIG. 17 shows a detailed block diagram of the load control logic for controlling a plurality of loads, or lights, external to the MTU at a designated customer residence, and FIG. 18 shows the operational timing of the load control logic. In FIG. 17 the time-shared logic comprised of OR gate 788 and the FSFF 792 has been duplicated for simplicity purposes to provide a better understanding of the MTU control mode.

As shown in FIG. 18, the decode of the function code takes place at T30 as just described for the receive mode. Let it now be assumed that the FSFF 792 is in the set state generating the FUNC STROBE signal as shown in FIG. 18. This allows the application of the $F_c0'$–$F_c4'$ signals on conductors 870 to be simultaneously applied to a load select decode circuit 872 via a plurality of conductors 874, a drop load decode 876 via a plurality of conductors 878 and a set load decode 880 via a plurality of conductors 882. The load select decode 872 is a conventional type of binary decode logic for decoding the binary configurations of the $F_c0'$–$F_c4'$ signals. The input signals $F_c0'$–$F_c4'$, when decoded by the load select decode, cause that decode to generate a binary 1 output signal to either set or reset a particular load or light flip-flop to that decode. It will be noted that each of a plurality of LOADFF's 886 receive set and reset input signals to their S and R terminals on respective conductors 888 and 890. Whenever a one of the LOADFF's 886 is set by its corresponding binary 1 input signal on conductor 888, that flip-flop will generate a binary 1 output signal on a corresponding conductor 892 to activate a corresponding one of a plurality of switches 894. Each of the switches 894 is illustrated as a TRIAC semi-conductor type switch receiving a 24 volt AC input signal from a source not shown. When a binary 1 signal is applied to one of the switches 894, the 24 volt AC signal is applied through that switch to a load connected thereto by corresponding one of conductors 896. The loads in FIG. 17 are illustrated as having their own power source, not shown, and being external to the MTU, as these loads are generally located in the building of the residence where the MTU is installed. Typical loads which can be controlled by the MTU, as previously described, are air conditioners, hot water heaters, electric clothes dryers, etc.

The load select decode 872 also provides a set and reset input signal to each of a plurality of LIGHTFF's 898 on corresponding conductors 899. These flip-flops operate to activate their corresponding TRIAC switches 895 in a fashion similar to that just described for the LOADFF's. The switches 895 likewise control a light in the customer's residence which contains its own power source. As previously described, the present system is capable of turning on and off warning lights for the benefit of a customer to let him know when he is utilizing power during peak periods so that he may reduce his load voluntarily to cut down on his power bill. It will also be noted that each of the load flip-flops 886 and 898 can be reset to disengage their corresponding load(s) or turn out their corresponding light(s) by the application of a binary 1 reset signal to the R terminal of those flip-flops.

Referring to FIG. 18, there is shown a load or light control reset line, which illustrates the timing for the activation of either a load(s) or a light(s) flip-flop(s). A slight delay is shown between the rising edge of the $F_c0'-F_c4'$ signals compared to the load or light control set or reset signals merely to indicate that there is a slight delay for the loads connected to flip-flops 886 and 898 to activate or deactivate their corresponding loads.

Reference is now made to FIG. 17 to the set load and drop load decode circuits 876 and 880. These two circuits receiving the $F_c0'$ and $F_c4'$ input signals will generate a binary 1 output signal on their corresponding output conductors 900 and 902 to activate an OR gate 904 whenever the message function code specifies that a load(s) is to be set or dropped out. The binary 1 signal on either of conductors 900 or 902 will be passed through OR gate 904 on a conductor 906 to activate a guaranteed delay 908. The purpose of this delay 908 is to allow sufficient time for all of the loads to be either set or dropped out prior to resetting the FSFF 792. After a specified delay, delay 908 will provide a binary 1 trigger signal to an S input terminal of a control reset one-shot (CONT RESET OS) 910, causing that one-shot to generate a control reset pulse on a conductor 912 at the time as shown in FIG. 18. The control reset pulse on conductor 912 is applied to OR gate 788, causing that OR gate to now provide a binary 1 reset signal on conductor 790 to the FSFF 792. Resetting the FSFF causes the function strobe signal to go to a binary 0 as shown in FIG. 18. The function strobe signal now disables the function code gating on FIG. 19B, and the MTU is in standby ready to receive another message from the SCU.

MTU Read and Store Operational Description

Figure 19A:
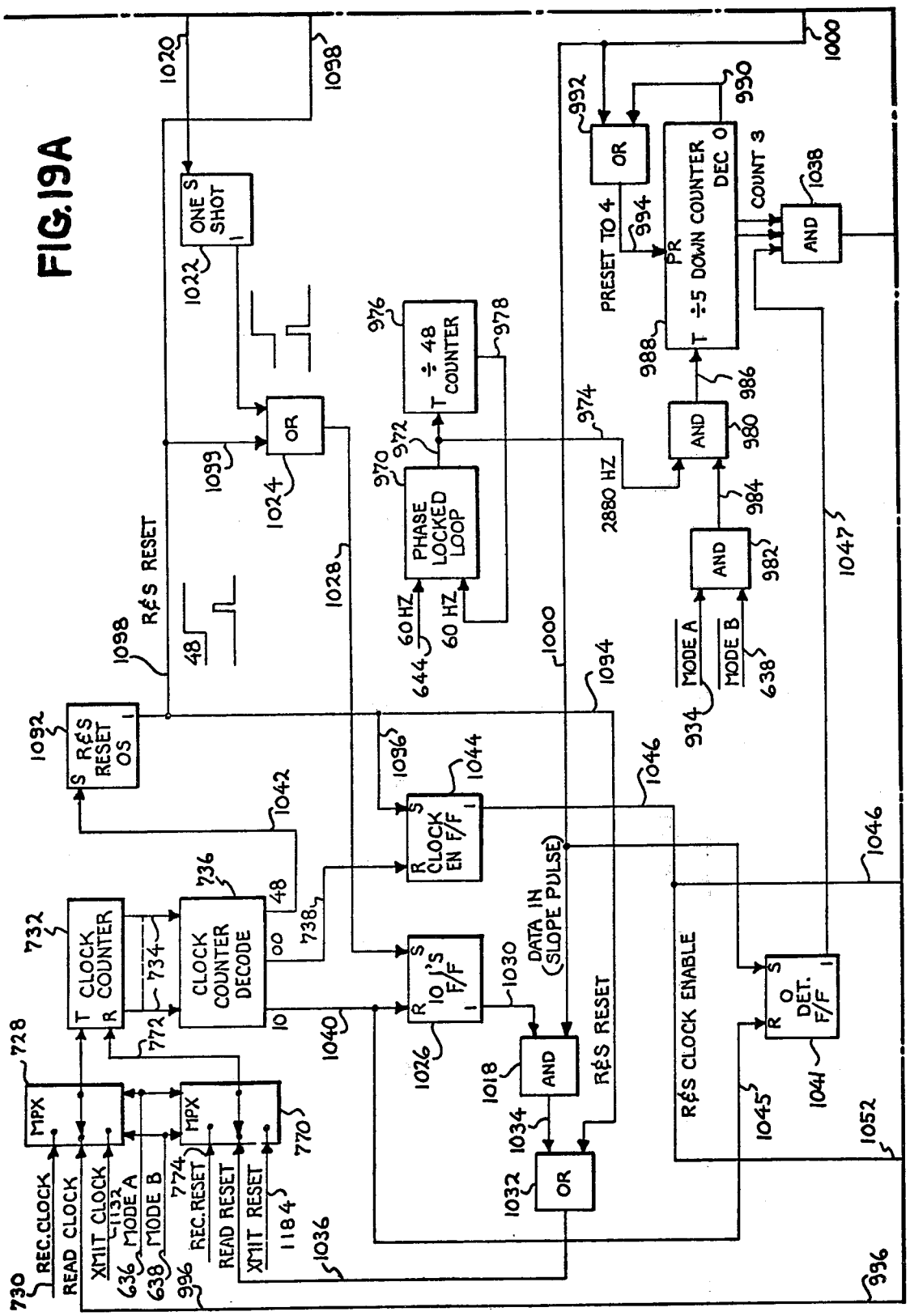
Figure 19C:
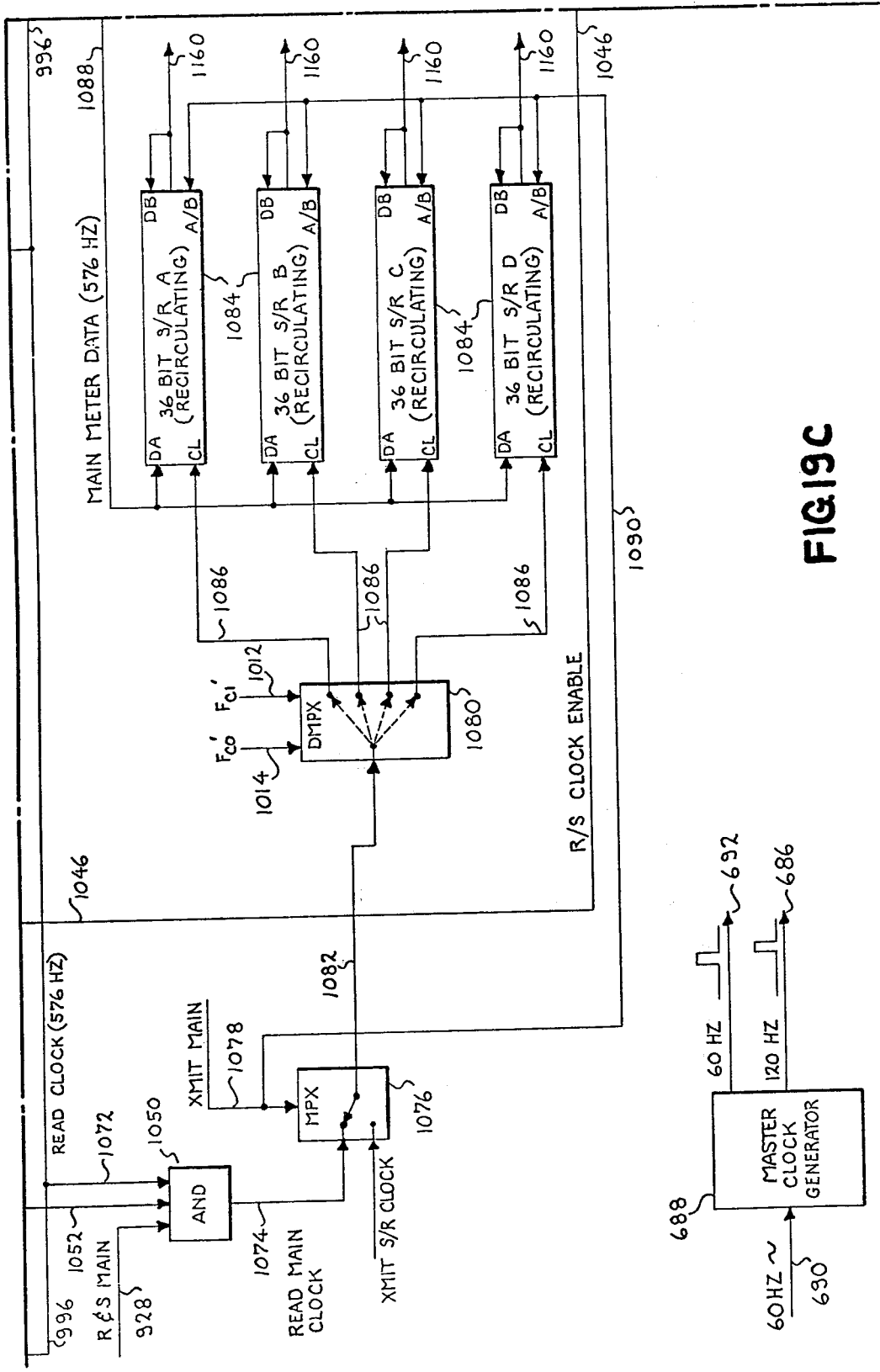
Figure 19D:
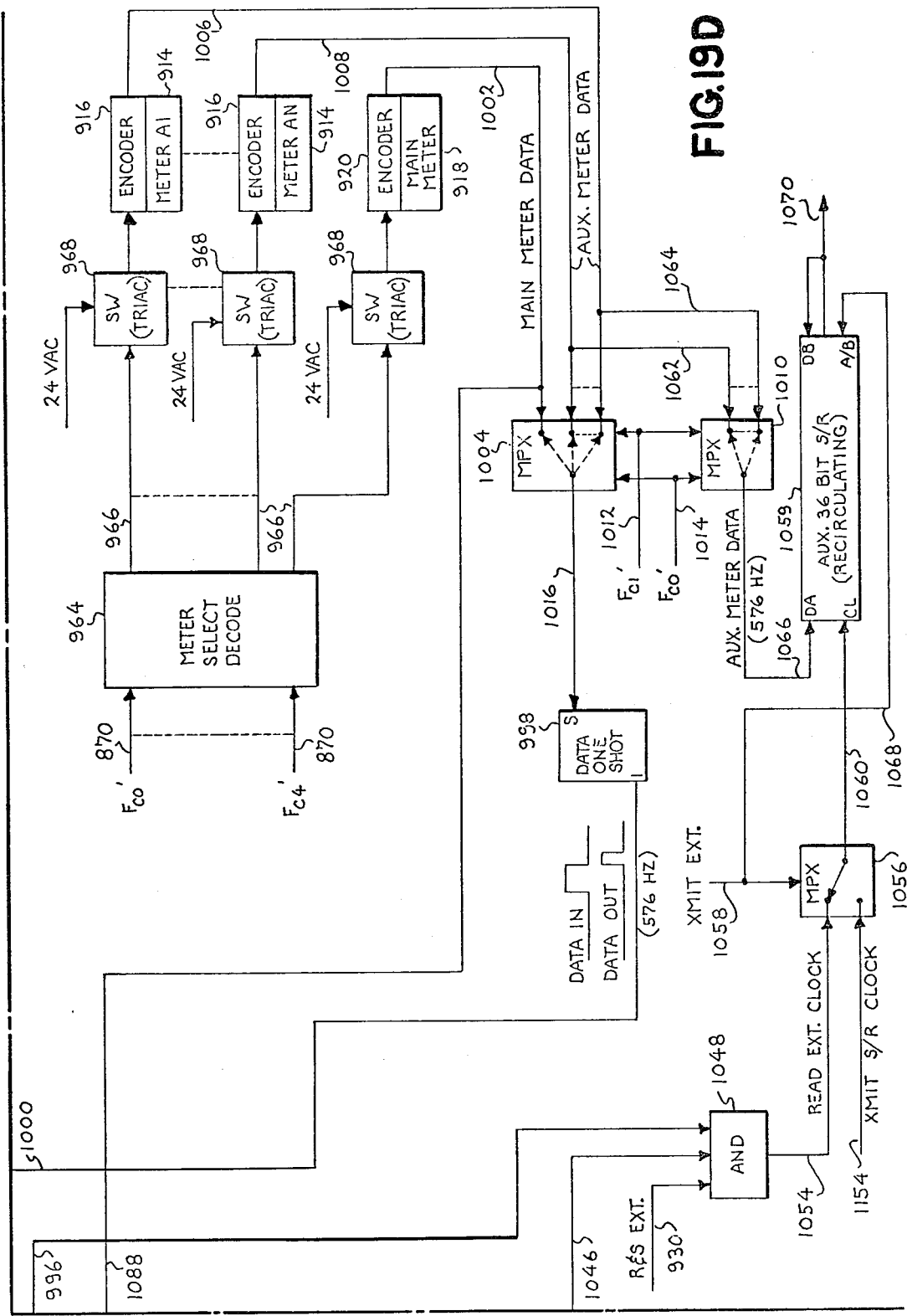
Figure 20:
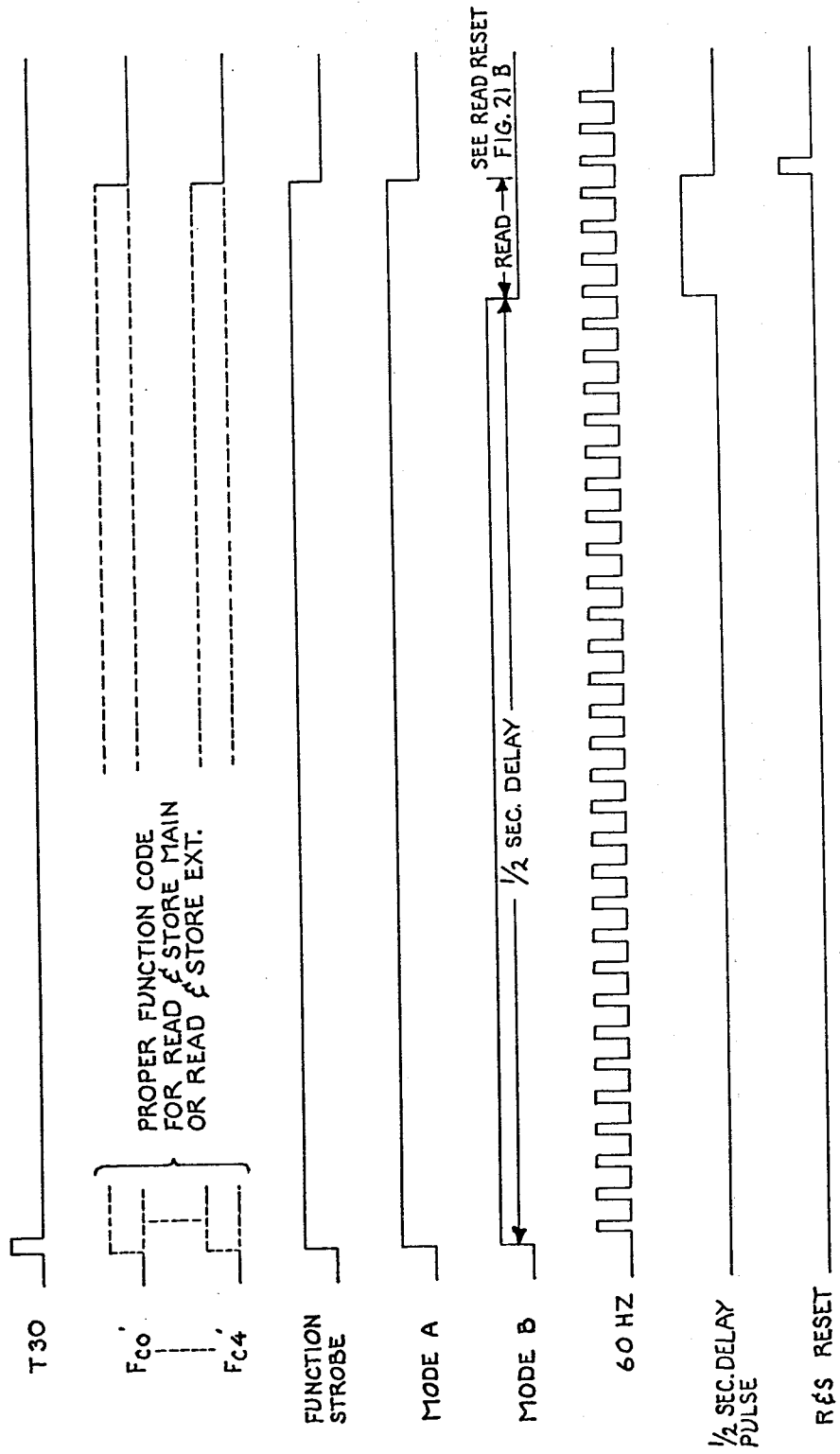
Figure 21B:
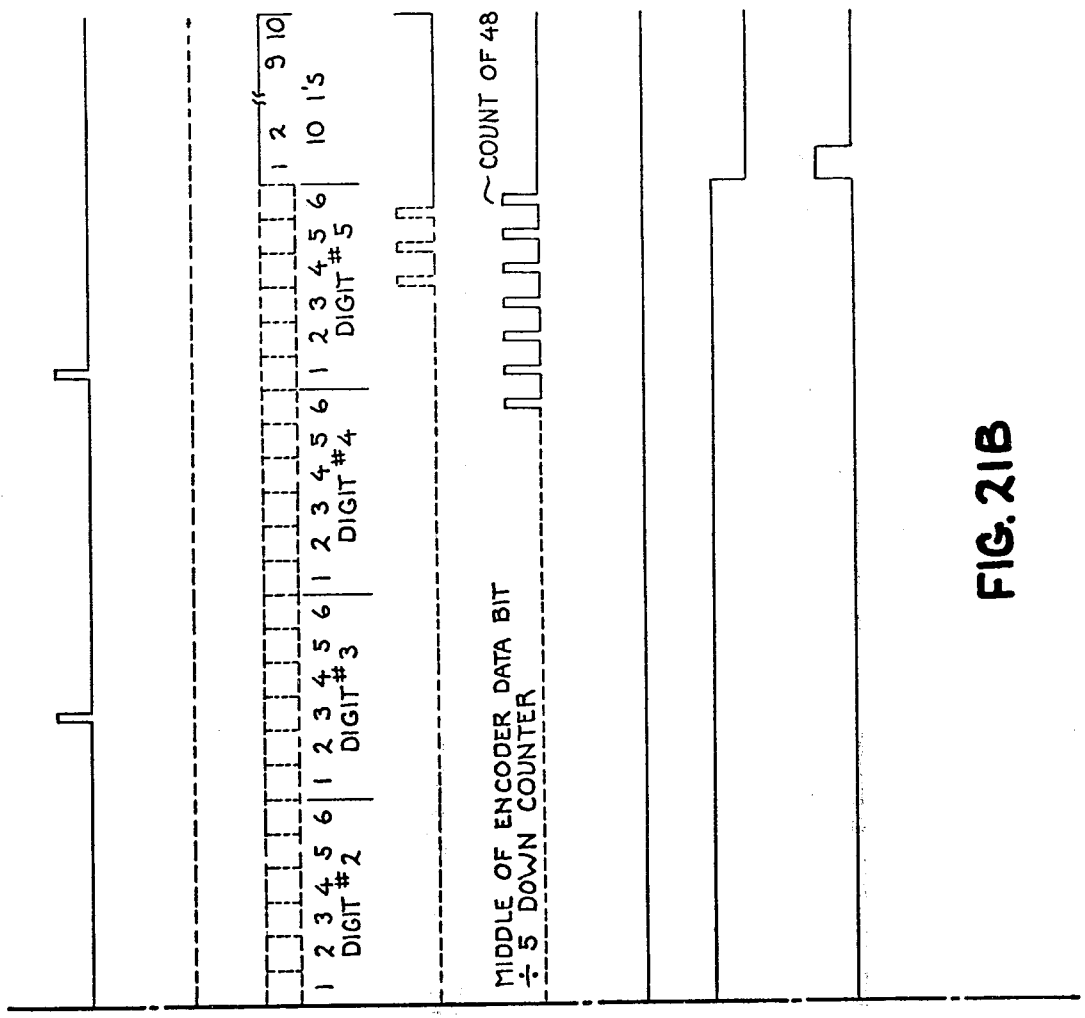

The MTU read and store operation is best illustrated by FIG. 19, which is a legendary drawing showing the interrelationships between FIGS. 19A-19D. In the following discussion, FIGS. 19A-19D should be positioned as shown in FIG. 19. FIGS. 20, 21A and 21B are the timing diagrams which will be used in the subsequent discussion of FIGS. 19A-19D. It will be noted in FIGS. 19A-19D that the time-shared logic previously described in connection with FIGS. 15 and 19 is duplicated, wherein like numbers are assigned to like numbers of those previously discussed logic elements.

Let it now be assumed that the MTU has just completed the receive message mode and that a message is in the message receive register 656, which specifies in its function code that the MTU is to read and store the meter information from one of several meters as shown in FIG. 19D. In FIG. 19D there is shown a plurality of auxiliary meters 914 designated meter A1-meter AN, each having an encoder 916. Meters 916 represent any number of meters at a customer residence such as gas meters, water meters, oil meters, etc. Also shown in FIG. 19B is a main meter 918, having its associated encoder 920. The main meter 918 customarily would be the main watt-hour meter found in a customer residence for recording the consumption of power. As previously mentioned, each of the encoders 916 and 920 preferred by the present embodiment contemplates the use of an optical, serial-type read-out encoder for providing binary output signals representative of the amount of consumed commodity as documented in the aforementioned U.S. Pat. No. 3,846,789. In the ensuing description, the read and store command, which is now in the message register, will selectively specify which of the meter encoders 916 through 920 will be read in accordance with the function code as previously described in connection with FIG. 3.

Reference is now made to FIGS. 19B and 20. Let it now be assumed that the MTU has just completed the received message mode of operation as shown in FIG. 20 by the generation of the T30 pulse, which effects the decoding of the $F_c0'-F_c4'$ signals now containing the proper function code for a read and store main meter or one of the auxiliary meters A1-AN. Referring to FIG. 19B, the function strobe signal on conductor 794 at this time is enabling the function decode 796 to allow a function code decode logic 922 to decode the $F_c0'-F_c4'$ signals to provide the proper output signals to read and store the one of the meter encoders to be selected. Since the function code of the message now specifies the read and store operation, the function code circuit 922 generates a binary 1 read and store (R & S) output signal on a conductor 924 to set a MODE A FF 926. The function decode 922 will also generate one of two binary 1 output signals to read and store either the main meter or a selected one of the auxiliary meters in accordance with the function code on two signal lines 928 and 930, designated R & S MAIN and R & S EXT, respectively.

Reference is now made to the MODE A FF 926, which is now set. That flip-flop is now providing a binary 1 output signal on a conductor 932 to generate a binary 1 mode A signal on a conductor 934 as shown in FIG. 20. The instant that the MODE A FF 926 sets, its binary 1 output signal also triggers a one-shot multivibrator 936 via conductors 932 and 938. One-shot 936 generates a narrow binary 1 pulse to reset a ½ second delay counter 940 and set a MODE B FF 942 via a conductor 944. With the MODE B FF 942 now set, its 1 output terminal generates a binary 1 signal on a conductor 946, which is passed through an OR gate 948 to generate a binary 1 mode B signal on a conductor 950 as shown in FIG. 20.

Still referring to FIG. 19B, it will be noted that the binary 1 output signal from the MODE A FF 926 is inverted to a binary 0 through an inverter 952 to generate a binary 0 mode A signal on conductor 936. In a similar fashion, binary 1 mode B signal from OR gate 948 is inverted to a binary 0 through an inverter 954 to generate a binary 0 mode B signal on a conductor 938. At this time, the binary 0 mode A and mode B signals are applied to the inputs of the MPX 618 and DMPX 624 of FIG. 19B, causing those two logic circuits to take on the switch positions as shown by the solid line therein. As shown in FIGS. 20 and 19B, the 60 Hz clock pulses on conductor 644 are now applied through MPX 618 and DMPX 624 to trigger the input of the ½ second delay counter 940 via a conductor 956. Delay counter 940, as shown in FIG. 20, will continue to count the 60 Hz pulses and, after a ½ second delay, will generate a ½ SEC DELAY(DL) pulse on a conductor 958. The ½ SEC DL pulse is now applied to an AND gate 960, enabling that AND gate, due to the presence of the binary 1 signal from the MODE A FF. AND gate 958 now applies a binary 1 signal on a conductor 962 to reset the MODE B FF 942 at the time shown in FIG. 20.

Resetting the MODE B FF 942 applies a binary 0 signal on a conductor 946 to OR gate 948, now causing the mode B signal on conductor 950 to go to a binary 0 and the mode B signal on conductor 938 to go to a binary 1. Referring now to the MPX 618 and the DMPX 624, it can be seen that the mode A signal applied to those two logic circuits is still a binary 0, and the mode B signal is now a binary 1. This combination of binary inputs now causes the MPX 618 and the DMPX 624 to switch from the position shown by the solid switch arrow to the position now shown by the dotted switch arrow to allow the continued application of the 60 Hz pulses on conductor 644 through those two logic units to the input of the ½ second delay counter 940.

The purpose of the ½ second delay can best be described by referring to FIG. 19D. In that figure, there is shown a meter select decode 964 similar to the previously described load select decode receiving the $F_c0'-F_c4'$ signals on conductors 870 from the function code gating 796 of FIG. 19B. The meter select decode will generate a binary 1 output signal on one of a plurality of conductors 966 in accordance with the function code to activate a corresponding one of a plurality of TRIAC switches 968, each having its own 24 volt AC input from a power source not shown. The activated TRIAC switch will apply 24 volt AC to its corresponding encoder 916 to start a motor in that encoder in order to read out the information from an optical disc. Since it takes a certain amount of time for the motor in the selected encoder to come up to speed, the ½ second delay has been provided in the system to allow the motor to come up to speed prior to the reading of the optical encoder. Reference is now made back to FIG. 20 to the mode B line of that figure to the point showing where the MODE B FF last reset. Immediately following the resetting of the MODE B FF, there is a note between arrows, which says Read. It is during this period that the MTU will now read the meter information from the selected encoder.

Reference is now made to FIGS. 21A, 21B and 19A. In FIG. 19A the 60 Hz pulses are shown being applied on conductor 644 to a phase lock loop circuit 970, generating 2880 Hz output pulses on conductors 972 and 974. The 2880 Hz signal is applied to a trigger (T) input terminal of a divide by 48 counter 976, which divides the 2880 Hz down to regenerate a 60 Hz pulsating signal on a conductor 978 for feed-back to the phase lock loop 970. The 2880 Hz signal is also applied to an AND gate 980, also receiving a binary 1 enable input signal at this time from an AND gate 982 via a conductor 984. It will be recalled that the mode A signal is now a binary 1 and the mode B signal is also a binary 1, thus enabling AND gate 982 to provide a binary 1 input signal to AND gate 980. The 2880 Hz signals are applied on a conductor 986 to a trigger T input terminal of a divide by 5 down counter 988. Counter 988 always starts out in a preset count of 4, as a result of a decode zero output signal shown in counter 988 when that counter is reset to zero. When the MTU is first turned on, counter 988 is always zeroed out. Thus, the binary 1 output signal from a DEC 0 terminal of counter 988 is passed through an OR gate 992 to a PR input terminal of counter 988 to preset that counter to a count of four via conductors 990 and 994. Counter 988 divides the 2880 Hz input signal by 5 to regenerate a read clock signal at a 576 Hz rate on a conductor 996 of FIG. 19C.

As shown in FIGS. 21A and 21B on the read clock 576 Hz line, the read clock is constantly being re-centered in the middle of each data bit being read from the selected meter encoder by a DATA IN (slope pulse) presetting the divide by 5 down counter 988. The DATA IN (slope pulse) is that pulse coming out of a data one-shot 998 of FIG. 19D on a conductor 1000. It will be noted in FIG. 19D that the meter encoder data on conductor 1000 is also being read from the encoder at a 576 Hz rate. For each binary 0 bit of data read from the selected encoder, the data one-shot 998 is triggered to generate a positive output signal to preset the down counter 988 to a count of four via OR gate 992 as shown in FIG. 19A. Thus, for each data pulse out of the encoder, the 576 Hz read clock is re-centered in the center of the bit corresponding to that data pulse to synchronize the reading of the data from the encoder with the read clock. The timing relationships between the DATA IN (slope pulse) on conductor 1000 from the data one-shot 998 and the read clock (576 Hz) pulses on conductor 996 are shown in FIGS. 21A and 21B.

As previously mentioned, the down counter 988 is preset to a count of four upon the detection by one-shot 998 of each binary 0 from the selected encoder. However, under those conditions when a binary 0 is not present (i.e., a binary 1 is generated), there is no output pulse from one-shot 998. Thus, down counter 988 will not be preset. However, this is compensated for in order to continuously generate the read clock on conductor 996 by the output from the DEC 0 terminal of counter 988 on conductor 990 to OR gate 992. If a binary 0 is not received at OR gate 992, when the down counter achieves a binary count of 0, it is preset from the output of the DEC 0 terminal via OR gate 992. In this manner the 576 Hz read clock signal is continuously generated in the center of the DATA IN (slope pulse) as indicated in FIGS. 21A and 21B.

Reference is now made to FIGS. 21A and 21B to the data from encoder line in that timing diagram. It will be noted that digits 4 and 5 from the selected encoder precede a start code comprised of ten 1's, a 0 and a 1. This field of bits is read from the selected optical encoder and is utilized by the MTU to detect the start of the meter data indicated by the six 6-bit fields designated ID # and digits #1 through #5.

Referring to FIG. 19D, let it now be assumed that one of the encoders 916 or 920 has been commanded by the meter select decode 964 to start that encoder's motor and thus begin reading out the meter data in serialized message form to the MTU. If the main meter 918 has been commanded to read its encoder, the encoder optical read-out disc will begin to generate a message on a conductor 1002 to a multiplexer MPX 1004. On the other hand, if either one of the meters A1 through AN has been commanded to read its encoder 916, those encoders will provide their meter data on corresponding lines 1006 and 1008 to their corresponding inputs of the MPX 1004. It should be noted at this time that the two signals $F_c0'$ and $F_c1'$ are applied simultaneously to the MPX 1004 and to and MPX 1010 from the function code gating 796 on conductors 1012 and 1014 to select the appropriate one of the meter encovers as determined by the meter select decode 964. It should be noted that the MPX 1004 has a plurality of positions which can be selected by the binary configurations of the $F_c0'$ and $F_c1'$ signals to select any one of the meter lines coming in to MPX 1004. Thus, the MPX will pass the meter data from the selected one of the meters via conductor 1016 to the S input terminal of the data one-shot 998.

As previously mentioned, for each binary 0 read by the selected encoder, one-shot 998 is fired to generate a narrow data out pulse as shown on line 1000. These data pulses are applied via line 1000 to the input of an AND gate 1018 of FIG. 19A. That AND gate is now enabled to pass any DATA IN (slope pulses) which appear at the input to that gate. This is explained as follows:

Reference is now made back to FIG. 19B to the output of the FSFF 792 generating the function strobe signal on conductor 794. With the FSFF 792 set at the time shown in FIG. 20, the leading edge of the function strobe signal is applied via a conductor 1020 to a set S input terminal of a one-shot multivibrator 1022. One-shot 1022 generates a narrow positive going output signal as shown in FIG. 19A, which is passed through an OR gate 1024 to a set S input terminal of a ten 1's FF 1026 via a conductor 1028. It can now be seen that the ten 1's FF 1026 is in the set state generating a binary 1 signal at its one-output terminal on conductor 1030 to AND gate 1018, to thus allow the DATA IN (slope pulses) to pass through that AND gate each time the data one-shot 998 of FIG. 19D is fired.

Flip-flop 1026 is that element of the MTU which controls the detection of the start code shown in FIGS. 21A and 21B comprised of ten 1's, a 0 and a 1. Let it now be assumed that the selected meter encoder is providing meter data via line 1000 to the input of AND gate 1018. Whenever a binary 0 is detected by data one-shot 998 of FIG. 19D, that one-shot generates a data out pulse, which is applied to AND gate 1018 enabling that AND gate. AND gate 1018 applies a binary 1 pulse to an OR gate 1032 via a conductor 1034. OR gate 1032 passes that binary 1 pulse on a conductor 1036 as a read reset signal through the now selected read input terminal of MPX 770 via OR gate 785 and on to a reset R input terminal of clock counter 732 via conductor 772. This will cause the clock counter 732 to reset. It should be noted at this time, as shown in FIGS. 19A and 19C, in conjunction with FIGS. 21A and 21B, that the read clock (576 Hz) signal from AND gate 1038 on conductor 996 is applied to the trigger input terminal of the clock counter 732 via the MPX 728. The timing relationships between the read clock signal on conductor 996 and the DATA IN (slope pulses) are shown in FIGS. 21A and 21B. The DATA IN (slope pulses) are shown in dotted form indicating that their presence is indeterminate because it is not known whether they are binary 0's or binary 1's. Also shown in FIGS. 21A and 21B, in dotted form, are the read reset pulses derived from the DATA IN (slope pulses) to reset the clock counter 732 of FIG. 19A.

Reference is now made back to AND gate 1018 of FIG. 19A. Let it now be assumed that the encoder is providing a binary 1 signal on conductor 1016, which has no effect on the data one-shot 998 of FIG. 19D. Thus, the DATA IN (slope pulses) is a binary 0 disabling AND gate 1018. The output of or gate 1032 in turn goes to a binary 0, removing the binary 1 read reset signal from the clock counter 732. However, the presence of the read clock signal on conductor 996 now causes the clock counter 732 to count for each binary 1 read from the encoder. It can now be seen that for each binary 0 read from the encoder, the clock counter 732 will be reset, and for each binary 1 read (the absence of a pulse) the clock counter 732 will count up by one.

Let it now be assumed that the encoder as shown in FIGS. 21A and 21B has just provided the binary bit configuration from digits 4 and 5 to the input of AND gate 1018 of FIG. 19A. At the end of digit #5 as shown in FIG. 21A, the AND gate 1018 detects the first binary 1 in the start code from the encoder. Since the start code is comprised of ten 1's, the AND gate 1018 will be disabled, removing the reset input to clock counter 732 and allowing the read clock on conductor 996 to trigger the counter. Referring to FIG. 19A, it can be seen that when the clock counter 732 achieves a binary count of 10, the clock counter decode 736 generates a count of 10 output signal on a conductor 1040. The count of 10 signal on conductor 1040 resets the ten 1's FF 1026, causing its output conductor 1030 to go to a binary 0, disabling AND gate 1018. As shown in FIG. 21A, following the ten 1's in the start code are bits 0 and 1 just prior to the first bit of the ID # field. The purpose of the 0 bit is to ensure that the beginning of the meter data message (ID#-digit #5) is always detected at the proper time so that the entire 36-bit message is clocked into the selected one of a plurality of storage registers 1084 and 1058 of FIGS. 19C and 19D. The state of the bit 1 is insignificant. It could also be a bit 0 as it is not used. Referring now to FIG. 19A, there is shown an ODETFF 1041, which is utilized to detect the presence of the first binary 0 after the clock counter 732 has counted 10 consecutive binary 1's in the encoder data message. The DATA IN (slope pulses) are applied to the set S input terminal of the ODETFF 1041 from conductor 1000. Flip-flop 1041 is reset by a binary 1 signal on a conductor 1045 from the 1040 conductor output of decode 736 when the counter 732 achieves a count of ten.

The operation of the ODETFF 1041 is as follows:

Let it be assumed that a meter encoder is being read and providing binary 1 and 0 DATA IN (slope pulses) to AND gate 1018 to control the operation of the clock counter 732 as just described. These DATA IN (slope pulses) are also applied to the ODETFF 1041. It should be noted, for each binary 0 DATA IN (slope pulse) a positive going set signal is applied to flip-flop 1041. With flip-flop 1041 set, a binary 1 signal from its 1 output terminal on a conductor 1047 keeps AND gate 1038 enabled to generate the read clock pulses. It should also be noted that a binary 1 (negative level) DATA IN (slope pulse) has no effect on flip-flop 1041. Flip-flop 1041 can only be set or reset on a positive going pulse.

So long as AND gate 1038 is enabled by the ODETFF 1041, the read clock pulses are applied to the T input terminal of the clock counter 732 allowing it to count binary 1 DATA IN (slope pulses). Assume now that the clock counter has counted ten consecutive binary 1 DATA IN (slope pulses) from the selected meter encoder. At the count of ten, the counter decode resets the ODETFF 1041 by the generation of a binary 1 signal on conductors 1040 and 1045. With flip-flop 1041 now reset, its 1 output terminal goes to a binary 0 disabling AND gate 1038 via conductor 1047. This stops the generation of the read clock pulses and prevents the clock counter 732 from counting until a binary 0 (positive going pulse) DATA IN (slope pulses) set the ODETFF 1041.

Reference is now made to FIG. 21A to the digit #5 field of the Data From Encoder line. It is significant to note at this time that the code utilized by the meter encoder to transmit the meter data (digits #1–#5) is a 6-bit truncated reflected binary code which does not use the all binary 1's configuration. Thus, at least one binary 0 is guaranteed in each digit transmitted from a selected encoder to the MTU. Utilizing the at least one binary 0, when reading a selected encoder, will guarantee that the clock counter 732 is reset at least once for every digit read by the encoder until at least ten consecutive 1's are counted by the clock counter.

Referring to FIG. 21A to the digit #5 message field, it can now be seen that a worst case condition for the number of binary 1's preceding the start code would be five binary 1's in each of bits 2–6 of digit #5, because a binary 0 would have to reside in bit 1 (the all binary 1's code is not used). Under this worst case condition, the clock counter 732 of FIG. 19A will begin counting binary 1 pulses starting at the 2nd bit of digit #5 and will effect the generation of the count of ten signal on conductor 1040 ten counts later (5 counts into the start code 10 1's field) to reset flip-flops 1026 and 1041. This will have no effect, however, on the proper detection of the start of the message at the beginning of the ID # field. This is explained in the following paragraph.

Reference is now made to the ODETFF 1041 of FIG. 19A. Let it now be assumed that the clock counter 732 has counted ten binary 1's from the encoder under the worst case condition as just described. As a result, flip-flop 1041 is reset, disabling AND gate 1038 stopping the read pulses on conductor 996. This stops the clock counter 732. Referring to FIG. 21A, it is noted on the Data From Encoder line that the ODETFF is reset at approximately the middle of the start code if worst case. If it is not worst case, the ODETFF will be reset at some time between the point shown and the bit 0 of the start code, depending on how many consecutive binary 1's have been counted by the clock counter 732. After the ODETFF 1041 is reset, five more binary 1's of the start code are read from the encoder. As previously noted, a binary 1 DATA IN (slope pulse) has no effect on the ODETFF. Thus, it will remain reset until a binary 0 (positive pulse) is applied to its set terminal. During the period of these last five binary 1's of the start code, the clock counter is inhibited from counting the read clock pulses because AND gate 1038 is disabled. When the start code bit 0 is read from the selected encoder, the positive DATA IN (slope pulse) will set the ODETFF at the time shown in FIG. 21A. The ODETFF now re-enables AND gate 1038 to re-apply the read clock pulses to the clock counter 732. The clock counter will continue to count until it achieves a count of 48 as detected by the clock counter decode 736 on a conductor 1042 to reset the MTU after the complete 36-bit meter data message has been stored in the MTU. The reset operation will subsequently be described.

Reference is now made to FIG. 19A to a clock EN flip-flop 1044. It will be noted that flip-flop 1044 receives a binary 1 signal on a conductor 738 at its set S input terminal whenever the clock counter decode 736 decodes a binary count of 0 in the clock counter 732. Thus, it can be seen that the clock enable flip-flop 1044 is set each time the clock counter is reset to generate a binary 1 R & S clock enable signal (read and store) at its 1 output terminal on a conductor 1046. The R & S clock enable signal is that signal which is utilized to enable the appropriate logic to allow the information from the selected meter encoder to be shifted into a selected one of the previously mentioned storage registers 1084 or 1058.

In FIGS. 21A and 21B the R & S clock enable signal is shown to be at a binary 1 at the start of the timing sequence, because the clock ENFF 1044 is set upon MTU power up initialization. The R & S clock enable signal is applied to two AND gates 1048 of FIG. 19D and 1050 of FIG. 19C via conductors 1046 and 1052, respectively. Reference is first made to AND gate 1048 of FIG. 19D. It will be noted that that AND gate is also receiving the 576 Hz read clock signal on conductor 996 as well as the R & S clock enable signal on conductor 1046 and the R & S EXT signal on conductor 930 from the function code decode 922 of FIG. 19B. If the message function code specifies that one of the auxiliary meter encoders 916 is to be read, the R & S EXT signal 930 will be a binary 1, thus enabling AND gate 1048 to provide a READ EXT CLOCK signal on a conductor 1054 to a multiplexer MPX 1056. MPX 1056 is receiving as an address control input a transmit external input signal XMIT EXT on a conductor 1058 from the function code decode 922 in FIG. 19B. Since in the present discussion, the function code specifies that a read and store operation is being performed, the XMIT EXT signal on conductor 1058 is a binary 0, causing the MPX 1056 to switch to the position shown in FIG. 19D. Thus, the READ EXT CLOCK signal on conductor 1054 is passed through MPX 1056 to a clock CL input terminal of an Aux. 36-bit recirculating shift register 1058 via a conductor 1060.

If it is assumed at this time that one of the auxiliary meters A1 through AN has been addressed to transfer its encoder data to the MTU, the data from the selected one of those meter encoders will be routed through an MPX 1010 of FIG. 19D via one of the conductors 1062 or 1064 into a data DA input terminal of the register 1058 on a conductor 1066.

Referring to FIGS. 21A and 21B, it can now be seen how the timing relationships between each of the DATA IN (slope pulses) and the read clock (576 Hz) pulses are synchronized to shift the 36-bit message from a selected one of the encoders into register 1058. It should also be pointed out at this time, as shown in FIG. 19D, that the XMIT EXT signal applied to MPX 1056 is also applied as a binary 0 at this time to an A/B input terminal of register 1058 on a conductor 1068. Register 1058 has as its primary input the auxiliary meter data at its DA terminal. Register 1058 is also provided with a recirculating input fed back from that register's output line 1070 to a DB input terminal. When the input signal to the A/B terminal is a binary 0, as in the present discussion, the register 1058 serves as a straight shift register with no recirculating capabilities. However, when the input signal on conductor 1068 to the A/B terminal is a binary 1, that register functions as a shift register as well as a recirculating register whereby the output data on conductor 1070 is recirculated back into register 1058 via the D/B terminal. The purpose of recirculating the data in register 1058 will be described in connection with the transmit mode of operation.

Reference is now made to FIG. 19C AND gate 1050 now receiving the R & S clock enable signal on conductor 1052 in conjunction with the read clock 576 Hz signal via conductors 996 and 1072. If the message function code specifies that the main meter encoder 920 is to be read, AND gate 1050 will be enabled by the R & S MAIN signal on conductor 928 from the function code decode 922 of FIG. 19B. Assuming AND gate 1050 is enabled, a read main clock signal on a conductor 1074 is applied to the input of a multiplexer MPX 1076. MPX 1076 is receiving as its control input a binary 0 XMIT MAIN signal on a conductor 1078 from the function decode 922 of FIG. 19B, thus causing the MPX 1076 to be switched to the position shown. The read main clock is thus routed through MPX 1076 into a demultiplexer DMPX 1080 via a conductor 1082. It will be noted that the DMPX 1080 receives the $F_c0'$ and $F_c1'$ signals on conductors 1014 and 1012, respectively. As previously explained in connection with the two multiplexers MPX 1010 and 1004 of FIG. 19D, the binary configuration of the $F_c0'$ and the $F_c1'$ signals will effect the switch selection of the DMPX 1080 to route the read main clock into the appropriate one of a plurality of 36-bit shift registers 1084, designated 36-bit S/R A through D.

Registers 1084 operate in the same fashion as previously described for the auxiliary 30 bit shift register 1058 of FIG. 19D. The read main clock signal from DMPX 1080 is routed into an appropriate one of the clock CL input terminals of registers 1084 via a one of a plurality of corresponding conductors 1086 as selected by the DMPX 1080. Referring now to FIGS. 19C and 19D, it will be noted that the main meter data on conductor 1002 is provided to the DA input terminal of each of the registers 1084 via conductor 1088. It will be noted in FIG. 19C that the XMIT MAIN signal, which is now a binary 0 on conductor 1078, is applied to each of the registers 1084 via conductor 1090 to the A/B input terminal of each of those registers to now control their straight forward shifting as previously described in connection with register 1058 of FIG. 19D.

Reference is now made back of FIG. 19A to the output of the clock counter decode 736. Reference is also made to FIGS. 21A and 21B where it is shown that the clock counter 732 will continue to receive the read clock 576 Hz input signals from MPX 728, causing that counter to count one for each bit of the 36-bit message word from the encoder clocked into the one of the selected 36-bit shift registers in FIGS. 19C and 19D. As shown in FIG. 21B, at a count of 48 (36 message bits plus 12 start code bits) by the clock counter 732, the clock counter decode 736 generates a binary 1 48-count output signal on a conductor 1042, which is applied to a set S input terminal of a R & S RESET OS 1092 (read and store reset one-shot). The R & S RESET OS 1092 now generates a binary 1 output signal R & S RESET on a conductor 1094, which is slightly delayed by one-shot 1092 from the leading edge of the 48-count pulse as shown in FIGS. 19A and 21B. The R & S RESET pulse is now applied from one-shot 1092 to a reset R input terminal of the CLOCK ENFF 1044 via conductor 1096, resetting that flip-flop to thus cause a R & S CLOCK ENABLE signal on conductors 1046 and 1052 to go to binary 0 state to stop the shifting of meter data into the recirculating registers 1084 and 1058. Additionally, the R & S RESET signal is applied via conductors 1098 and 1099 to an OR gate 1024 of FIG. 19A. The R & S RESET signal is passed through OR gate 1024 via conductor 1028 to set the ten 1's FF 1026 in preparation to receipt of another read and store command from the SCU.

Reference is now made to FIG. 19B to OR gate 788 also receiving the R & S RESET signal on conductor 1098 to now enable that OR gate to reset the FSFF 792 via conductor 790. With the FSFF now reset, its 1 output terminal is a binary 0 on conductor 794, removing the FUNC STROBE signal from the function code gating, thus causing all output signals from the function code decode to go to a binary 0. Also in FIG. 19D, the R & S RESET signal is applied from conductor 1098 to an R reset input terminal of the MODE A FF 926 via conductor 1100. Resetting the MODE A FF causes the Mode A signal on conductor 934 to go to a binary 0 and the $\overline{\text{mode A}}$ signal on conductor 636 to go to a binary 1 state to place the MTU back into the receive mode in preparation to receipt of another message from the SCU.

This completes the read and store mode operational description of the MTU. The MTU now contains the meter data stored in one of the selected registers 1084 or 1058 from a selected one of the meter encoders 916 or 920 for subsequent transfer to the SCU in response to a transmit command presented to the MTU from the SCU. The operation of the transmit mode will now be described.

MTU Transmit Mode Operational Description

Figure 22A:
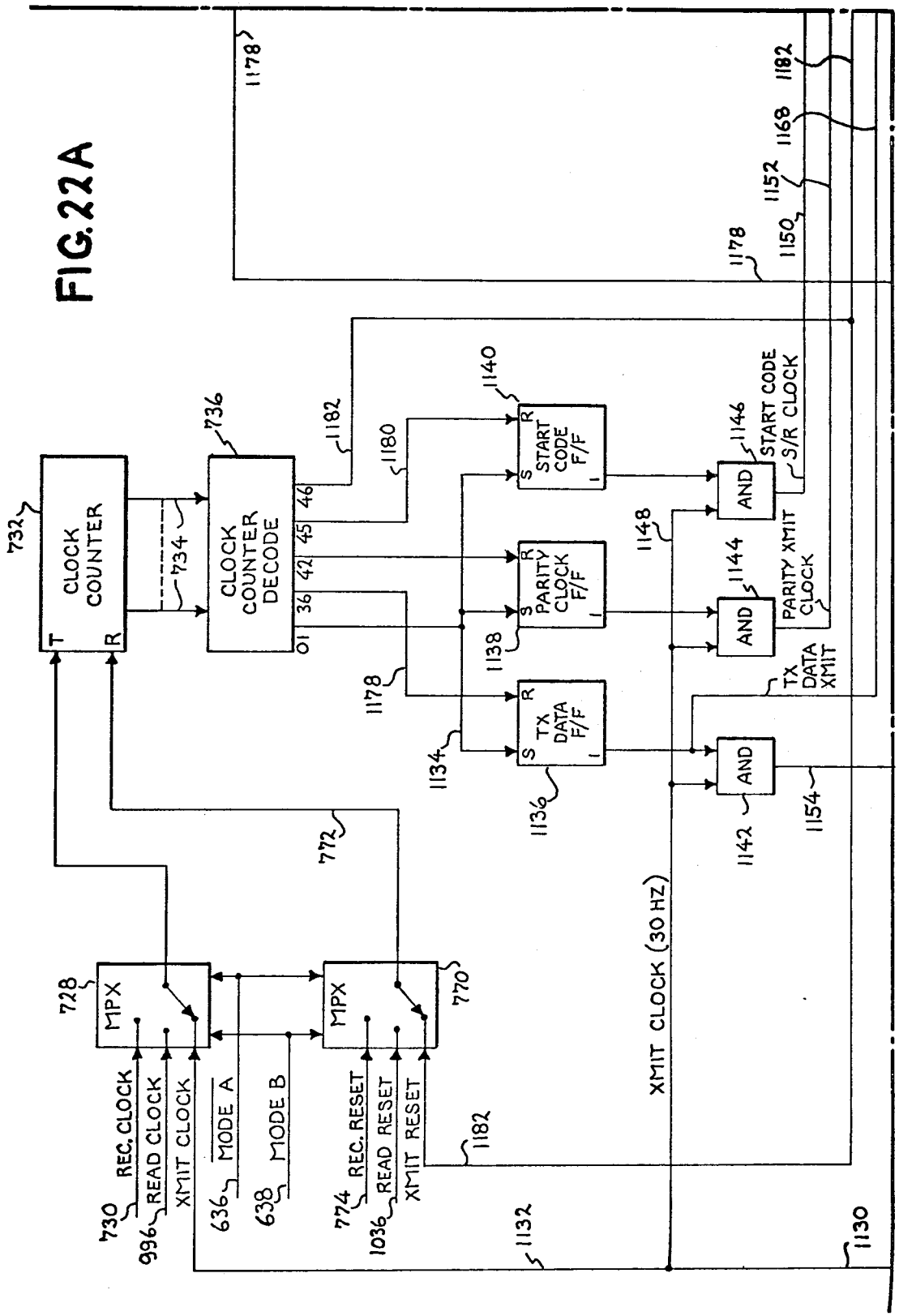
Figure 22C:
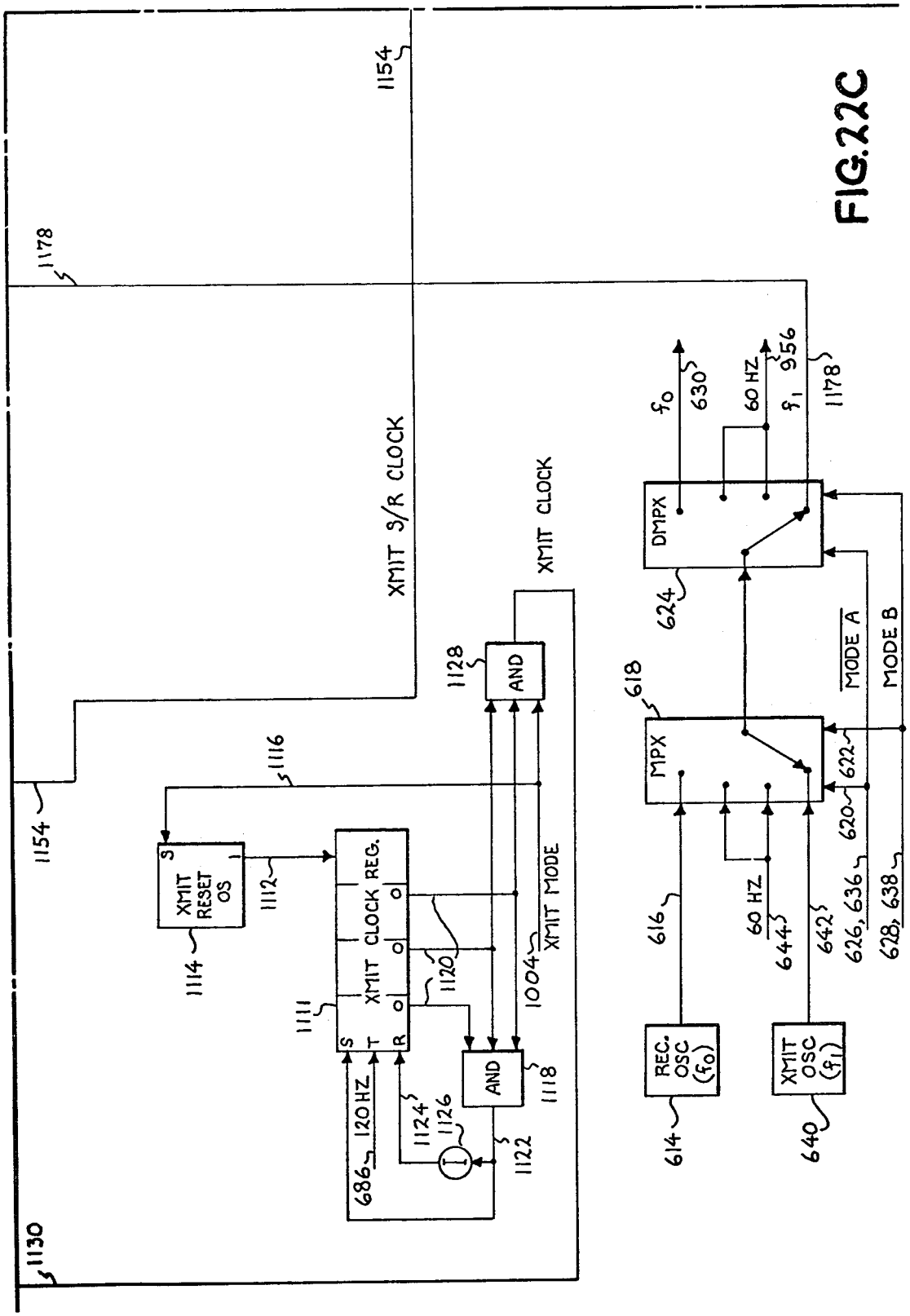
Figure 22D:
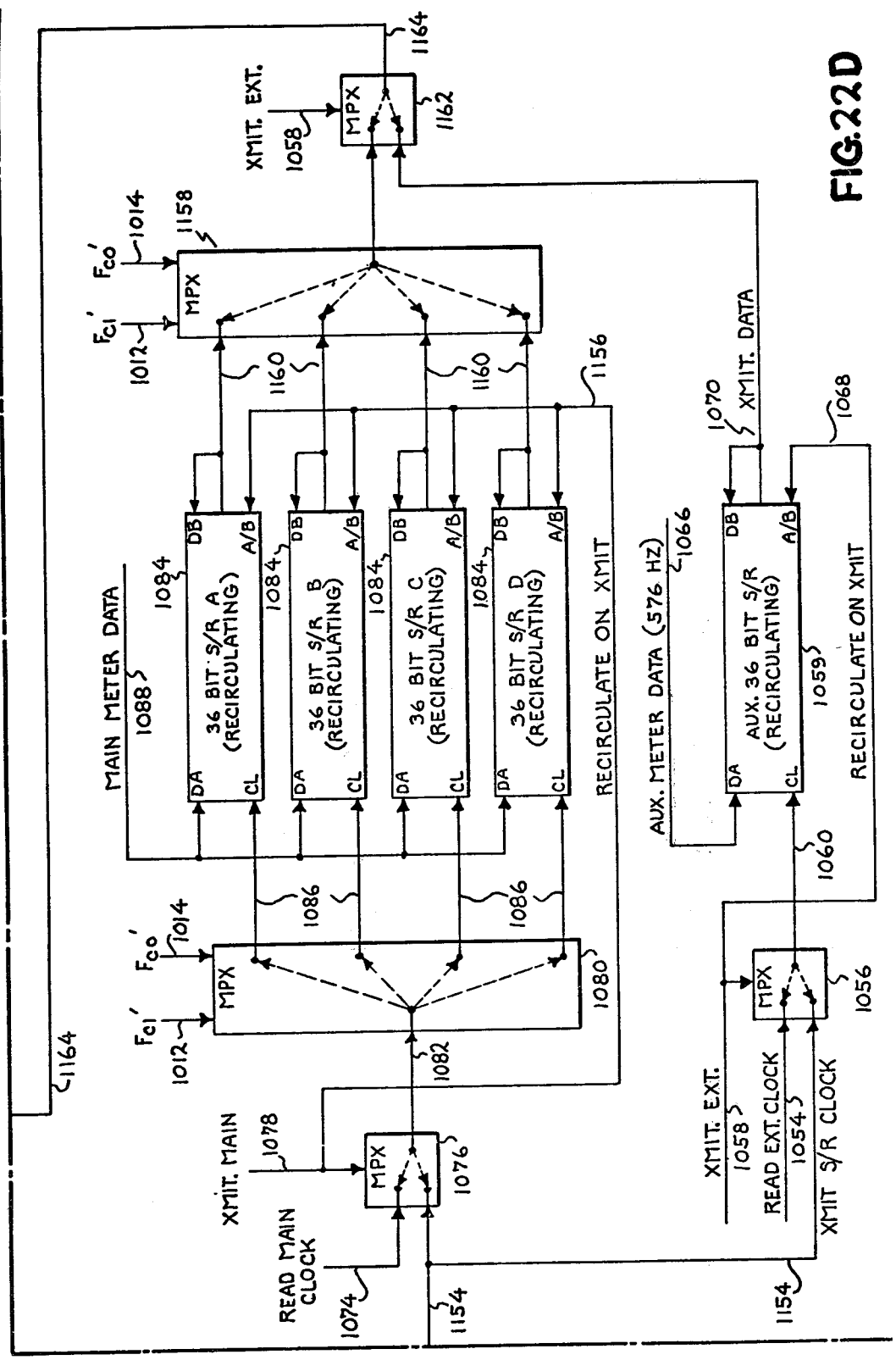
Figure 23:
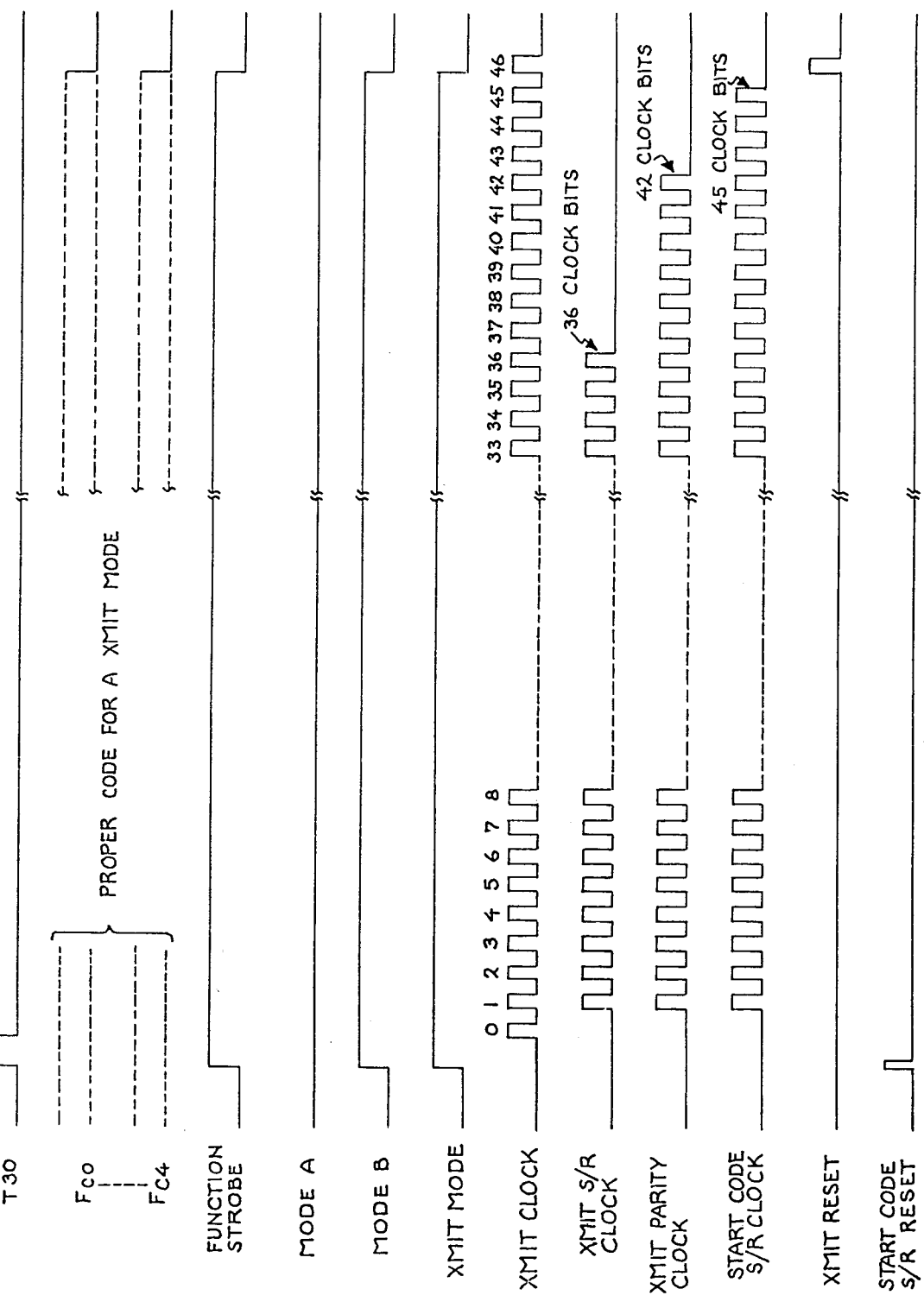

Reference is now made to FIG. 22, which is a legendary drawing showing the inter-relationships of FIGS. 22A through 22D, the latter illustrating in detailed block diagram form the logic in the MUT for executing the transmit mode sequence. Like that logic previously described in connection with FIGS. 15 and 19, like logic elements in FIGS. 22A through 22D have like numbers to those corresponding numbers in FIGS. 15 and 19. To aid in the understanding of the operation of the transmit mode sequence, it is suggested that FIGS. 22A through 22D be positioned as shown by FIG. 22. FIG. 23 will also be referred to in the subsequent description. FIG. 23 is a timing diagram showing the operational sequence of the transmit mode.

Reference is now made to FIG. 22D. Let it now be assumed that the MTU has just executed a read and store command which has caused meter data to be stored in one of the selected registers 1084 or 1058 as previously specified by the function code of the read and store command. The purpose of the transmit command is to place the MTU in the transmit mode to transmit the data from its selected one of registers 1087 or 1058 of FIG. 22D via the power lines to the MTU's connected SCU.

Reference is now made to FIGS. 22B and 23. Let it now be assumed that the MTU has just gone through the message receive sequence and the FSFF 792 is set at T30 time as shown in FIG. 23 by the FUNC STROBE ENABLE signal on conductor 802. As it will be recalled from the previous description, the function code and address portions of the message are decoded at the time the function strobe on conductor 794 is provided to the function code gating of FIG. 19B. Referring to FIGS. 19B and 23, there is shown now being generated by the function code decode 922 an XMIT mode signal on a conductor 1002 to OR gate 948 causing the $\overline{\text{mode}}$ B signal on conductor 950 to become a binary 1 and the mode B signal on conductor 638 to become a binary 0. FIG. 23 shows the mode B signal going to a binary 1 state at the time of the function strobe. It will be noted at this time that the mode A signal is a binary 0. The binary states of the mode A and mode B signals will be utilized during the present description to properly switch the various multiplexers (MPX's) in the MTU to direct the clock pulses and data to the proper logic elements.

The XMIT mode signal is also provided on a conductor 1004 to various logic elements to be discussed. Still referring to the function code decode 922 of FIG. 19B, the appropriate one of the XMIT MAIN or XMIT EXT lines will be a binary 1 dependent upon the contents of the message function code. If the message is to be transmitted from one of the main meter registers 1084, the external main signal on conductor 1078 will be a binary 1. On the other hand, if the meter data is to be transmitted from the auxiliary 36-bit shift register 1058, the XMIT EXT line 1058 will be a binary 1. The manner in which these two signals control the shifting of data out of those registers will subsequently be described. The XMIT MAIN and XMIT EXT signals are generated at the same time as the XMIT MODE signal shown in FIG. 23.

Reference is now made to FIG. 22B to the function strobe output of conductor 794, which is applied to a set S input terminal of a start code one-shot 1104. One-shot 1104 now generates a binary 1 output pulse as shown on a conductor 1106. The signal on conductor 1106 is shown in that figure as a START CODE S/R PRESET signal, applied to preset inputs of the flip-flops of a 3-bit start code shift register 1108. The first flip-flop of register 1108 receives the start code shift register preset signal on a PR1 input terminal setting that flip-flop to a binary 1. The two remaining flip-flops in register 1108 each receive the preset signal on corresponding PR0 terminals, presetting those two flip-flops to binary 0's. As will subsequently be described, and as shown in FIG. 4, the three sync bits to be transmitted with the MTU message are 001. These bits now exist in the start code shift register 1108 for subsequent transfer to the SCU.

Reference is now made to a transmit clock register 1111 of FIG. 22C. That register is now reset to all binary 0's on a conductor 1112 by a binary 1 output pulse from the 1 output terminal of a transmit reset one-shot 1114. One-shot 1114 receives the XMIT MODE signal on conductor 1116 to reset the clock register 1111 at the leading edge of the XMIT mode signal at the time shown in FIG. 23. Resetting register 1111 now synchronizes that register to begin counting the 120 Hz pulses applied to the register on conductor 686. Register 1111 functions in the same manner as previously described for the clock sync register 674 of FIG. 15A during the receive mode sequence to shift a binary 1 through the four stages of that register. The 0 output terminals of register 1111 are connected to an AND gate 118 via a plurality of conductors 1120 to control the setting and resetting of the first stage of the register via conductors 1122, 1124 and an inverter 1126.

It will be noted that the 0 output terminals of the second and third stages of the transmit clock register 1111 are provided as inputs to an AND gate 1128 in conjunction with the now binary 1 XMIT MODE signal on conductor 1004. The inputs on conductors 1120 to AND gate 1128 generate a transmit (XMIT) clock signal at a 30 Hz rate on a conductor 1130. The generation of the XMIT clock signal is shown in FIG. 23. AND gate 1128 generates one 30 Hz XMIT clock pulse in response to each four 120 Hz input clock pulses to register 1111 on conductor 686. Referring to FIGS. 22C and 23, the first XMIT clock signal generated by AND gate 1128 is applied via conductors 1130 and 1132 to the input of MPX 728. MPX 728 is now addressed by the $\overline{\text{mode A}}$ and mode B signals on conductors 636 and 638 to switch MPX 728 to the position shown. The binary states of the $\overline{\text{mode A}}$ and mode B signals are shown in FIG. 23. The first transmit clock signal is now passed through MPX 728 to the trigger T input terminal of clock counter 732, causing that counter to count to a count of one. The output of clock counter 732 is now decoded by clock counter decode 736 to generate a binary 1 output signal representative of the count of 01 on a conductor 1134. The 01 count signal is applied to the set S input terminal of three flip-flops TXDATAFF 1136, PARITY CLOCKFF 1138 and START-CODEFF 1140, placing each of those flip-flops in a set state. The 1 output terminal of each of these flip-flops is applied as an enable input to each of three corresponding AND gates 1142, 1144 and 1146. Further, each of AND gates 1142, 1144 and 1146 is now receiving the transmit clock signal from AND gate 1128 via conductors 1130 and 1148. As can be seen in FIG. 23, three clock signals are generated by these AND gates designated XMIT S/R clock, PARITY XMIT CLOCK, and START CODE S/R CLOCK. The start code shift register clock signal is generated by AND gate 1146 and applied to a CL clock input terminal of the start code shift register 1108 via a conductor 1150. The parity transmit clock signal is generated by AND gate 1144 on a conductor 1152 and applied to the clock CLK input terminal of the parity check generate circuit 658 via conductor 762 and MPX 660. It should be noted at this time that the XMIT MODE signal on conductor 1004 applied to MPX 660 is now a binary 1 causing MPX 660 to switch to the position shown.

Referring now back to FIG. 22A, AND gate 1142 now provides the XMIT S/R CLOCK on a conductor 1154 to the input of MPX 1076 and MPX 1056 to FIG. 22D. The MPX 1076 of FIG. 22D receives the XMIT MAIN signal on conductor 1078 from the function code decode 922 of FIG. 19B. If the present command specifies that the meter data is to be transferred from one of the main meter registers 1084, the MPX 1076 switch will be in the bottom position as shown by the dotted line within the MPX 1076. However, if the XMIT MAIN signal is a binary 0, the switch will be in the up position not allowing the XMIT S/R CLOCK to be passed through MPX 1076. Assuming that the XMIT MAIN signal is a binary 1, the XMIT S/R CLOCK will be passed through MPX 1076 into MPX 1080 via conductor 1082. MPX 1080 will now have its switch position selected in accordance with the binary states of the function code signals $F_c0'$ and $F_c1'$ from the output of the function code gating circuit of FIG. 19B. Depending upon the binary configuration of the $F_c0'$ and $F_c1'$ signals, the XMIT S/R CLOCK signal will be applied to the appropriate one of the conductors 1086 to the CL terminal of the selected one of the registers 1084. It should be noted at this time that the XMIT MAIN binary 1 signal on conductor 1078 is also applied via a conductor 1156 as a recirculate on XMIT signal to the A/B inputs of each of the registers 1084. The application of the binary 1 signal on conductor 1156 now allows the 36-bit meter data message in the selected one of the registers 1084 to be serially shifted out to an MPX 1158 via the selected shift register's corresponding output conductor 1160. Further, the binary 1 signal applied to the A/B input terminals of the registers allows the selected register to be recirculated by having the output data on its corresponding conductor 1160 shifted back into the register via the DB terminal. Recirculating the meter data in the selected register preserves that data in the event the shift register contents are needed at a later time. The data in registers 1084 and 1058 is lost only if replaced during a read and store operation. It should also be pointed out at this time that no meter data on conductor 1088 is shifted into the selected register.

Still referring to FIG. 22D, it will be noted that MPX 1158 also receives as address control input signals the $F_c0'$ and $F_c1'$ signals from the function code gating of FIG. 19B to select the output of the appropriate one of the registers 1084. The output from the selected register is transferred through MPX 1158 into an MPX 1162. MPX 1162 is receiving the XMIT EXT signal on conductor 1058 from the function code decode 922 of FIG. 19B. If the message is to be transmitted to the SCU from one of the main meter registers 1084, the XMIT EXIT signal will be a binary 0, placing the MPX 1162 switch in the up position, allowing the data to be transferred from the selected register through MPX 1162 on to a conductor 1164.

Reference is now made to the multiplexer 1056 of FIG. 22D receiving the XMIT S/R CLOCK signal on conductor 1154. If the function code of the transmit command specifies that the message is to be transmitted to the SCU from the auxiliary register 1058, the XMIT EXT signal on conductor 1058 will select MPX 1056 to place its switch in the down position to allow the XMIT S/R CLOCK to pass through MPX 1056 into the CL terminal of register 1058. Register 1058 also receives the XMIT EXT binary 1 signal on conductor 1068 at its A/B input terminal to control its circular shifting. The message from register 1058 is transmitted out as XMIT DATA on a conductor 1070 to MPX 1162, which would now be selected by the XMIT EXT signal to have the switch in the down position to pass the data on to conductor 1164. It can now be seen how the MTU, through its function code and multiplexing means (MPX's), effects the selection of the plurality of registers shown in FIG. 22D to transmit previously stored meter data to the SCU.

Still referring to FIG. 22D, the output data from the selected one of the registers 1084 or 1058 on conductor 1164 is provided through MPX 660 of FIG. 22B to the data in terminal of the parity check generate circuit 658. The MPX switches are in the down position because of the binary 1 XMIT MODE signal applied to MPX 660 on conductor 1004. The message from the selected one of the registers is allowed to be clocked through the parity check generate circuit 658 in response to the PARITY XMIT CLOCK on conductor 1152 now applied to the parity check generate circuit via MPX 660 and conductor 762.

Reference is now made back to FIG. 22A to the 1 output terminal of the TXDATAFF 1136. That flip-flop, which is now set, is providing a binary 1 TX DATA XMIT signal to the REC/XMIT CONT input terminal of the parity check generate circuit of FIG. 23B via conductors 1166, 1168 and MPX 660. This binary 1 signal enables the parity check generate circuit 658 to allow the PARITY XMIT DATA on conductor 1164 to be passed through that circuit out to a data line 1170. The message data from the parity check generate circuit 658 is provided via conductor 1170 to a data D input terminal of the start code shift register 1108. It will be noted that the start code shift register 1108 is now receiving the START CODE S/R CLOCK pulses on conductor 1150 from now enabled AND gate 1146 of FIG. 22A. By referring to FIG. 23, it can be seen that the XMIT S/R CLOCK, the XMIT PARITY CLOCK and the start code S/R CLOCK pulses are all generated in synchronism to transfer the message from the selected one of the 36-bit shift registers in FIG. 22D out through the parity check generate circuit of FIG. 22B and into the start code shift register 1108.

It will be recalled at the beginning of this discussion that the start code shift register 1108 was set to a 001 start bit configuration by the start code S/R PRESET signal from the start code one-shot 1104. In a practical sense, the start code shift register 1108 is a 3-bit extension of the selected one of the 36-bit shift registers 1084 or 1058. Thus, since the start code shift register and the selected one of the registers 1084 or 1058 are synchronously shifted, the start code sync bits precede the 36-message bits as the message is shifted through the start code shift register.

Referring now to FIG. 22B, the three sync bits are shifted out of the start code shift register 1108, followed by the 36-message bits from the selected one of the meter data registers onto a conductor 1172 feeding the data message to a transmitter 1174. Transmitter 1174 is also receiving the RF carrier input signal $F_1$ via a conductor 1178 from the output of a DMPX 624 of FIG. 22C. The mode A and mode B signals applied to DMPX 624 and MPX 618 are now binary 1's, causing each of those units to select their switches in the position shown. As a result, the $f_1$ carrier output signal from transmit oscillator 640 is passed through MPX 618, and DMPX 624 and on to the transmitter 1174 where that carrier is modulated by the binary 1 and 0 data message output from the start code shift register 1108. The message is now passed through transmitter 1174 on to the power line 18 via conductor 1176 and the power line coupler 600 for receipt by the SCU.

Reference is mow made back to FIG. 22A to the TXDATAFF 1136. That flip-flop receives a binary 1 reset signal via a conductor 1178 when the clock counter decode 736 detects a bit count of 36 in the clock counter 732. At a count of 36 the last bit of the 36-bit message is shifted into the first stage of the start code shift register. It is at this time that the TXDATAFF 1136 is reset, thus providing a binary 0 signal to AND gate 1142 preventing the further generation of XMIT S/R CLOCK signals and simultaneously applying a binary 0 signal via conductors 1168, 1166 and MPX 660 to the REC/XMIT CONT terminal of the parity check generate circuit to inhibit the further transfer of the message to the start code shift register.

Referring still to FIGS. 22A and 23, it can be seen that the XMIT PARITY CLOCK signal continues to be generated after the XMIT S/R CLOCK signal is terminated. The purpose of this is due to the fact that the MTU must generate the proper parity for the 36 message bits previously transferred through the parity check generate circuit 658. Referring to FIGS. 22A and 23, the PARITY CLOCKFF 1138 is reset at a clock count of 42 (36 message bits plus 6 parity bits). When flip-flop 1139 resets, AND gate 1144 is disabled, thus inhibiting the further generation of the PARITY XMIT CLOCK signals to the parity check generate circuit.

Reference is made now to FIG. 22B. In order to transmit the entire message (last three parity bits) out of the MTU onto the transmission lines 18, it is necessary to generate three additional start code shift register clock signals to pass those three bits out of the start code shift register 1108. The generation of these three additional clock bits is shown in FIG. 23. The manner in which these three clock bits are generated is shown by the logic in FIG. 22A. Referring to the output of the clock counter decode 736, at a count of 45, as decoded by the clock counter decode 736 from the clock counter 732, a binary 1 output signal resets the start code FF 1140 via a conductor 1180. When the start code FF 1140 resets, it disables AND gate 1146 and inhibits the further generation of the START CODE S/R CLOCK signals on conductor 1150 to the start code shift register 1108. At a count of 45, the last message bit of meter data is shifted out of the transmitter 1174 onto the power transmission lines 18.

Referring back to FIG. 22A, the clock counter 732 now counts one more count to a count of 46 as detected by clock counter decode 736. The clock counter decode now generates a binary 1 XMIT RESET signal on a conductor 1182 at the time shown in FIG. 23. The XMIT RESET signal on conductor 1182 is simultaneously applied to the MPX 770 to reset the clock counter 732 via OR gate 785 and to the reset input terminal of the parity check generate circuit 658 of FIG. 22B via MPX 660 to reset that circuit in preparation to receipt of another message from the SCU. The XMIT RESET signal is also applied via conductors 1182 and 1184 to OR gate 788 to in turn reset the FSFF 792. Resetting the FSFF 792 causes the function strobe signal on conductor 794 to go to a binary 0 state as shown in FIG. 23. The function strobe signal now going to a binary 0 disables the function code gating in FIG. 19B to thus cause the transmit mode and mode B signals on conductors 1004 and 950 to each go to a binary 0 as shown in FIG. 23.

Reference is now made back to FIG. 22B to the output of OR gate 788. Upon receipt of the XMIT RESET signal by that OR gate at the time shown in FIG. 23, a binary 1 signal on a conductor 1186 is applied to the parity register flip-flop 805, resetting that flip-flop. A binary 0 signal from flip-flop 805 is now applied to AND gate 798 of FIG. 15D to prevent the generation of a function strobe signal until the receipt of another valid message having good parity from the SCU.

The MTU is now in the standby receive mode in preparation to receipt of another message from the SCU as described in the receive mode operation.

While the principles of the invention have now been made clear in a preferred embodiment, there will be immediately obvious to those skilled in the art many modifications of structure, arrangement, proportions, the elements, materials and components used in the practice of the invention and otherwise, which are particularly adapted for specific environments and operating requirements without departing from those principles. The appended claims are, therefore, intended to cover and embrace such modifications within the limits only of the true scope of the invention.

What is claimed is:

1. Apparatus for synchronizing a serial stream of data signals with a clock signal comprising;
   (a) a source of alternating current
   (b) data signal generating means electrically energizable by said alternating current for directly generating a serial stream of data signals having states representative of binary data wherein the data signals are generated asynchronously of the alternating current;
   (c) clock signal generating means including synchronization means electrically responsive to said alternating current and said data signals to provide a repetitively occurring clock signal which is synchronized with said data signals; and
   (d) means for combining said clock signal and said data signals whereby said data signals are provided as binary data synchronized by said clock signal.

2. The apparatus in accordance with claim 1 wherein said serial stream of data signals includes a specified start code of binary bits as a first portion thereof and wherein said synchronization means further includes start code recognition means responsive to said start code to enable the generation of said clock signal when said start code is recognized by said start code recognition means.

3. The apparatus in accordance with claim 1 wherein said means for combining, comprises storage means for receiving and storing the states of said data signals in response to said clock signal.

4. The apparatus in accordance with claim 1 wherein said clock signal generating means further includes a phase locked loop oscillator responsive to said alternating current to generate pulses occuring at a frequency which is a predetermined multiple of the frequency of said data signals and wherein said synchronization means comprises counter divider means responsive to said pulses and said data signals to provide said clock signal synchronized with said data signals.

* * * * *